US012538678B2

(12) United States Patent
Du et al.

(10) Patent No.: US 12,538,678 B2
(45) Date of Patent: *Jan. 27, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Cong Liu, Beijing (CN); Weiyun Huang, Beijing (CN); Chao Wu, Beijing (CN); Chao Zeng, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/922,095

(22) Filed: Oct. 21, 2024

(65) Prior Publication Data

US 2025/0048869 A1  Feb. 6, 2025

Related U.S. Application Data

(63) Continuation of application No. 17/828,194, filed on May 31, 2022, now Pat. No. 12,156,446, which is a (Continued)

(30) Foreign Application Priority Data

Nov. 27, 2020  (CN) .......................... 202011356201.7

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *G09G 2300/0413* (2013.01);
(Continued)

(58) Field of Classification Search
CPC ......... G09G 3/3233; G09G 2300/0413; G09G 2300/0426; G09G 2300/0819;
(Continued)

(56) References Cited

U.S. PATENT DOCUMENTS

2022/0028949 A1* 1/2022 Ko .................... H10K 59/126
2022/0045155 A1* 2/2022 Ma .................... G09G 3/3233
(Continued)

*Primary Examiner* — Hong Zhou
(74) *Attorney, Agent, or Firm* — IPro, PLLC

(57) ABSTRACT

Provided are a display panel and a display device. A plurality of second pixel circuit groups in a first display region in the display panel includes a first-type second pixel circuit group distal from a second display region and a second-type second pixel circuit group proximal to the second display region. The first-type second pixel circuit group is connected to a first-type second light-emitting unit group, distal from the first display region, in the second display region through a first connection trace. The second-type second pixel circuit group is connected to a second-type second light-emitting unit group, proximal to the first display region, in the second display region through a second connection trace.

20 Claims, 34 Drawing Sheets

Related U.S. Application Data continuation of application No. PCT/CN2021/097268, filed on May 31, 2021.

(51) Int. Cl.
  *H10D 86/40* (2025.01)
  *H10D 86/60* (2025.01)
  *H10K 59/121* (2023.01)
  *H10K 59/35* (2023.01)
  *H10K 59/88* (2023.01)

(52) U.S. Cl.
  CPC ........... *G09G 2300/0426* (2013.01); *G09G 2300/0819* (2013.01); *G09G 2300/0842* (2013.01); *G09G 2320/0233* (2013.01); *H10D 86/441* (2025.01); *H10D 86/60* (2025.01); *H10K 59/1213* (2023.02); *H10K 59/351* (2023.02); *H10K 59/352* (2023.02); *H10K 59/88* (2023.02)

(58) Field of Classification Search
  CPC ... G09G 2300/0842; G09G 2320/0233; G09G 3/3225; G09G 2320/0626; H10K 59/131; H10K 59/1213; H10K 59/351; H10K 59/352; H10K 59/88; H10K 59/353; H10D 86/441; H10D 86/60
  See application file for complete search history.

(56) References Cited

U.S. PATENT DOCUMENTS

| | | | |
|---|---|---|---|
| 2022/0069047 A1* | 3/2022 | Yang | H10K 59/131 |
| 2022/0102421 A1* | 3/2022 | Yang | H10H 20/857 |
| 2022/0139331 A1* | 5/2022 | Jang | G09G 3/3275 |
| | | | 345/55 |
| 2022/0158140 A1* | 5/2022 | Liu | H10K 59/8792 |

* cited by examiner

DISPLAY PANEL AND DISPLAY DEVICE

CROSS-REFERENCE TO RELATED APPLICATION

This application is a continuation application of U.S. application Ser. No. 17/828,194, filed on May 31, 2022 and claims priority to Chinese Patent Application No. 202011356201.7, filed on Nov. 27, 2020, and entitled "DISPLAY PANEL AND DISPLAY DEVICE", which is incorporated herein by reference in its entirety.

TECHNICAL FIELD

The present application relates to the field of display technologies, and in particular, relates to a display panel and a display apparatus.

BACKGROUND

Featuring self-luminousness, a low drive voltage, and fast response, an organic light-emitting diode (OLED) display panel has been widely used. The OLED display panel includes a plurality of pixel units, each including a light-emitting unit and a pixel circuit connected to the light-emitting unit.

SUMMARY

The present application provides a display panel and a display device. The technical solution is as follows:

According to one aspect, a display panel is provided. The display panel includes:
- a substrate provided with a first display region and a second display region adjacent to the first display region;
- a plurality of first light-emitting unit groups disposed in the first display region;
- a plurality of first pixel circuit groups disposed in the first display region, wherein each of the first pixel circuit groups is connected to one of the plurality of first light-emitting unit groups;
- a plurality of second light-emitting unit groups disposed in the second display region, wherein the plurality of second light-emitting unit groups include at least one first-type second light-emitting unit group and at least one second-type second light-emitting unit group, the at least one second-type second light-emitting unit group being closer to the first display region than the at least one first-type second light-emitting unit group being;
- a plurality of second pixel circuit groups disposed in the first display region, wherein the plurality of second pixel circuit groups include at least one first-type second pixel circuit group and at least one second-type second pixel circuit group, the at least one second-type second pixel circuit group being closer to the second display region than the at least one first-type second pixel circuit group being;
- a plurality of dummy electrode pattern groups disposed in the first display region, wherein the plurality of dummy electrode pattern groups include at least one first pattern group and at least one second pattern group, the at least one second pattern group being closer to the second display region than the at least one first pattern group being;
- a plurality of first connection traces, wherein the plurality of first connection traces are disposed in a different layer from the plurality of dummy electrode pattern groups, each of the first connection traces is provided with one end connected to one of the at least one first-type second light-emitting unit group, and the other end connected to one of the at least one first-type second pixel circuit group through one of the at least one first pattern group; and
- a plurality of second connection traces, wherein the plurality of second connection traces are disposed in a different layer from the plurality of first connection traces, each of the second connection traces is provided with one end connected to one of the at least one second-type second light-emitting unit group, and the other end connected to one of the at least one second-type second pixel circuit group through one of the at least one second pattern group;
- wherein the plurality of first connection traces are disposed in the first display region and the second display region, and the other ends of the plurality of first connection traces are flush.

Optionally, an orthographic projection of each of the dummy electrode pattern groups onto the substrate is at least partially overlapped with an orthographic projection of at least one of the second pixel circuit groups onto the substrate, and is not overlapped with an orthographic projection of any one of the first light-emitting unit groups onto the substrate.

Optionally, each of the first light-emitting unit groups and the second light-emitting unit groups includes a plurality of light-emitting units, and each of the light-emitting units includes a first electrode, a light-emitting layer, and a second electrode that are sequentially laminated in a direction distal from the substrate; and Each of the dummy electrode pattern groups includes a plurality of dummy electrode patterns, a quantity of the plurality of dummy electrode patterns in each of the dummy electrode pattern groups is the same as a quantity of the plurality of light-emitting units in each of the light-emitting unit groups, and the dummy electrode patterns is disposed in a same layer as the first electrode.

Optionally, the display panel may further include a pixel definition layer, disposed between the first electrode and the light-emitting layer, wherein The pixel definition layer is provided with a plurality of openings, one of the openings is configured to expose a first electrode in one of the light-emitting units, and orthographic projections of the plurality of openings onto the substrate are not overlapped with an orthographic projection of any one of the dummy electrode patterns onto the substrate.

Optionally, the plurality of dummy electrode patterns in each of the dummy electrode pattern groups correspond to the plurality of first light-emitting units in each of the first light-emitting unit groups in a one-to-one correspondence, and each of the dummy electrode patterns has a same shape and area as the first electrode in the first light-emitting unit corresponding to the dummy electrode pattern.

Optionally, each of the first light-emitting unit groups includes one first-color first light-emitting unit, two second-color first light-emitting units, and one third-color first light-emitting unit; and Each of the second light-emitting unit groups includes one first-color second light-emitting unit, two second-color second light-emitting units, and one third-color second light-emitting unit.

Optionally, a distance between centers of two adjacent first-color first light-emitting units in a row direction in the first display region is equal to a distance between centers of two adjacent first-color second light-emitting units in the row direction in the second display region;

A distance between centers of two adjacent second-color first light-emitting units in the row direction in the first display region is equal to a distance between centers of two adjacent second-color second light-emitting units in the row direction in the second display region; and A distance between centers of two adjacent third-color first light-emitting units in the row direction in the first display region is equal to a distance between centers of two adjacent third-color second light-emitting units in the row direction in the second display region.

Optionally, an area of an orthographic projection of an opening exposing the first-color first light-emitting unit in the first display region onto the substrate is equal to an area of an orthographic projection of an opening exposing the first-color second light-emitting unit in the second display region onto the substrate, and an area of an orthographic projection of the first electrode in the first-color first light-emitting unit in the first display region onto the substrate is greater than an area of an orthographic projection of the first electrode in the first-color second light-emitting unit in the second display region onto the substrate;

An area of an orthographic projection of an opening exposing the second-color first light-emitting unit in the first display region onto the substrate is equal to an area of an orthographic projection of an opening exposing the second-color second light-emitting unit in the second display region onto the substrate, and an area of an orthographic projection of the first electrode in the second-color first light-emitting unit in the first display region onto the substrate is greater than an area of an orthographic projection of the first electrode in the second-color second light-emitting unit in the second display region onto the substrate; and An area of an orthographic projection of an opening exposing the third-color first light-emitting unit in the first display region onto the substrate is equal to an area of an orthographic projection of an opening exposing the third-color second light-emitting unit in the second display region onto the substrate, and an area of an orthographic projection of the first electrode in the third-color first light-emitting unit in the first display region onto the substrate is greater than an area of an orthographic projection of the first electrode in the third-color second light-emitting unit in the second display region onto the substrate.

Optionally, the first electrode in each first light-emitting unit in each of the light-emitting unit groups includes a first body pattern and a first connection pattern connected to the first body pattern, the first body pattern is at least partially in contact with the light-emitting layer in the first light-emitting unit, and the first connection pattern is connected to one of the first pixel circuit groups; and Each of the dummy electrode patterns includes a second body pattern, and a second connection pattern and a third connection pattern connected to the second body pattern, the second body pattern is not in contact with the light-emitting layer in any one of the first light-emitting units, the second connection pattern is connected to one of the second pixel circuit groups, and the third connection pattern is connected to one of the second light-emitting unit groups through one of the first connection traces or second connection traces.

Optionally, the first electrode in the first light-emitting unit further includes a fourth connection pattern connected to the first body pattern.

An orthographic projection of the first body pattern of the first electrode in the first light-emitting unit onto the substrate has a same shape and area as an orthographic projection of the second body pattern of the dummy electrode pattern corresponding to the first light-emitting unit onto the substrate;

An orthographic projection of the first connection pattern of the first electrode in the first light-emitting unit onto the substrate has a same shape and area as an orthographic projection of the second connection pattern of the dummy electrode pattern corresponding to the first light-emitting unit on the substrate; and An orthographic projection of the fourth connection pattern of the first electrode in the first light-emitting unit onto the substrate has a same shape and area as an orthographic projection of the third connection pattern of the dummy electrode pattern corresponding to the first light-emitting unit onto the substrate.

Optionally, the orthographic projection of the first connection pattern onto the substrate is not overlapped with orthographic projections of the plurality of first connection traces onto the substrate, and the orthographic projection of the fourth connection pattern onto the substrate is at least partially overlapped with the orthographic projections of the plurality of first connection traces onto the substrate; and The orthographic projection of the second connection pattern onto the substrate is not overlapped with the orthographic projections of the plurality of first connection traces onto the substrate, and the orthographic projection of the third connection pattern onto the substrate is at least partially overlapped with the orthographic projections of the plurality of first connection traces onto the substrate.

Optionally, the first light-emitting units corresponding to two target dummy electrode patterns in two adjacent first pattern groups in the row direction have a same color, and third connection patterns of the two target dummy electrode patterns each are connected to one of the second light-emitting unit groups through one of the plurality of first connection traces; and For the two target dummy electrode patterns, a connection line between a connection portion of the third connection pattern in one target dummy electrode pattern and a connection portion of the third connection pattern in the other target dummy electrode pattern intersects the row direction, and the connection portion of the third connection pattern is configured to be connected to one of the first connection traces.

Optionally, each of the first pixel circuit groups includes a plurality of first pixel circuit units, each of the first pixel circuit units including at least a first pixel circuit and a second pixel circuit, and the at least two pixel circuits in each of the first pixel circuit units are configured to be electrically connected to the first electrode of a same first light-emitting unit in one of the first light-emitting unit groups.

Optionally, the first connection pattern of the first electrode in the first light-emitting unit includes a first body connection portion extending in a target direction and two first end portions disposed at both ends of the first body connection portion; and The two first end portions are electrically connected to the first pixel circuit and the second pixel circuit, respectively, and the target direction is approximately parallel to the row direction.

Optionally, each of the second pixel circuit groups includes a plurality of second pixel circuit units, each of the second pixel circuit units including at least a third pixel circuit and a fourth pixel circuit, and the at least two pixel circuits in each of the second pixel circuit units are configured to be electrically connected to a same dummy electrode pattern.

Optionally, the second connection pattern of the dummy electrode pattern includes a second body connection portion extending in the target direction and two second end portions disposed at both ends of the second body connection portion; and The two second end portions are electrically connected to the third pixel circuit and the fourth pixel circuit, respectively, and the target direction is approximately parallel to the row direction.

Optionally, the plurality of second connection traces are disposed in a same layer as the dummy electrode pattern groups.

Optionally, a connection line of the other ends of the plurality of first connection traces is parallel to an edge, distal from the second display region, of the first display region, and a distance between the connection line of the other ends of the plurality of first connection traces and the edge, distal from the second display region, of the first display region is less than a distance threshold.

Optionally, the connection line of the other ends of the plurality of first connection traces and the edge, distal from the second display region, of the first display region both are approximately parallel to a column direction.

Optionally, the connection line of the other ends of the plurality of first connection traces is collinear with the edge, distal form the second display region, of the first display region.

Optionally, the substrate is further provided with a third display region disposed on a same side as the first display region and the second display region, and the display panel further includes a plurality of third light-emitting unit groups and a plurality of third pixel circuit groups disposed in the third display region; and Each of the third pixel circuit groups is connected to one of the third light-emitting unit groups, and density of the plurality of third light-emitting unit groups is higher than density of the plurality of first light-emitting unit groups and density of the plurality of second light-emitting unit groups.

Optionally, the substrate includes two first display regions and one second display region, and the second display region is a rectangle; and At least one edge of the rectangle extending in the row direction borders the third display region, and two edges of the rectangle extending in a column direction borders the two first display regions, respectively.

Optionally, the first display region is a rectangle; and a length of any edge of the first display region ranges from 0.1 mm to 20 mm; and A length of any edge of the second display region ranges from 0.2 mm to 10 mm.

Optionally, the display panel may further include a plurality of data lines; wherein An orthographic projection of at least a part of at least one target data line in the second display region in the plurality of data lines onto the substrate is disposed in a region, proximal to the first display region, of the second display region.

According to another aspect, a display device is provided, including a power supply component and the display panel according to the foregoing aspect.

The power supply component is configured to supply power to the display panel.

BRIEF DESCRIPTION OF THE DRAWINGS

To describe the technical solutions in the embodiments of the present application more clearly, the following briefly describes the accompanying drawings required for describing the embodiments. Apparently, the accompanying drawings in the following description show merely some embodiments of the present application, and those of ordinary skill in the art may still derive other drawings from these accompanying drawings without creative efforts.

DETAILED DESCRIPTION

To make the objective, technical solutions, and advantages of the present application clearer, embodiments of the present application will be further described in detail with reference to the accompanying drawings.

In the related art, to improve a screen-to-body ratio of a display panel, a camera of a display device may be disposed in a display region of the display panel. In addition, to increase transmittance of a region in which the camera is located, a pixel circuit of each pixel unit in the region in which the camera is located is usually disposed in a non-camera region. The pixel circuit in the non-camera region is connected to a light-emitting unit in a camera region through a connection trace to provide a drive signal for the light-emitting unit in the camera region.

However, because a limited quantity of connection traces can be disposed in the display region, it is difficult to dispose a large quantity of light-emitting units in the camera region, resulting in a poor display effect of the camera region.

The terms used in the embodiments of the present application are used only to explain the embodiments of the present application, and are not intended to limit the present application. Unless otherwise defined, the technical or scientific terms used in the embodiments of the present application are as they are usually understood by those of ordinary skill in the art to which the present application pertains. "First", "second", "third", and similar words used in this specification and in the claims do not denote any order, quantity or importance, but are merely intended to distinguish between different constituents. Similarly, the terms "one", "a", and similar words are not meant to be limiting, but rather denote the presence of at least one. "Comprising", "consisting", and similar words mean that elements or articles appearing before "comprising" or "consisting" include the elements or articles and their equivalent elements appearing behind "comprising" or "consisting", not excluding any other elements or articles. "Connected", "connected to each other" and similar words are not restricted to physical or mechanical connections, but may include direct and indirect electrical connections. "Upper", "lower", "left", "right", and the like are used only to indicate a relative positional relationship, and when the absolute position of the described object is changed, the relative positional relationship is also changed accordingly.

Figure 1:
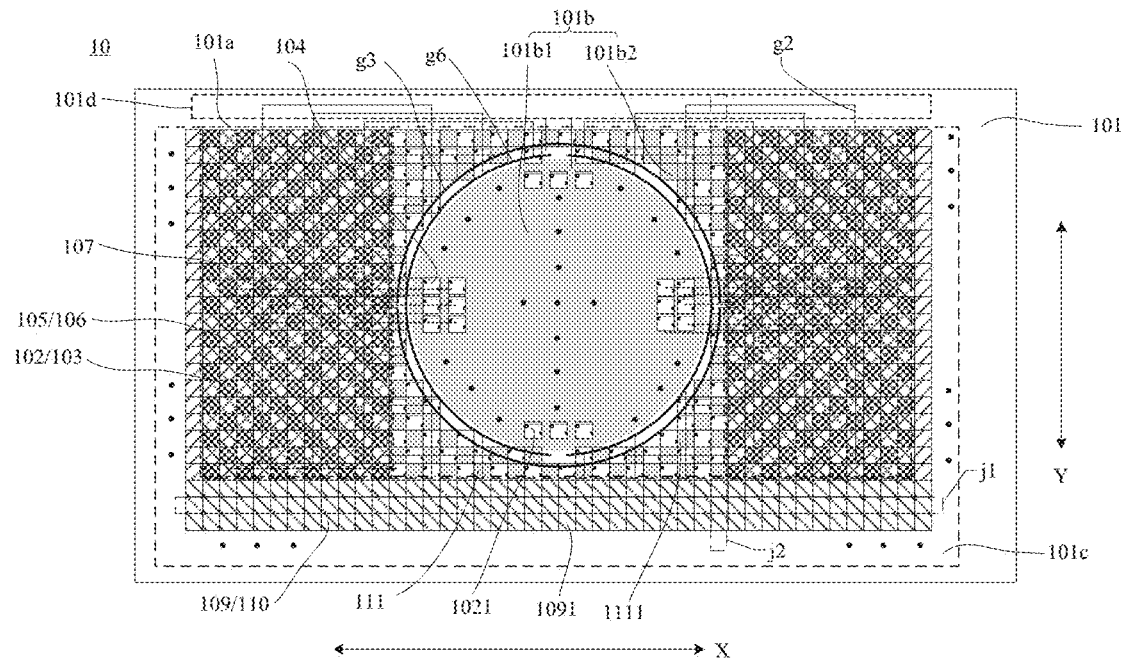
FIG. 1 is a schematic structural diagram of a display panel according to some embodiments of the present application.
Figure 2:
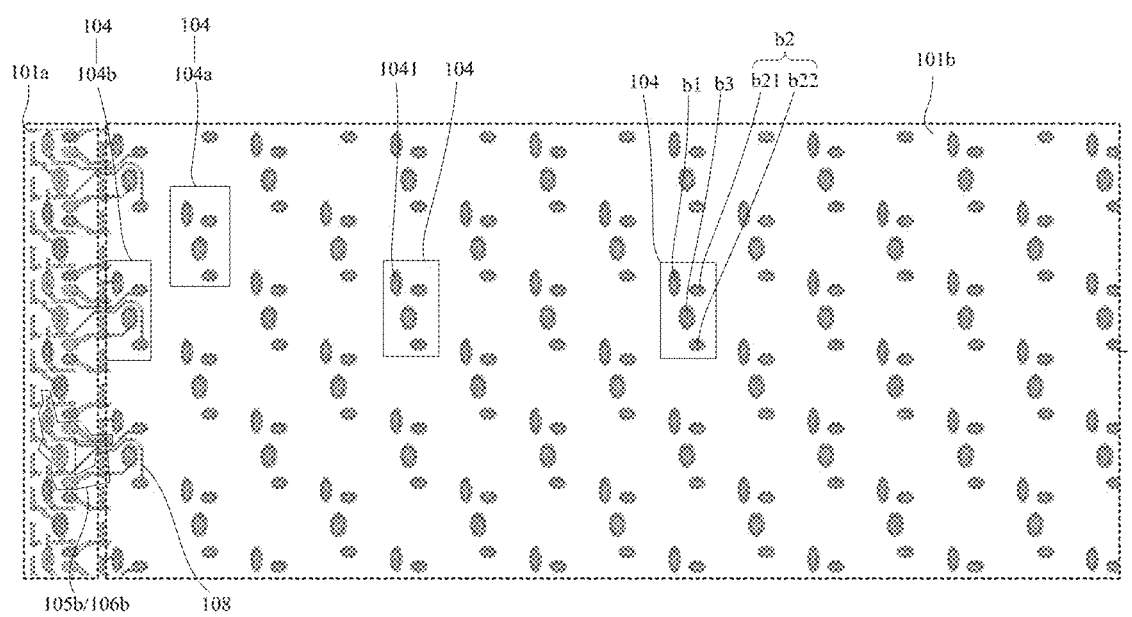
FIG. 2 is a partial schematic diagram of a display panel according to some embodiments of the present application.
Figure 3:
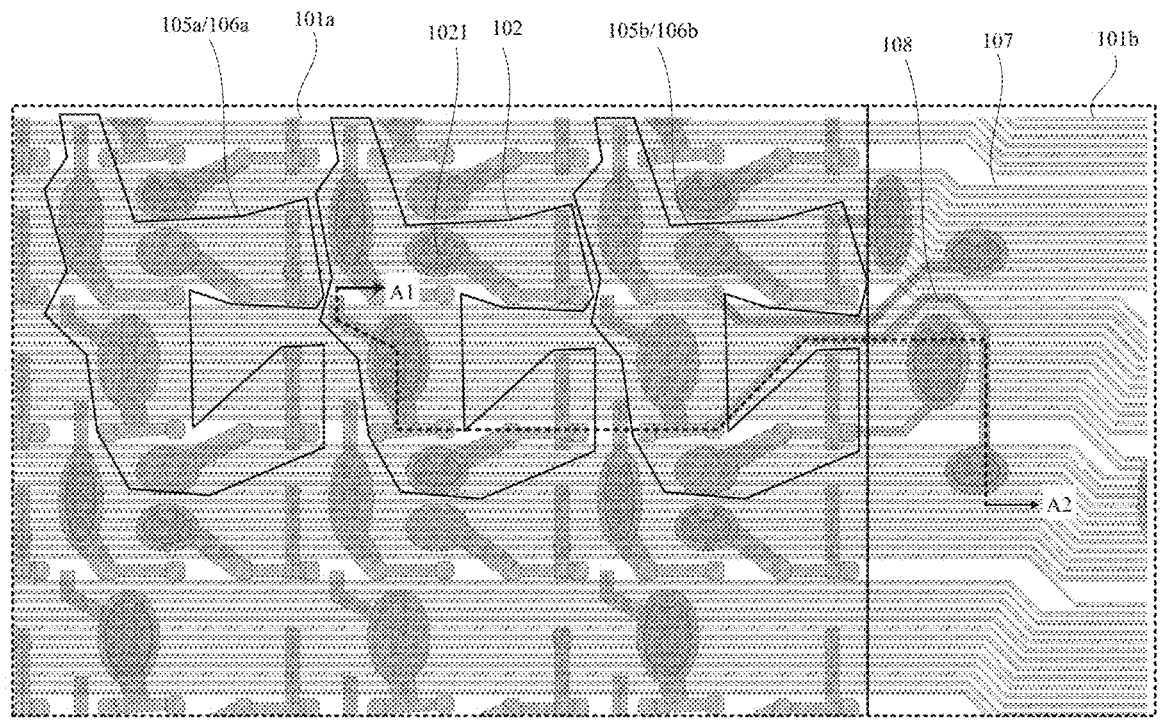
FIG. 3 is a partial schematic diagram of another display panel according to some embodiments of the present application.

FIG. 1 is a schematic structural diagram of a display panel according to some embodiments of the present application. FIG. 2 is a partial schematic diagram of a display panel according to some embodiments of the present application. FIG. 3 is a partial schematic diagram of another display panel according to some embodiments of the present application. With reference to FIG. 1 to FIG. 3, a display panel 10 may include a substrate 101, a plurality of first light-emitting unit groups 102, a plurality of first pixel circuit groups 103, a plurality of second light-emitting unit groups 104, a plurality of second pixel circuit groups 105, a plurality of dummy electrode pattern groups 106, a plurality of first connection traces 107, and a plurality of second connection traces 108.

Figure 4:
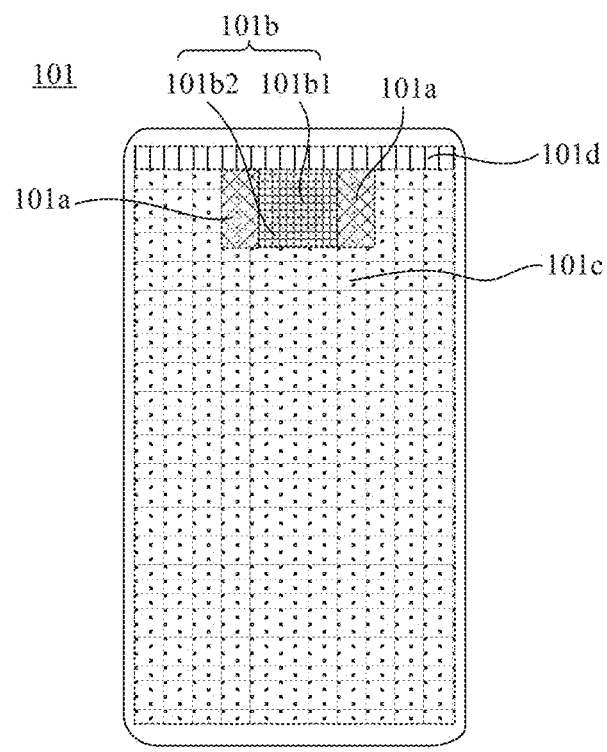
FIG. 4 is a top view of a substrate according to some embodiments of the present application.

FIG. 4 is a top view of a substrate according to some embodiments of the present application. Referring to FIG. 4, the substrate 101 may include a first display region 101a and a second display region 101b that are adjacent. FIG. 4 shows two first display regions 101a and one second display region 101b. The second display region 101b may be a region provided with a camera.

With reference to FIG. 1 to FIG. 4, the plurality of first light-emitting unit groups 102 and the plurality of first pixel circuit groups 103 are located in the first display regions 101a. Each of the first pixel circuit groups 103 is connected to one of the first light-emitting unit groups 102 and is configured to provide a drive signal for the first light-emitting unit group 102 connected thereto. The drive signal is used to drive the first light-emitting unit group 102 to emit light.

In addition, with reference to FIG. 1 to FIG. 4, the plurality of second light-emitting unit groups 104 are located in the second display region 101b, and the plurality of second pixel circuit groups 105 are located in the first display region 101a. The plurality of second light-emitting unit groups 104 include at least one first-type second light-emitting unit group 104a and at least one second-type second light-emitting unit group 104b. The at least one second-type second light-emitting unit group 104b is closer to the first display region 101a than the at least one first-type second light-emitting unit group 104a is. The plurality of second pixel circuit groups 105 include at least one first-type second pixel circuit group 105a and at least one second-type second pixel circuit group 105b. The at least one second-type second pixel circuit group 105b is closer to the second display region 101b than the at least one first-type second pixel circuit group 105a is. The plurality of dummy electrode pattern groups 106 are located in the first display region 101a, and the plurality of dummy electrode pattern groups 106 include at least one first pattern group 106a and at least one second pattern group 106b. The at least one second pattern group 106b is closer to the second display region 101b than the at least one first pattern group 106a is.

The plurality of first connection traces 107 may be located in a different layer from the plurality of dummy electrode pattern groups 106. In other words, the plurality of first connection traces 107 and the plurality of dummy electrode pattern groups 106 need to be respectively prepared through two patterning processes. Each of the first connection traces 107 has one end connected to one of the at least one first-type second light-emitting unit group 104a, and the other end connected to one of the at least one first-type second pixel circuit group 105a through one of the at least one first pattern group 106a. In other words, the first-type second pixel circuit group 105a in the first display region 101a may be connected to the first-type second light-emitting unit group 104a in the second display region 101b through the first connection trace 107 and the first pattern group 106a. In this way, each first-type second pixel circuit group 105a can provide a drive signal for a first-type second light-emitting unit group 104a connected thereto. The drive signal is used to drive the first-type second light-emitting unit group 104a to emit light.

The plurality of second connection traces 108 may be located at a different layer from the plurality of first connection traces 107. In other words, the plurality of second connection traces 108 and the plurality of first connection traces 107 need to be respectively prepared through two patterning processes. Each of the second connection traces 108 has one end connected to one of the at least one second-type second light-emitting unit group 104b, and the other end connected to one of the at least one second-type second pixel circuit group 105b through one of the at least one second pattern group 106b. In other words, the second-type second pixel circuit group 105b in the first display region 101a may be connected to the second-type second light-emitting unit group 104b in the second display region 101b through the second connection trace 108 and the second pattern group 106b. In this way, each second-type second pixel circuit group 105b can provide a drive signal for a second-type second light-emitting unit group 104b connected thereto. The drive signal is used to drive the second-type second light-emitting unit group 104b to emit light.

Due to limited space in the display panel 10, a limited quantity of first connection traces 107 can be disposed. Therefore, the second connection trace 108 is disposed such that the second-type second pixel circuit group 105b, proximal to the second display region 101b, in the first display region 101a is connected to the second-type second light-emitting unit group 104b, proximal to the first display region 101a, in the second display region 101b through the second connection trace 108, to enable the second-type second light-emitting unit group 104b to emit light. In other words, even if the limited quantity of first connection traces 107 are disposed in the display panel 10, a quantity of second light-emitting unit groups 104 that are disposed in the second display region 101b can be increased. In this way, a display effect of the second display region 101b can be ensured, a camera with a large size can be disposed, and the requirement on the manufacturing accuracy of the display panel 10 is lower.

In addition, there is a small interval between the second-type second pixel circuit group 105b and the second-type second light-emitting unit group 104b connected through the second connection trace 108. This facilitates preparation, and can prevent the second connection trace 108 from affecting the first-type second light-emitting unit group 104a in the second display region 101b to ensure a light-emitting effect of the first-type second light-emitting unit group 104a.

In summary, the embodiments of the present application provide a display panel. The plurality of second pixel circuit groups in the first display region in the display panel includes the first-type second pixel circuit group distal from the second display region and the second-type second pixel circuit group proximal to the second display region. The first-type second pixel circuit group is connected to the first-type second light-emitting unit group, distal from the first display region, in the second display region through the first connection trace. The second-type second pixel circuit group is connected to the second-type second light-emitting unit group, proximal to the first display region, in the second display region through the second connection trace. In the solution provided in the embodiments of the present application, the drive signal can be provided for the second-type second light-emitting unit group through the second connection trace located in the different layer from the first connection trace. Therefore, the quantity of second light-emitting unit groups that are disposed in the second display region can be increased without increasing the quantity of first connection traces, to ensure the display effect of the second display region in the display panel.

Optionally, a material of the first connection traces 107 may be a transparent material to prevent the first connection traces 107 from affecting transmittance of the second display region 101b. For example, the material of the first connection traces 107 may be indium tin oxide (ITO). In addition, an extension direction of the plurality of first connection traces 107 may be a row direction X.

In this embodiment of the present application, as shown in FIG. 3, a maximum of 13 first connection traces 107 can be designed in each row of pixels (the quantity of first connection traces 107 is limited by a width and pixel size of the first connection traces 107). In other words, the second display region 101b can be provided with a maximum of 26 pixels in the row direction X (the two first display regions 101a each are provided with 13 first connection traces 107, that is, there are 26 first connection traces 107 respectively connected to the 26 pixels). However, if the second display region 101b needs a larger quantity of pixels in the row direction X, there are some pixels lacking corresponding first connection traces 107 connected thereto. Therefore, the second-type second pixel circuit group 105b, proximal to the second display region 101b, in the first display region 101a is connected to the second-type second light-emitting unit group 104b, proximal to the first display region 101a, in the second display region 101b through the second connection trace 108, to enable the second-type second light-emitting unit group 104b to emit light. The first-type second pixel circuit group 105a is connected to the first-type second light-emitting unit group 104a in the second display region 101b through the first connection trace 107.

Referring to FIG. 1 and FIG. 4, the second display region 101b may include a central region 101b1 and an edge region 101b2 surrounding the central region 101b1. For example, FIG. 4 schematically shows that the second display region 101b is a rectangle, the central region 101b1 of the second display region 101b is circular, and the edge region 101b2 is a region in the rectangle other than the circular central region. Certainly, the central region 101b1 and the edge region 101b2 of the second display region 101b may alternatively have other shapes and may be provided based on actual product requirements. This is not limited in the embodiments of the present application.

Optionally, the central region 101b may be an under-screen photographing region. The central region 101b1 is provided with the second light-emitting unit groups 104. The second pixel circuit groups 105 configured to drive the second light-emitting unit groups 104 to emit light are disposed in the first display regions 101a. Therefore, the central region 101b1 can have high light transmittance to implement a photographing function, and can emit light by being connected to the pixel circuit groups in other regions (first display regions 101a) without affecting a display function of a screen.

In this embodiment of the present application, referring to FIG. 1, an orthographic projection of each dummy electrode pattern group 106 onto the substrate 101 may be at least partially overlapped with an orthographic projection of at least one of the second pixel circuit groups 105 onto the substrate 101. In FIG. 1, a same small square block is used to represent the second pixel circuit groups 105 and the dummy electrode pattern groups 106 that are overlapped and is denoted by 105/106. Optionally, the orthographic projection of each dummy electrode pattern group 106 onto the substrate 101 may be at least partially overlapped with an orthographic projection of one of the second pixel circuit groups 105 onto the substrate 101.

In addition, the orthographic projection of each dummy electrode pattern group 106 onto the substrate 101 is not overlapped with an orthographic projection of any one of the first light-emitting unit groups 102 onto the substrate 101. In this way, the dummy electrode pattern groups 106 can be prevented from affecting first light-emitting units 1021 in each of the first light-emitting unit groups 102 and a light-emitting effect of the first light-emitting units 1021 can be ensured.

Figure 5:
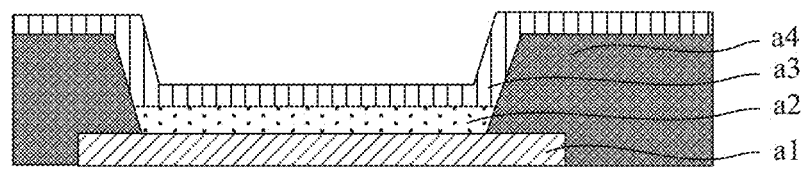
FIG. 5 is a schematic diagram of a light-emitting unit according to some embodiments of the present application.

Referring to FIG. 2 and FIG. 3, each of the first light-emitting unit groups 102 and second light-emitting unit groups 104 may include a plurality of light-emitting units. For example, each of the first light-emitting unit groups 102 includes a plurality of first light-emitting units 1021, and each of the second light-emitting unit groups 104 includes a plurality of second light-emitting units 1041. FIG. 5 is a schematic structural diagram of a light-emitting unit according to some embodiments of the present application. Referring to FIG. 5, the light-emitting unit may include a first electrode a1, a light-emitting layer a2, and a second electrode a3 that are sequentially laminated in a direction away from the substrate 101. The first electrode a1 may be an anode, and the second electrode a3 may be a cathode.

Figure 6:
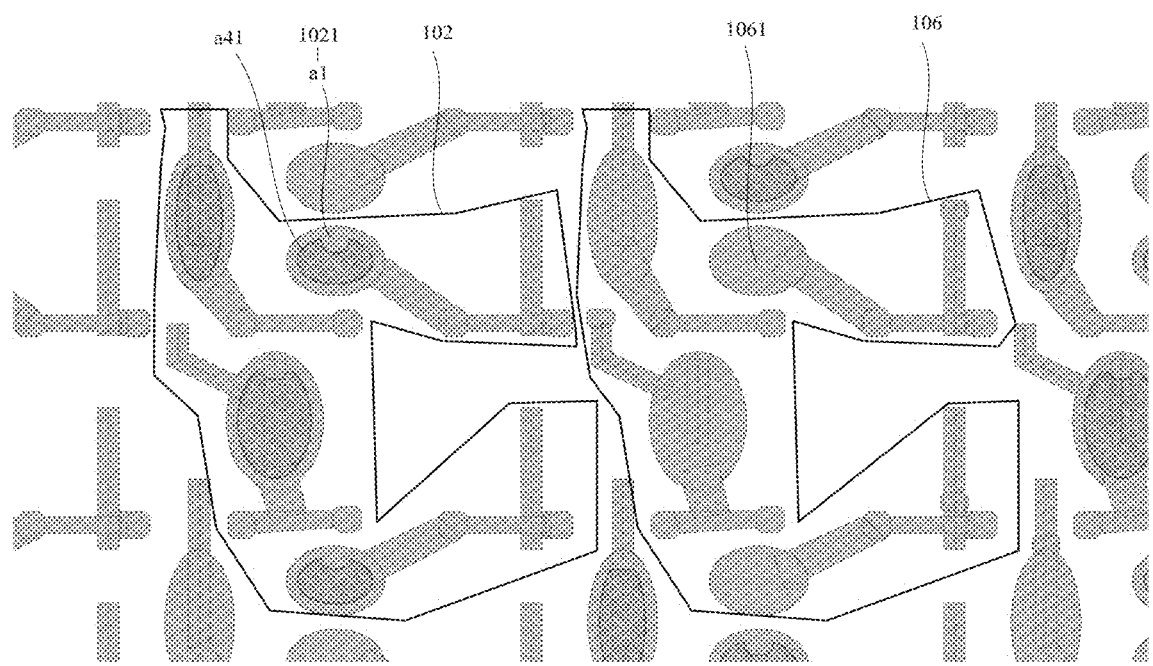
FIG. 6 is a partial schematic diagram of still another display panel according to some embodiments of the present application.

In addition, referring to FIG. 6, each dummy electrode pattern group 106 may include a plurality of dummy electrode patterns 1061, and a quantity of the plurality of dummy electrode patterns 1061 included in each dummy electrode pattern group 106 is the same as a quantity of the plurality of light-emitting units included in each light-emitting unit group (first light-emitting unit group 102 or second light-emitting unit group 104).

For example, each dummy electrode pattern group 106 includes four dummy electrode patterns 1061, and each light-emitting unit group includes four light-emitting units.

Optionally, the dummy electrode patterns 1061 in each dummy electrode pattern group 106 are located in a same layer as the first electrode a1 in each light-emitting unit, and the second connection traces 108 are located in the same layer as the first electrode a1. In other words, the plurality of second connection traces 108 may be located in the same layer as the plurality of dummy electrode pattern groups 106. That the plurality of second connection traces 108 are located in the same layer as the plurality of dummy electrode pattern groups 106 may mean that the plurality of second connection traces 108 are located in the same layer as the dummy electrode patterns 1061 in each of the plurality of dummy electrode pattern groups 106. The dummy electrode patterns 1061 may be dummy anode patterns, and the second connection traces 108 may be anode traces.

Alternatively, the dummy electrode patterns 1061 in each dummy electrode pattern group 106 are located in a same layer as the first electrode a1 in each light-emitting unit, and the plurality of second connection traces 108 are located in a different layer from the plurality of dummy electrode pattern groups 106. In other words, the plurality of second connection traces 108 may be in a different layer from the first electrode a1. Optionally, the plurality of second connection traces 107 may be located in another metal layer. For example, the plurality of second connection traces 107 may be located at a second source-drain metal layer. There may be an insulation layer between the second source-drain metal layer and the plurality of second connection traces, and the second connection traces located in the second source-drain metal layer are connected to the dummy electrode patterns 1061 through a via hole in the insulation layer. In the embodiments of the present application, positions of the dummy electrode patterns 1061 are not limited.

In addition, it should be noted that the dummy electrode pattern groups 106 are not merely dummy, and the dummy electrode pattern groups 106 may further be configured to transmit signals.

Referring to FIG. 5, the light-emitting unit may further include a pixel definition layer a4 located between the first electrode a1 and the light-emitting layer a2. The pixel definition layer a4 may be provided with a plurality of openings a41. Each opening a41 may be used to expose a first electrode a1 in one light-emitting unit. In addition, orthographic projections of the plurality of openings a41 onto the substrate 101 are not overlapped with an orthographic projection of any one of the dummy electrode patterns 1061 onto the substrate 101.

Each of the openings a41 of the pixel definition layer a4 exposes the first electrode a1 in the light-emitting unit such that the first electrode a1 in the light-emitting unit can be in contact with the light-emitting layer a2 to emit light. Because the orthographic projections of the plurality of openings a41 onto the substrate 101 are not overlapped with the orthographic projection of any one of the dummy electrode patterns 1061 onto the substrate 101, no light is emitted in the positions of the dummy electrode patterns 1061.

It should be noted that for convenience of illustration, the light-emitting layer a2 and the cathode layer a3 are not shown in the top view provided in the embodiments of the present application, and only the openings a41 of the pixel definition layer a4 are used to distinguish the first electrode a1 from the dummy electrode patterns 1061. A pattern in a region with the opening a41 of the pixel definition layer a4 is the first electrode a1, and a pattern in a region without the opening a41 of the pixel definition layer a4 is the dummy electrode pattern 1061.

The plurality of dummy electrode patterns 1061 in each of the dummy electrode pattern groups 106 correspond to the plurality of first light-emitting units 1021 in each of the first light-emitting unit groups 102 in a one-to-one correspondence, and each of the dummy electrode patterns 1061 has a same shape and area as a first electrode a1 in a corresponding first light-emitting unit 1021.

As each of the dummy electrode patterns 1061 has the same shape and area as the first electrode a1 in the corresponding first light-emitting unit 1021, an overlapping area between the first electrode a1 and the first connection trace 107 can be the same as that between the dummy electrode pattern 1061 and the first connection trace 107 in the first display region 101a, such that an overlapping capacitance between the first electrode a1 and the first connection trace 107 is the same as that between the dummy electrode pattern 1061 and the first connection trace 107 in the first display region 101a, so as to ensure the display effect of the display panel 10.

Certainly, each of the dummy electrode patterns 1061 may alternatively have a different shape and area from the first electrode a1 in the corresponding first light-emitting unit 1021, which is not limited in the embodiments of the present application, provided that the overlapping area between the first electrode a1 and the first connection trace 107 is the same as that between the dummy electrode pattern 1061 and the first connection trace 107 in the first display region 101a.

Figure 7:
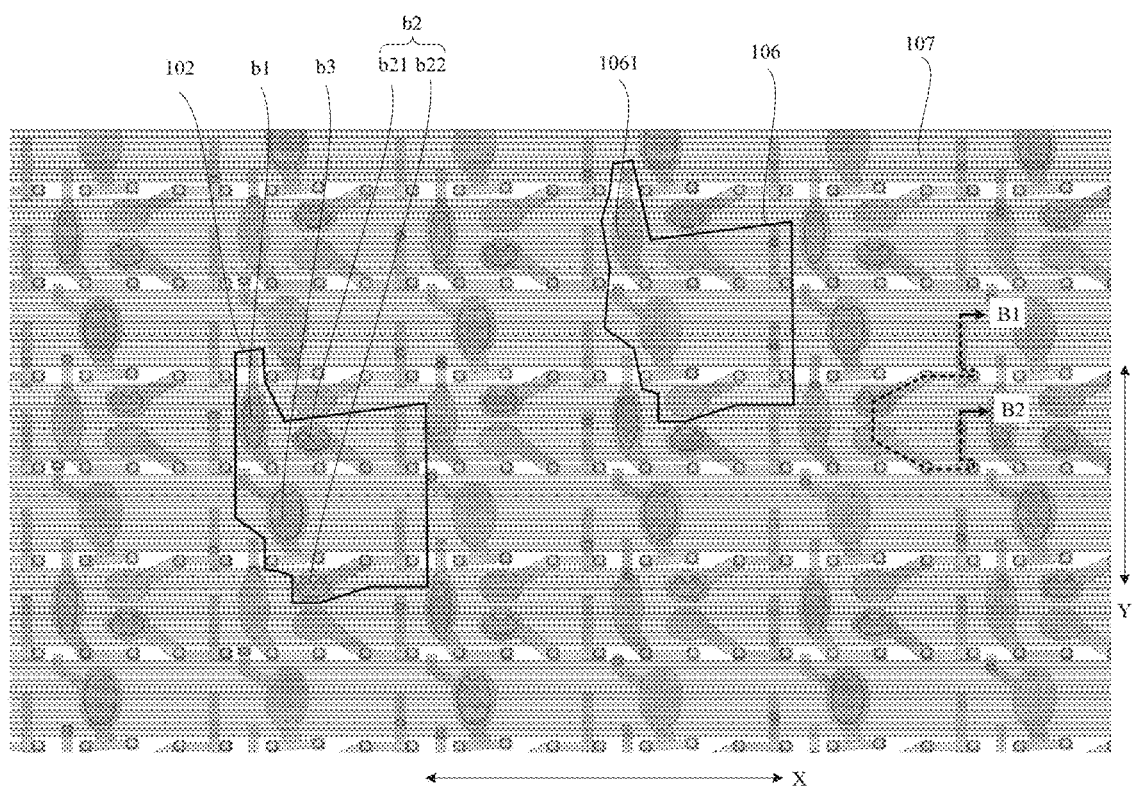
FIG. 7 is a partial schematic diagram of yet another display panel according to some embodiments of the present application.

Optionally, referring to FIG. 7, each light-emitting unit group (for example, first light-emitting unit group 102 or second light-emitting unit group 104) may include at least one first-color light-emitting unit, at least one second-color light-emitting unit, and at least one third-color light-emitting unit. The first color, second color, and third color may be three primary colors. For example, the first color is red (R), the second color is green (G), and the third color is blue (B).

For example, referring to FIG. 7, each first light-emitting unit group 102 includes one first-color first light-emitting unit b1, two second-color first light-emitting units (b21 and b22), and one third-color first light-emitting unit b3. The two second-color first light-emitting units (b21 and b22) may be collectively referred to as a second-color first light-emitting unit pair b2.

In addition, referring to FIG. 2, each second light-emitting unit group 104 includes one first-color second light-emitting unit b1, two second-color second light-emitting units (b21 and b22), and one third-color second light-emitting unit b3. The two second-color second light-emitting units (b21 and b22) may be collectively referred to as a second-color second light-emitting unit pair b2.

In this embodiment of the present application, the plurality of dummy electrode patterns 1061 in each of the dummy electrode pattern groups 106 also correspond to the plurality of second light-emitting units 1041 in each of the second light-emitting unit groups 104 in one-to-one correspondence, and a first light-emitting unit 1021 corresponding to each dummy electrode pattern 1061 has a same color as a second light-emitting unit 1041 corresponding to the dummy electrode pattern 1061.

Optionally, a distance between centers of two adjacent first-color first light-emitting units 1021 in the row direction X in the first display region 101a is equal to a distance between centers of two adjacent first-color second light-emitting units 1041 in the row direction X in the second display region 101b. A distance between centers of two adjacent second-color first light-emitting units (b21 and b22) in the row direction X in the first display region 101a is equal to a distance between centers of two adjacent second-color second light-emitting units 1041 in the row direction X in the second display region 101b. A distance between centers of two adjacent third-color first light-emitting units 1021 in the row direction X in the first display region 101a is equal to a distance between centers of two adjacent third-color second light-emitting units 1041 in the row direction X in the second display region 101b.

In other words, a resolution of the display panel 10 in the first display regions 101a may be equal to a resolution of the display panel 10 in the second display region 101b.

Optionally, an area of an orthographic projection of an opening exposing the first-color first light-emitting unit 1021 in the first display region 101a onto the substrate 101 is equal to an area of an orthographic projection of an opening exposing the first-color second light-emitting unit 1041 in the second display region 101b onto the substrate 101. Therefore, an area of a light-emitting region of the first-color first light-emitting unit 1021 in the first display region 101a can be equal to an area of a light-emitting region of the first-color second light-emitting unit 1041 in the second display region 101b to ensure uniform light-emitting effects of the first-color light-emitting units in the first display region 101a and the second display region 101b.

An area of an orthographic projection of an opening exposing the second-color first light-emitting unit 1021 in the first display region 101a onto the substrate 101 is equal to an area of an orthographic projection of an opening exposing the second-color second light-emitting unit 1041 in the second display region 101b onto the substrate 101. Therefore, an area of a light-emitting region of the second-color first light-emitting unit 1021 in the first display region 101a can be equal to an area of a light-emitting region of the second-color second light-emitting unit 1041 in the second display region 101b to ensure uniform light-emitting effects of the second-color light-emitting units in the first display region 101a and the second display region 101b.

An area of an orthographic projection of an opening exposing the third-color first light-emitting unit 1021 in the first display region 101a onto the substrate 101 is equal to an area of an orthographic projection of an opening exposing the third-color second light-emitting unit 1041 in the second display region 101b onto the substrate 101. Therefore, an area of a light-emitting region of the third-color first light-emitting unit 1021 in the first display region 101a can be equal to an area of a light-emitting region of the third-color second light-emitting unit 1041 in the second display region 101b to ensure uniform light-emitting effects of the third-color light-emitting units in the first display region 101a and the second display region 101b.

In addition, in this embodiment of the present application, an area of an orthographic projection of a first electrode a1 in the first-color first light-emitting unit 1021 in the first display region 101a onto the substrate 101 is greater than an area of an orthographic projection of a first electrode a1 in the first-color second light-emitting unit 1041 in the second display region 101b onto the substrate 101. An area of an orthographic projection of a first electrode a1 in the second-color first light-emitting unit 1021 in the first display region 101a onto the substrate 101 is greater than an area of an orthographic projection of a first electrode a1 in the second-color second light-emitting unit 1041 in the second display region 101b onto the substrate 101. An area of an orthographic projection of a first electrode a1 in the third-color first light-emitting unit 1021 in the first display region 101a onto the substrate 101 is greater than an area of an orthographic projection of a first electrode a1 in the third-color second light-emitting unit 1041 in the second display region 101b onto the substrate 101.

Figure 8:
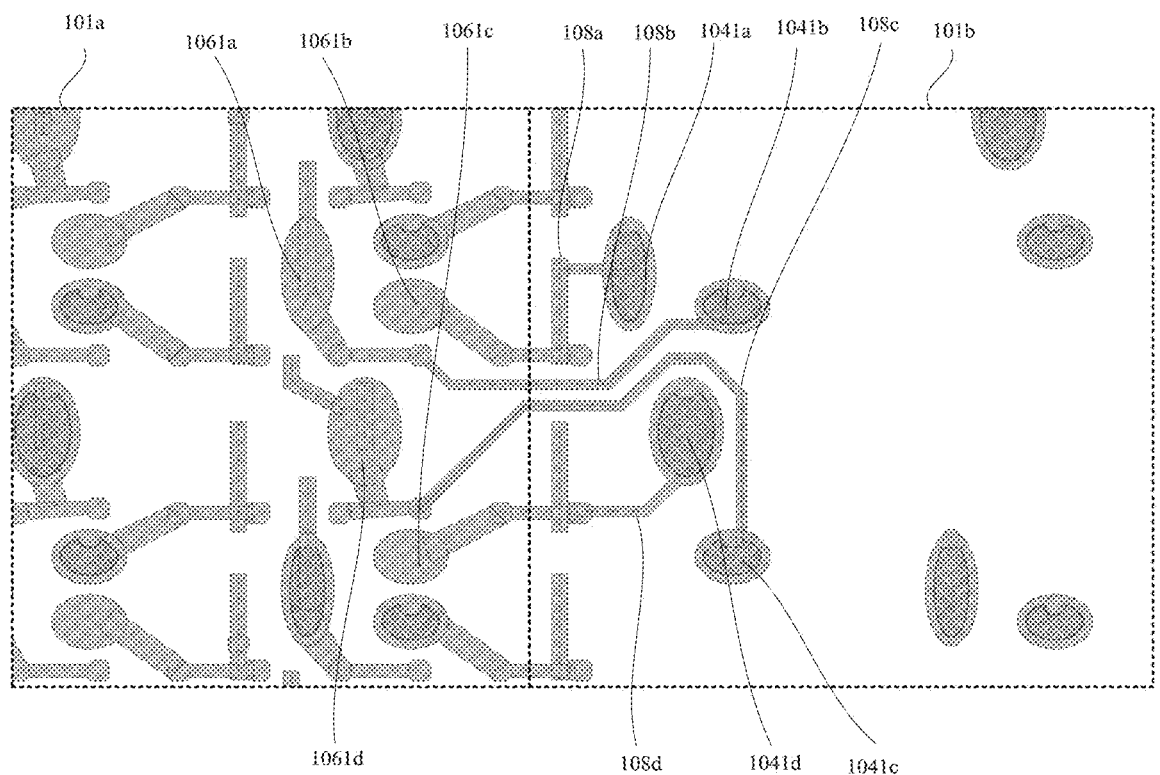
FIG. 8 is a partial schematic diagram of yet another display panel according to some embodiments of the present application.

FIG. 8 is a partial schematic diagram of yet another display panel according to some embodiments of the present application. Referring to FIG. 8, the second pattern group in the plurality of dummy electrode pattern groups 106 includes a first dummy electrode pattern 1061a, a second dummy electrode pattern 1061b, a third dummy electrode pattern 1061c, and a fourth dummy electrode pattern 1061d. The second-type second light-emitting unit group in the plurality of second light-emitting unit groups 104 includes a first second light-emitting unit 1041a, a second second light-emitting unit 1041b, a third second light-emitting unit 1041c, and a fourth second light-emitting unit 1041d. The first dummy electrode pattern 1061a corresponds to the first second light-emitting unit 1041a, the second dummy electrode pattern 1061b corresponds to the second second light-emitting unit 1041b, the third dummy electrode pattern 1061c corresponds to the third second light-emitting unit 1041c, and the fourth dummy electrode pattern 1061d corresponds to the fourth second light-emitting unit 1041d.

Referring to FIG. 8, the first dummy electrode pattern 1061a is connected to the second second light-emitting unit 1041b through a second second connection trace 108b. The second dummy electrode pattern 1061b is connected to the first second light-emitting unit 1041a through a first second connection trace 108a. The third dummy electrode pattern 1061c is connected to the fourth second light-emitting unit 1041d through a fourth second connection trace 108d. The fourth dummy electrode pattern 1061d is connected to the third second light-emitting unit 1041c through a third second connection trace 108c. In other words, each dummy electrode pattern 1061 in the second pattern group is not connected to a corresponding second light-emitting unit 1041 in the second-type second light-emitting unit group 104. Certainly, the foregoing corresponding connection method is optional, and there may alternatively be another corresponding connection method. For example, each dummy electrode pattern 1061 in the second pattern group is connected to the corresponding second light-emitting unit 1041 in the second-type second light-emitting unit group 104. This is not limited in the embodiments of the present application.

Figure 9:
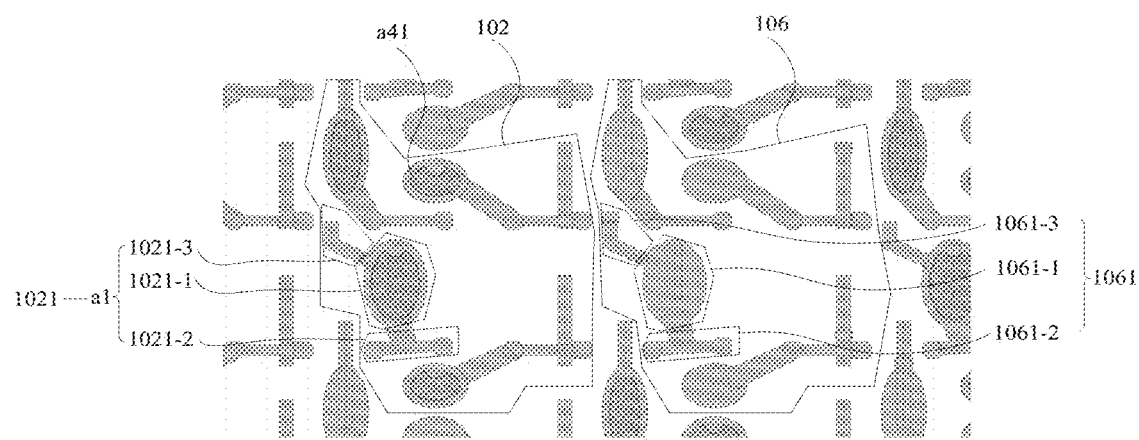
FIG. 9 is a partial schematic diagram of yet another display panel according to some embodiments of the present application.

FIG. 9 is a partial schematic diagram of yet another display panel according to some embodiments of the present application. Referring to FIG. 9, the first electrode a1 in each first light-emitting unit 1021 in each first light-emitting unit group 102 includes a first body pattern 1021-1 and a first connection pattern 1021-2 connected to the first body pattern 1021-1. A region in which the first body pattern 1021-1 is located has the opening a41 of the pixel definition layer a4 such that the first body pattern 1021-1 is at least partially in contact with the light-emitting layer a2 in the first light-emitting unit 1021, and the first connection pattern 1021-2 can be connected to one of the first pixel circuit groups 103.

In addition, referring to FIG. 9, each dummy electrode pattern 1061 may include a second body pattern 1061-1, a second connection pattern 1061-2 connected to the second body pattern 1061-1, and a third connection pattern 1061-3 connected to the second body pattern 1061-1. A region in which the second body pattern 1061-1 is located does not have the opening a41 of the pixel definition layer a4 such that the second body pattern 1061-1 may not be in contact with the light-emitting layer a2 of any first light-emitting unit 1021. The second connection pattern 1061-2 is connected to the second pixel circuit group 105, and the third connection pattern 1061-3 is connected to the second light-emitting unit group 104 through the first connection trace 107 or the second connection trace 108.

For a dummy electrode pattern 1061 being the dummy electrode pattern 1061 in the first pattern group 106a, a third connection pattern 1061-3 of the dummy electrode pattern 1061 can be connected to the first-type second light-emitting unit group 104a through the first connection trace 107. For a dummy electrode pattern 1061 being the dummy electrode pattern 1061 in the second pattern group 106b, a third connection pattern 1061-3 of the dummy electrode pattern 1061 can be connected to the second-type second light-emitting unit group 104b through the second connection trace 108.

Referring to FIG. 9, the first electrode a1 in the first light-emitting unit 1021 may further include a fourth connection pattern 1021-3 connected to the first body pattern 1021-1. The first body pattern 1021-1 of the first electrode a1 may correspond to the second body pattern 1061-1 of the dummy electrode pattern 1061, the first connection pattern 1021-2 of the first electrode a1 may correspond to the second connection pattern 1061-2 of the dummy electrode pattern 1061, and the fourth connection pattern 1021-3 of the first electrode a1 may correspond to the third connection pattern 1061-3 of the dummy electrode pattern 1061. Optionally, two corresponding patterns have a same shape and area, and a same overlapping area with the first connection trace 107.

In other words, an orthographic projection of the first body pattern 1021-1 of the first electrode a1 in the first light-emitting unit 1021 onto the substrate 101 has a same shape and area as an orthographic projection of the second body pattern 1061-1 of the dummy electrode pattern 1061 corresponding to the first light-emitting unit 1021 onto the substrate 101. An orthographic projection of the first connection pattern 1021-2 of the first electrode a1 in the first light-emitting unit 1021 onto the substrate 101 has a same shape and area as an orthographic projection of the second connection pattern 1061-2 of the dummy electrode pattern 1061 corresponding to the first light-emitting unit 1021 onto the substrate 101. An orthographic projection of the fourth connection pattern 1021-3 of the first electrode a1 in the first light-emitting unit 1021 onto the substrate 101 has a same shape and area as an orthographic projection of the third connection pattern 1061-3 of the dummy electrode pattern 1061 corresponding to the first light-emitting unit 1021 onto the substrate 101.

In this embodiment of the present application, as the dummy electrode pattern 1061 corresponding to the first light-emitting unit 1021 includes the third connection pattern 1061-3 connected to the first connection trace 107 or the second connection trace 108, to make the first electrode a1 have a same shape and area as the dummy electrode pattern 1061, the first electrode a1 may also include the fourth connection pattern 1021-3 having the same shape and area as the third connection pattern 1061-3. The fourth connection pattern 1021-3 does not need to be connected to the first connection trace 107 or the second connection trace 108.

In this embodiment of the present application, with reference to FIG. 7 and FIG. 9, the orthographic projection of the first connection pattern 1021-2 onto the substrate 101 is not overlapped with orthographic projections of the plurality of first connection traces 107 on the substrate 101. In this way, a connection between the first connection pattern 1021-2 of the first electrode a1 and the first pixel circuit group 103 can be prevented from being affected by the first connection trace 107, and it can be ensured that the first light-emitting units 1021 in the first light-emitting unit group 102 connected to the first pixel circuit group 103 normally emit light. In addition, the orthographic projection of the fourth connection pattern 1021-3 onto the substrate 101 is at least partially overlapped with the orthographic projections of the plurality of first connection traces 107 onto the substrate 101.

With reference to FIG. 7 and FIG. 9, the orthographic projection of the second connection pattern 1061-2 onto the substrate 101 is not overlapped with the orthographic projections of the plurality of first connection traces 107 onto the substrate 101. In this way, a connection between the dummy electrode pattern 1061 and the second pixel circuit group 105 can be prevented from being affected by the second connection trace 108, and it can be ensured that the second light-emitting units in the second light-emitting unit group 104 connected to the second pixel circuit group 105 normally emit light.

In addition, with reference to FIG. 7 and FIG. 9, the orthographic projection of the third connection pattern 1061-3 of the dummy electrode pattern 1061 onto the substrate 101 is at least partially overlapped with the orthographic projections of the plurality of first connection traces 107 onto the substrate 101.

For the dummy electrode pattern 1061 in the first pattern group 106a, as the third connection pattern 1061-3 of the dummy electrode pattern 1061 needs to be connected to the first connection trace 107, the orthographic projection of the third connection pattern 1061-3 onto the substrate 101 needs to be at least partially overlapped with the orthographic projections of the plurality of first connection traces 107 onto the substrate 101.

In general, to ensure uniformity of arrangement of the dummy electrode pattern groups 106 in the first display region 101a, each second pattern group 106b may be arranged in the row direction X with at least one first pattern group 106a. For the dummy electrode pattern 1061 in the second pattern group 106b, an overlapping area between the orthographic projection of the dummy electrode pattern 1061 in the second pattern group 106b onto the substrate 101 and the orthographic projections of the plurality of first connection traces 107 onto the substrate 101 may be the same as an overlapping area between an orthographic projection of the dummy electrode pattern 1061 in the first pattern group 106a onto the substrate 101 and the orthographic projections of the plurality of first connection traces 107 onto the substrate 101.

In other words, when the orthographic projection of the third connection pattern 1061-3 of the dummy electrode pattern 1061 in the first pattern group 106a onto the substrate 101 is at least partially overlapped with the orthographic projections of the plurality of first connection traces 107 onto the substrate 101, the orthographic projection of the third connection pattern 1061-3 of the dummy electrode pattern 1061 in the second pattern group 106b onto the substrate 101 is at least partially overlapped with the orthographic projections of the plurality of first connection traces 107 onto the substrate 101.

Figure 10:
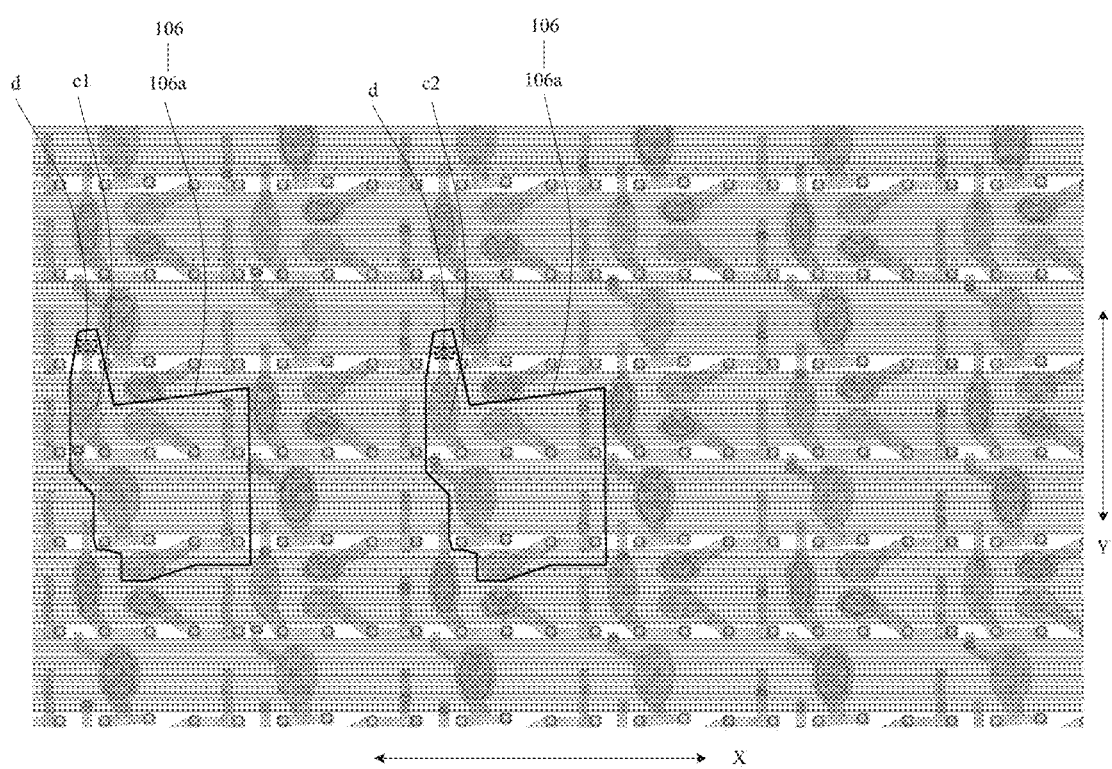
FIG. 10 is a partial schematic diagram of yet another display panel according to some embodiments of the present application.

FIG. 10 is a partial schematic diagram of yet another display panel according to some embodiments of the present application. Referring to FIG. 10, the display panel 10 includes two adjacent first pattern groups 106a in the row direction X. The two first pattern groups 106a each include a plurality of dummy electrode patterns 1061, and one target dummy electrode pattern c1 included in a first first pattern group 106a corresponds to another target dummy electrode pattern c2 included in a second first pattern group 106a. First light-emitting units 1021 corresponding to the two target dummy electrode patterns (c1 and c2) have a same color. For example, in FIG. 10, the first light-emitting units 1021 corresponding to the two target dummy electrode patterns (c1 and c2) are both red.

Referring to FIG. 10, in the two target dummy electrode patterns (c1 and c2), a connection line between a connection portion d of a third connection pattern 1061-3 in the target dummy electrode pattern c1 and a connection portion d of a third connection pattern 1061-3 in the target dummy electrode pattern c2 intersects the row direction X. The connection portion d of the third connection pattern 1061-3 is configured to be connected to the first connection trace 107.

It should be noted that because the two target dummy electrode patterns (c1 and c2) need to be connected to different first connection traces 107, and the first connection traces 107 generally extend in the row direction X, there is an interval between the connection portions d connected to the first connection traces 107 in the third connection patterns 1061-3 of the two target dummy electrode patterns (c1 and c2) in a column direction, that is, the connection line between the two connection portions d may intersect the row direction X.

Figure 11:
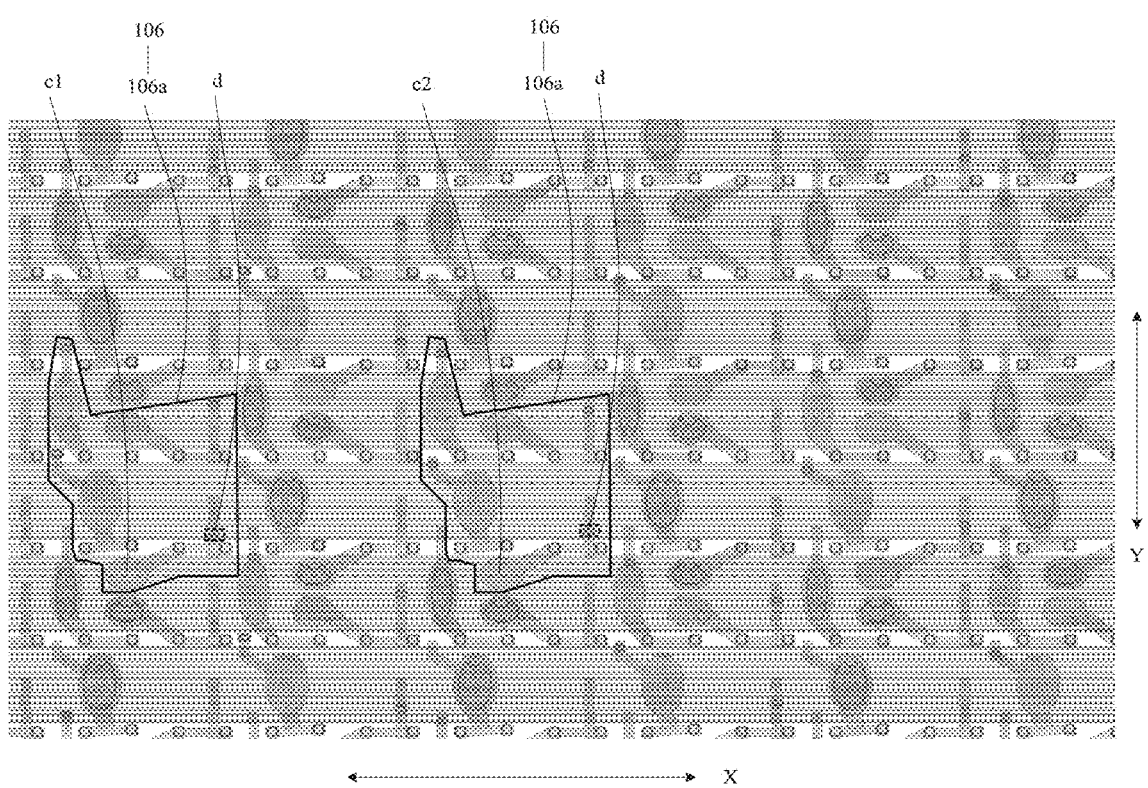
FIG. 11 is a partial schematic diagram of yet another display panel according to some embodiments of the present application.
Figure 12:
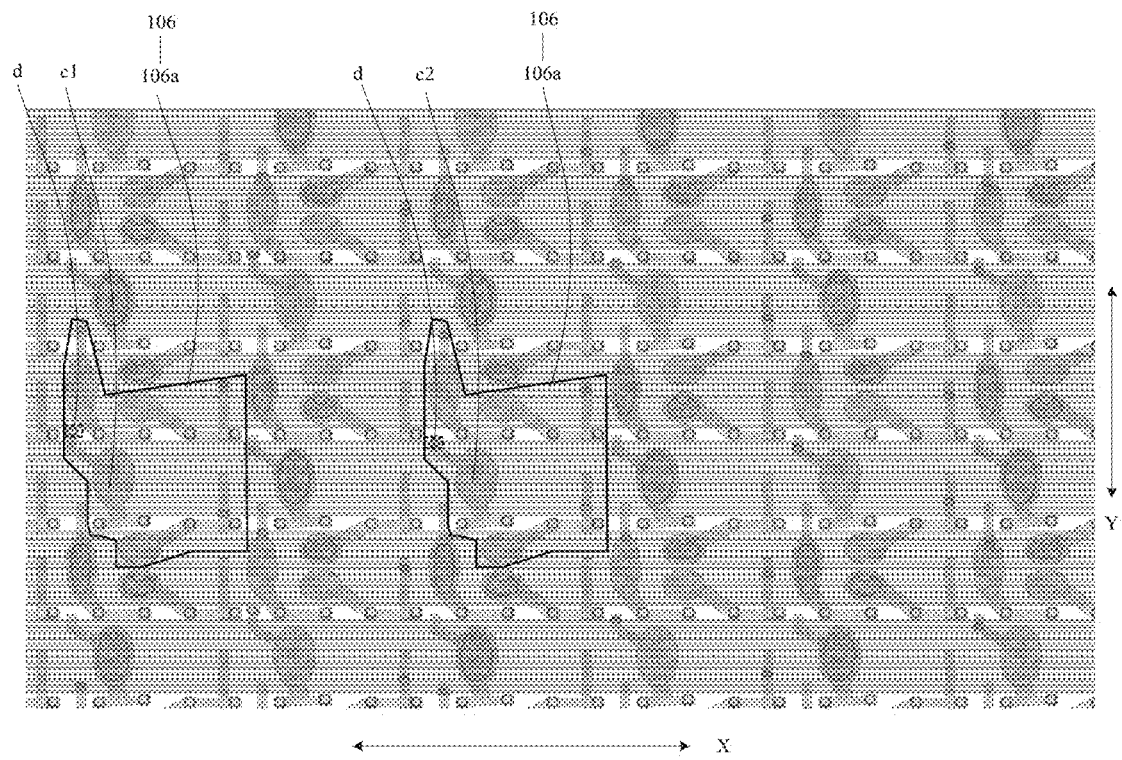
FIG. 12 is a partial schematic diagram of yet another display panel according to some embodiments of the present application.

FIG. 11 is a partial schematic diagram of yet another display panel according to some embodiments of the present application. Referring to FIG. 11, for example, the first light-emitting units 1021 corresponding to the two target dummy electrode patterns (c1 and c2) are both green in FIG. 11. FIG. 12 is a partial schematic diagram of yet another display panel according to some embodiments of the present application. Referring to FIG. 12, for example, the first light-emitting units 1021 corresponding to the two target dummy electrode patterns (c1 and c2) are both blue in FIG. 12.

Referring to FIG. 1 and FIG. 4, the substrate 101 may further include a third display region 101c and a peripheral region 101d located on a same side as the first display regions 101a and the second display region 101b.

Optionally, referring to FIG. 4, the substrate 101 includes two first display regions 101a. The first display regions 101a and the second display region 101b are rectangular. The two first display regions 101a are respectively located on two sides of the second display region 101b. The two first display regions 101a and the second display region 101b are arranged in the row direction X.

For example, the first display regions 101a and the second display region 101b are located at an edge of a display region. The first display regions 101a, the second display region 101b, and the third display region 101c are collectively referred to as the display region. Edges, distal from the third display region 101c, of the first display regions 101a and the second display region 101b border the peripheral region 101d. One edge of the second display region 101b (which is rectangular) extending in the row direction X borders the third display region 101c, and the other edge extending in the row direction X borders the peripheral region 101d. Two edges of the second display region 101b extending in the column direction Y border the two first display regions 101a, respectively.

Optionally, a length of any edge of the first display regions 101a ranges from 0.1 mm to 20 mm. A length of any edge of the second display region 101b ranges from 0.2 mm to 10 mm. In addition, shapes and sizes of the two first display regions 101a included in the substrate 101 may be the same or different. This is not limited in the embodiments of the present application.

Referring to FIG. 1, the display panel 10 may further include a plurality of third light-emitting unit groups 109 and a plurality of third pixel circuit groups 110 in the third display region 101c. Each of the third pixel circuit groups 110 is connected to one of the third light-emitting unit groups 109 to provide a drive signal for the third light-emitting unit group 109 to drive the third light-emitting unit group 109 to emit light.

Optionally, density of the plurality of third light-emitting unit groups 109 is higher than density of the plurality of first light-emitting unit groups 102 and density of the plurality of second light-emitting unit groups 104. When the density (namely, pixels per inch (PPI)) of the second light-emitting unit groups 104 in the under-screen photographing region (the central region 101b1 of the second display region 101b) is lower than the density of the third light-emitting unit groups 109 in a normal display region (the third display region 101c), the camera may be disposed below a low pixel density region that can allow more light to pass through. That the density of the plurality of third light-emitting unit groups 109 is higher than the density of the plurality of first light-emitting unit groups 102 and the density of the plurality of second light-emitting unit groups 104 means that a quantity of third light-emitting unit groups is greater than a quantity of second light-emitting unit groups and a quantity of first light-emitting unit groups in a same area.

In this embodiment of the present application, the third display region 101c is a main display region and has a relatively high PPI. In other words, the third light-emitting unit groups 109 with relatively high density and used for display are arranged in the third display region 101c. Each third light-emitting unit group 109 corresponds to one of the third pixel circuit groups 110, and the corresponding third pixel circuit group 110 drives each third light-emitting unit group 109 to emit light. The second display region 101b may allow light emitted from a display side of the display panel to pass through the display panel to reach a back side of the display panel such that a sensor or the like on the back side of the display panel normally works. The embodiments of the present application are not limited thereto. For example, the second display region 101b may also allow light emitted from the back side of the display panel to reach the display side of the display panel through the display panel. The first display regions 101a and the second display region 101b also include a plurality of light-emitting unit groups for display.

However, as the pixel circuit group that drives the light-emitting unit group to emit light is generally opaque, the light-emitting unit group in the second display region 101b and the pixel circuit group that drives the light-emitting unit group may be physically separated to improve the transmittance of the central region 101b1 of the second display region 101b. For example, the second pixel circuit group 105 connected to the light-emitting unit group in the second display region 101b (for example, the second light-emitting unit group 104 shown in a block in the second display region 101b in FIG. 1) may be disposed in the first display region 101a. In other words, the second pixel circuit groups 105 occupy a part of space of the first display region 101a. In addition, the remaining space of the first display region 101a is used to dispose the first light-emitting unit groups 102 and the first pixel circuit groups 103 in the first display region 101a. For example, each dot-filled square block in the first display regions 101a in FIG. 1 represents one pixel (one pixel includes one first light-emitting unit group 102 and one first pixel circuit group 103). In this case, pixels in the first display regions 101a and the second pixel circuit groups 105 connected to the second light-emitting unit groups 104 in the second display region 101b are arranged in an array in the first display region 101a. Therefore, resolutions of the first display regions 101a and the second display region 101b are lower than a resolution of the third display region 101c. In other words, a PPI of the third display region 101c is higher than the PPI of the first display regions 101a and the second display region 101b.

Figure 13:
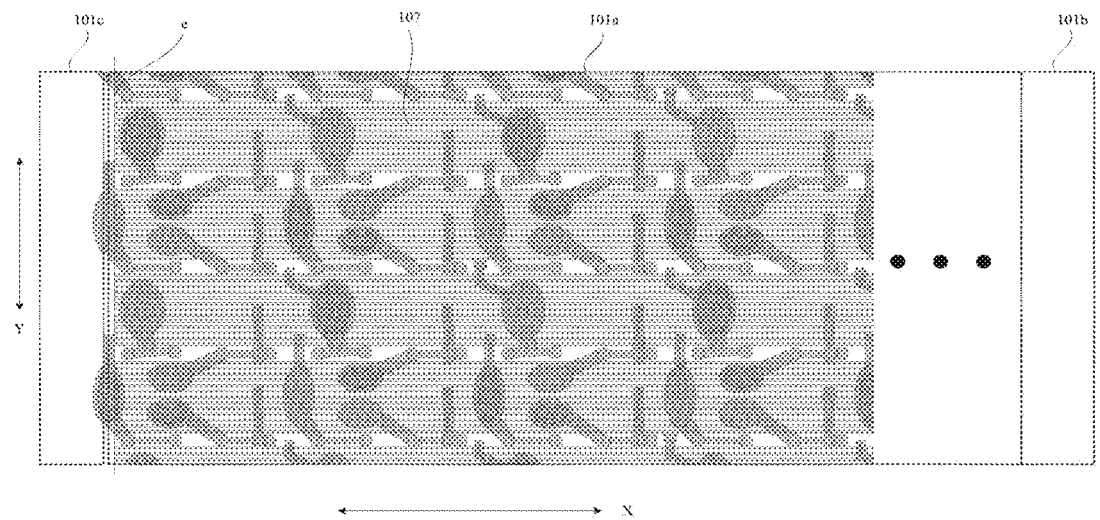
FIG. 13 is a partial schematic diagram of yet another display panel according to some embodiments of the present application.

FIG. 13 is a partial schematic diagram of yet another display panel according to some embodiments of the present application. Referring to FIG. 13, a connection line e of the other ends of the plurality of first connection traces 107 may be parallel to an edge, distal from the second display region 101b, of the first display region 101a, and a distance between the connection line e of the other ends of the plurality of first connection traces 107 and the edge, distal from the second display region 101b, of the first display region 101 may be less than a distance threshold.

The other ends of the first connection traces 107 may be distal from one end of the second display region 101b. The distance between the connection line e of the other ends of the plurality of first connection traces 107 and the edge, distal from the second display area 101b, of the first display region 101a is designed to be small such that the first connection traces 107 can exist everywhere in the first display region 101a. Therefore, an overlapping capacitance everywhere in the first display region 101a can be uniform to ensure the uniform display effect of the first display region 101a.

Optionally, the connection line e of the other ends of the plurality of first connection traces 107 and the edge, distal from the second display area 101b, of the first display region 101a may both be approximately parallel to the column direction Y. The connection line e of the other ends of the plurality of first connection traces 107 may be collinear with the edge, distal from the second display region 101b, of the first display region 101a.

In this embodiment of the present application, as there is a small quantity of first light-emitting units 1021 that can emit light in the first display regions 101a and a large quantity of third light-emitting units 1091 that can emit light in the third display region 101c, display luminance of the first display region 101a may be lower than display luminance of the third display region 101c. Therefore, to improve the display luminance of the first display region 101a, each first light-emitting unit 1021 may be driven by at least two pixel circuits to improve the luminance of the first light-emitting unit 1021 and ensure consistency between display effects of the first display region 101a and the third display region 101c.

For example, each of the first pixel circuit groups 103 includes a plurality of first pixel circuit units, each including at least a first pixel circuit and a second pixel circuit. The at least two pixel circuits in each of the first pixel circuit units are configured to be electrically connected to the first electrode a1 in the first light-emitting unit 1021 in the first light-emitting unit group 102.

Figure 14:
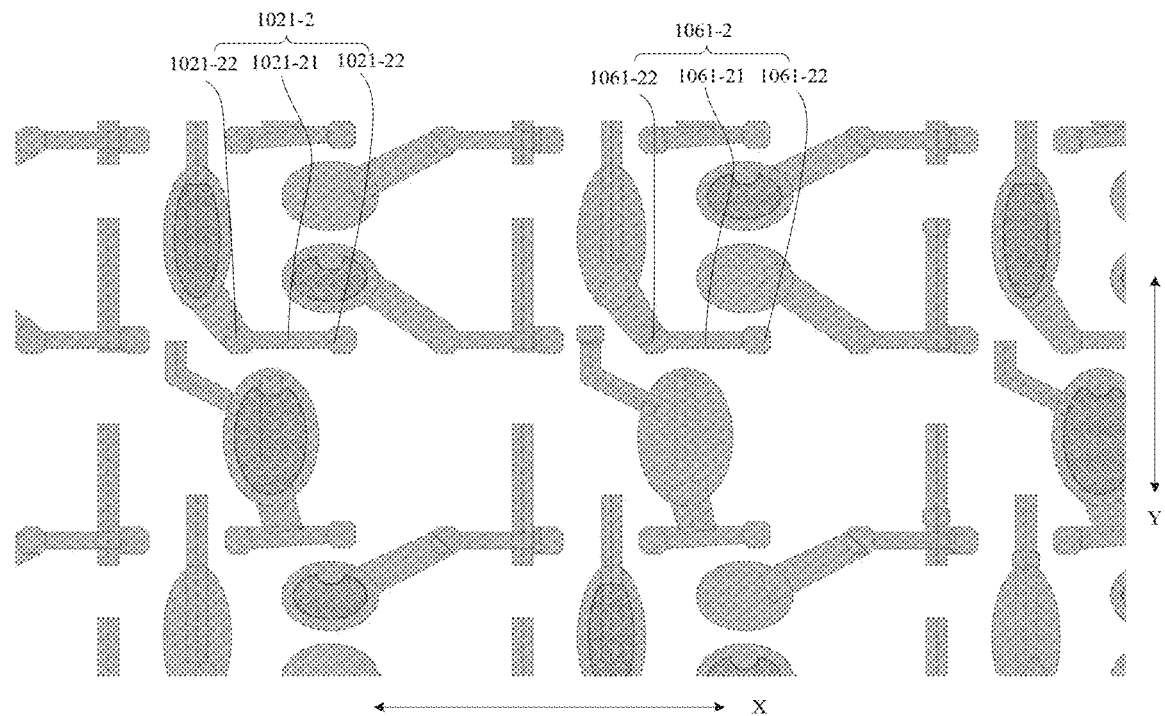
FIG. 14 is a partial schematic diagram of yet another display panel according to some embodiments of the present application.

Referring to FIG. 14, the first connection pattern 1021-2 of the first electrode a1 in the first light-emitting unit 1021 may include a first body connection portion 1021-21 extending in a target direction and two first end portions 1021-22 located at both ends of the first body connection portion 1021-21. The target direction may be approximately parallel to the row direction X, and the two first end portions 1021-22 may be connected to the first pixel circuit and the second pixel circuit, respectively.

Optionally, as the extension direction of the plurality of first connection traces 107 is the row direction X, an extension direction (target direction) of the first body connection portion 1021-21 in the first connection pattern 1021-2 is generally approximately parallel to the row direction X to ensure that the orthographic projection of the first connection pattern 1021-2 onto the substrate 101 is not overlapped with the orthographic projections of the plurality of first connection traces 107 onto the substrate 101.

In this embodiment of the present application, to ensure the transmittance of the second display region 101b, the second display region 101b is generally provided with a small quantity of second light-emitting units. Therefore, display luminance of the second display region 101b may be lower than the display luminance of the third display region 101c. Therefore, to improve the display luminance of the second display region 101b, each second light-emitting unit may be driven by at least two pixel circuits to improve the luminance of the second light-emitting unit and ensure the display effect of the second display region 101b.

For example, each of the second pixel circuit groups 105 includes a plurality of second pixel circuit units, each including at least a third pixel circuit and a fourth pixel circuit. The at least two pixel circuits in each of the second pixel circuit units are configured to be electrically connected to a same dummy electrode pattern 1061. Each dummy electrode pattern 1061 is connected to a first electrode a1 in one of the second light-emitting units such that the two pixel circuits are connected to the first electrode a1 in the same second light-emitting unit.

Referring to FIG. 14, the second connection pattern 1061-2 included in the first electrode a1 in the second light-emitting unit may include a second body connection portion 1061-21 extending in a target direction and two second end portions 1061-22 located at both ends of the second body connection portion 1061-21. The target direction may be approximately parallel to the row direction X, and the two second end portions 1061-22 may be connected to the third pixel circuit and the fourth pixel circuit, respectively.

Optionally, as the extension direction of the plurality of first connection traces 107 is the row direction X, an extension direction (target direction) of the second body connection portion 1061-21 in the second connection pattern 1061-2 is generally approximately parallel to the row direction X to ensure that the orthographic projection of the second connection pattern 1061-2 onto the substrate 101 does not overlap the orthographic projections of the plurality of first connection traces 107 onto the substrate 101.

In the embodiments of the present application, "approximately" means that an error range within 15% may be allowed. For example, "approximately parallel" may mean that an included angle is between 0 degrees and 30 degrees, 0 degrees and 10 degrees, 0 degrees and 15 degrees, or the like.

In this embodiment of the present application, the first pixel circuit unit and the second pixel circuit unit may have a same structure and may both be referred to as a pixel circuit pair f. For convenience in the following description, the two pixel circuits included in each of the first pixel circuit unit and the second pixel circuit unit may be referred to as the first pixel circuit and the second pixel circuit. In other words, for convenience of description, the third pixel circuit included in the second pixel circuit unit may be referred to as the first pixel circuit, and the fourth pixel circuit included in the second pixel circuit unit may be referred to as the second pixel circuit.

Figure 15:
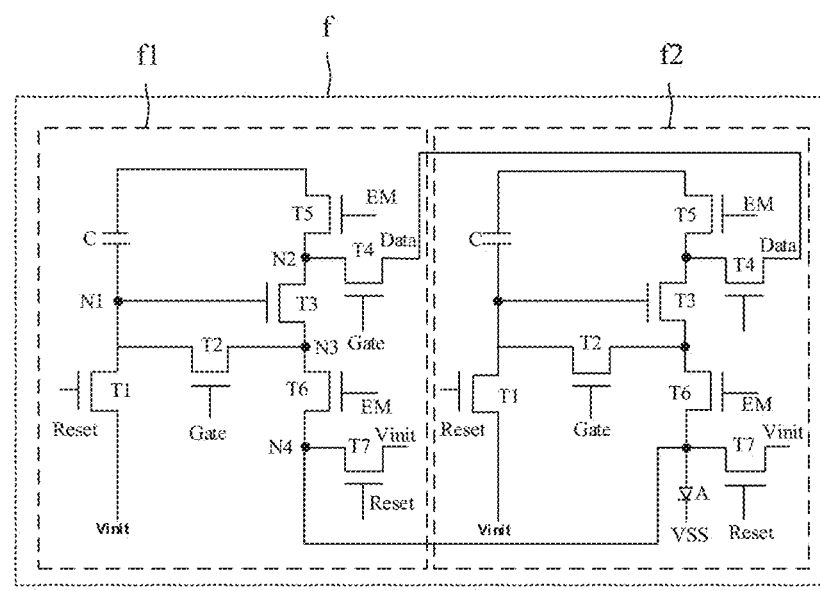
FIG. 15 is an equivalent circuit diagram of a first pixel circuit group or a second pixel circuit group according to some embodiments of the present application.

FIG. 15 is an equivalent circuit diagram of a first pixel circuit group or a second pixel circuit group according to some embodiments of the present application. Referring to FIG. 15, the first pixel circuit group 103 includes the plurality of first pixel circuit units. The second pixel circuit group 105 includes the plurality of second pixel circuit units. In addition, at least two pixel circuits in the first pixel circuit unit are configured to be electrically connected to the first electrode a1 in the first light-emitting unit 1021 in the first light-emitting unit group 102. At least two pixel circuits in the second pixel circuit unit are configured to be electrically connected to a same dummy electrode pattern 1061.

Referring to FIG. 15, the first pixel circuit unit and the second pixel circuit unit may each include two pixel circuits, and the first pixel circuit unit and the second pixel circuit unit may both be referred to as the pixel circuit pair f. This embodiment of the present application shows that the first pixel circuit unit includes two pixel circuits, but is not limited thereto, and the first pixel circuit unit may include three or more pixel circuits. For example, the first light-emitting unit group 102 includes the plurality of first light-emitting units 1021, the first pixel circuit group 103 includes a plurality of pixel circuit pairs f, and each pixel circuit pair f in the first pixel circuit group 103 is configured to be connected to the first electrode a1 in one of the first light-emitting units 1021 to drive the first light-emitting unit 1021 to emit light. The second light-emitting unit group 104 includes the plurality of second light-emitting units 1041, the second pixel circuit group 105 may include a plurality of pixel circuit pairs f, and each pixel circuit pair f in the second pixel circuit group 105 is configured to be electrically connected to a same dummy electrode pattern 1061 to drive one of the second light-emitting units 1041 to emit light.

Optionally, the display panel 10 further includes a reset power signal line, a data line, a scan signal line, a power signal line, a reset control signal line, and a light-emitting control signal line on the substrate.

An orthographic projection of at least a part of at least one target data line in the second display region 101*b* in the plurality of data lines included in the display panel 10 onto the substrate 101 is located in a region, proximal to the first display region 101*a*, of the second display region 101*b*.

As shown in FIG. 15, pixel circuits (a first pixel circuit f1 and a second pixel circuit f2) each include a data write transistor T4, a drive transistor T3, a threshold compensation transistor T2, and a first reset control transistor T7. A first electrode of the threshold compensation transistor T2 is connected to a first electrode of the drive transistor T3. A second electrode of the threshold compensation transistor T2 is connected to a gate of the drive transistor T3. A first electrode of the first reset control transistor T7 is connected to the reset power signal line to receive a reset signal Vinit. A second electrode of the first reset control transistor T7 is connected to a light-emitting unit. A first electrode of the data write transistor T4 is connected to a second electrode of the drive transistor T3. For example, as shown in FIG. 15, the pixel circuits in each pixel circuit unit each further include a storage capacitor C, a first light-emitting control transistor T6, a second light-emitting control transistor T5, and a second reset control transistor T1. A gate of the data write transistor T4 is electrically connected to a scan signal line to receive a scan signal Gate. A first electrode of the storage capacitor C is electrically connected to the power signal line. A second electrode of the storage capacitor C is electrically connected to the gate of the drive transistor T3. A gate of the threshold compensation transistor T2 is electrically connected to a scan signal line to receive a compensation control signal. A gate of the first reset control transistor T7 is electrically connected to a reset control signal line to receive a reset control signal Reset. A first electrode of the second reset control transistor T1 is electrically connected to the reset power signal line to receive a reset signal Vinit. A second electrode of the second reset control transistor T1 is electrically connected to the gate of the drive transistor T3. A gate of the second reset control transistor T1 is electrically connected to a reset control signal line to receive a reset control signal Reset. A gate of the first light-emitting control transistor T6 is electrically connected to a light-emitting control signal line to receive a light-emitting control signal EM. A first electrode of the second light-emitting control transistor T5 is electrically connected to the power signal line. A second electrode of the second light-emitting control transistor T5 is electrically connected to the second electrode of the drive transistor T3. A gate of the second light-emitting control transistor T5 is electrically connected to a light-emitting control signal line to receive a light-emitting control signal EM. The power signal line is a signal line that outputs a voltage signal VDD and may be connected to a voltage source to output a constant voltage signal, such as a positive voltage signal.

Optionally, the scan signal and the compensation control signal may be the same. In other words, the gate of the data write transistor T4 and the gate of the threshold compensation transistor T2 may be electrically connected to the same signal line to receive the same signal, thereby reducing a quantity of signal lines. For example, the gate of the data write transistor T4 and the gate of the threshold compensation transistor T2 may be electrically connected to different signal lines, that is, the gate of the data write transistor T4 is electrically connected to a first scan signal line, and the gate of the threshold compensation transistor T2 is electrically connected to a second scan signal line. Signals transmitted over the first scan signal line and the second scan signal line may be the same or different. In this way, the gate of the data write transistor T4 and the gate of the threshold compensation transistor T2 can be separately controlled to increase flexibility of controlling the pixel circuit.

Optionally, the light-emitting control signals input to the first light-emitting control transistor T6 and the second light-emitting control transistor T5 may be the same, that is, the gate of the first light-emitting control transistor T6 and the gate of the second light-emitting control transistor T5 may be electrically connected to the same signal line to receive the same signal, thereby reducing the quantity of signal lines. The gate of the first light-emitting control transistor T6 and the gate of the second light-emitting control transistor T5 may be electrically connected to different light-emitting control signal lines. Signals transmitted over the different light-emitting control signal lines may be the same or different.

Optionally, the reset control signals input to the first reset control transistor T7 and the second reset control transistor T1 may be the same, that is, the gate of the first reset control transistor T7 and the gate of the second reset control transistor T1 may be electrically connected to the same signal line to receive the same signal, thereby reducing the quantity of signal lines. For example, the gate of the first reset control transistor T7 and the gate of the second reset control transistor T1 may be electrically connected to different reset control signal lines. In this case, signals transmitted over the different reset control signal lines may be the same or different.

For example, as shown in FIG. 15, when the display panel 10 works, in a first stage of image display, the second reset control transistor T1 is turned on to initialize a voltage of a node N1; in a second stage, a same data signal Data is stored in two nodes N1 of two pixel circuits through two connected data write transistors T4, and two drive transistors T3 and two threshold compensation transistors T2 respectively connected to the two connected data write transistors T4; in a third light-emitting stage, the second light-emitting control transistors T5, the drive transistors T3, and the first light-emitting control transistors T6 in the two pixel circuits (namely, the pixel circuit pair f composed of the first pixel circuit f1 and the second pixel circuit f2) are all turned on to transmit the same data signal to two nodes N4, and in this case, the nodes N4 of the two pixel circuits are connected to drive a same light-emitting unit A to emit light. In this way, a current and luminance can be increased. The light-emitting unit A may be a first light-emitting unit 1021 in the first light-emitting unit group 102 in the first display region 101*a* or a second light-emitting unit 1041 in the second light-emitting unit group 104 in the second display region 101*b*.

It should be noted that in this embodiment of the present application, in addition to a 7T1C (namely, seven transistors and one capacitor) structure shown in FIG. 15, the pixel circuit in the pixel circuit unit may alternatively have a structure including another quantity of transistors, such as a 7T2C structure, a 6T1C structure, a 6T2C structure, or a 9T2C structure, which is not limited in the embodiments of the present application, provided that the data write transistors T4 of the two pixel circuits are connected, and the nodes N4 of the two pixel circuits are connected to drive the same light-emitting unit to emit light.

Figure 16:
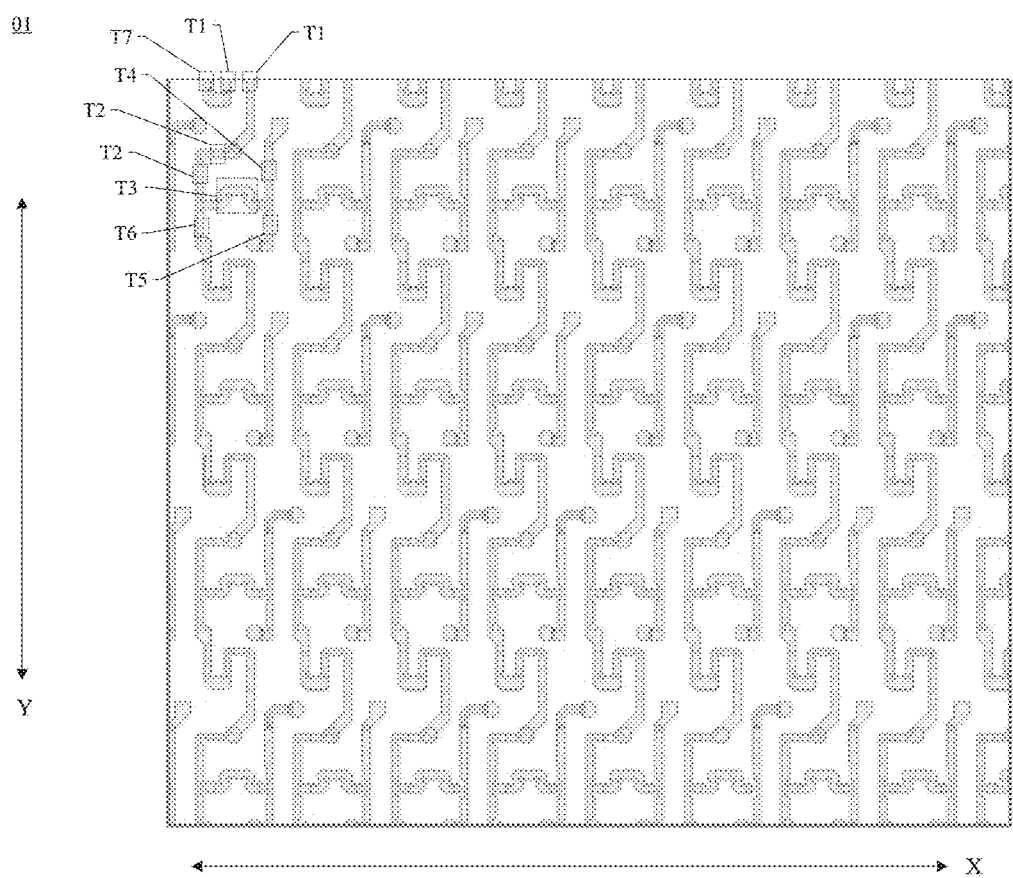
FIG. 16 is a schematic diagram of a partial planar structure of an active semiconductor layer of a pixel circuit in a first display region according to some embodiments of the present application.

FIG. 16 is a schematic diagram of a partial planar structure of an active semiconductor layer of a pixel circuit in a first display region according to some embodiments of the present application. As shown in FIG. 16, an active semiconductor layer 01 may be patterned through a semiconductor material. The active semiconductor layer 01 may be used to manufacture active layers of the foregoing second reset control transistor T1, threshold compensation transistor T2, drive transistor T3, data write transistor T4, second light-emitting control transistor T5, first light-emitting control transistor T6, and first reset control transistor T7. The active semiconductor layer 01 includes an active layer pattern (channel region) and a doped region pattern (source-drain doped region) of each transistor in each pixel unit, and the active layer pattern and the doped region pattern of each transistor in a same pixel circuit are integrally disposed.

It should be noted that the active layer may include an integrally formed low-temperature polycrystalline silicon layer, and a source region and a drain region may be conductive through doping or the like to implement electrical connections of various structures. In other words, the active semiconductor layer 01 of each transistor in each subpixel is an overall pattern formed by p-silicon, and each transistor in the same pixel circuit includes the doped region pattern (namely, the source region and drain region) and the active layer pattern. Active layers of different transistors are separated by a doped structure.

For example, the active semiconductor layer 01 may be made of amorphous silicon, polycrystalline silicon, an oxide semiconductor material, or the like. It should be noted that the source and drain regions may be doped with n-type impurities or p-type impurities.

Figure 17:
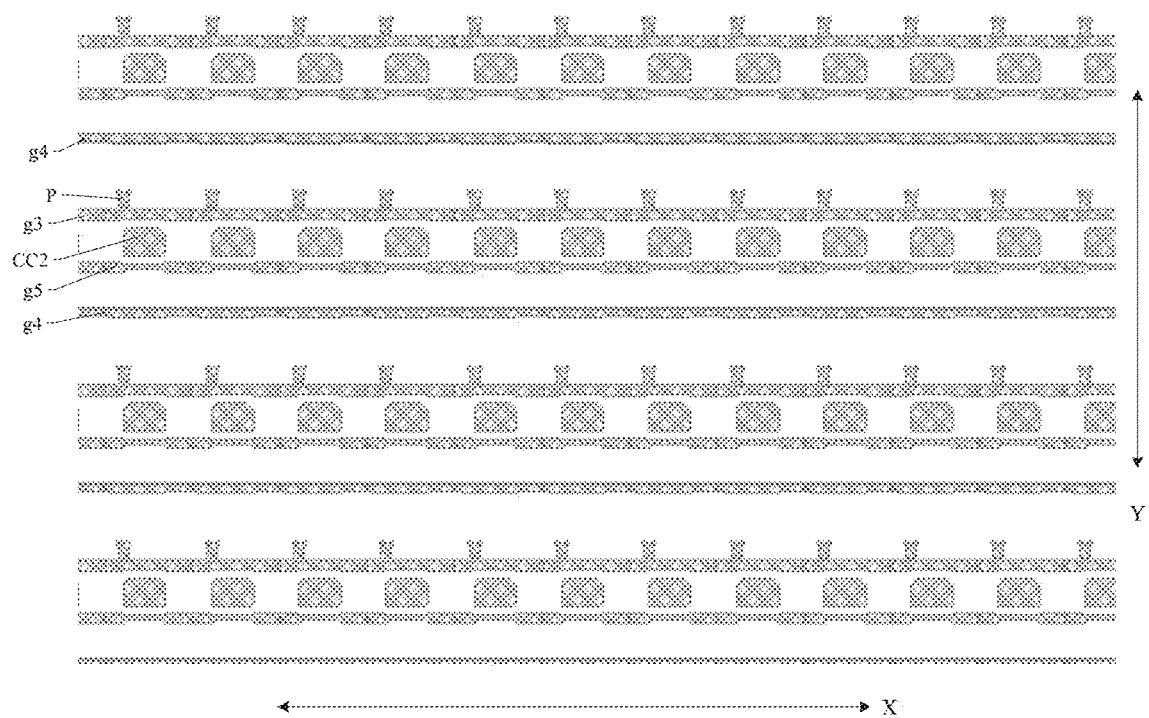
FIG. 17 is a schematic diagram of a first conductive layer in a first display region according to some embodiments of the present application.
Figure 18:
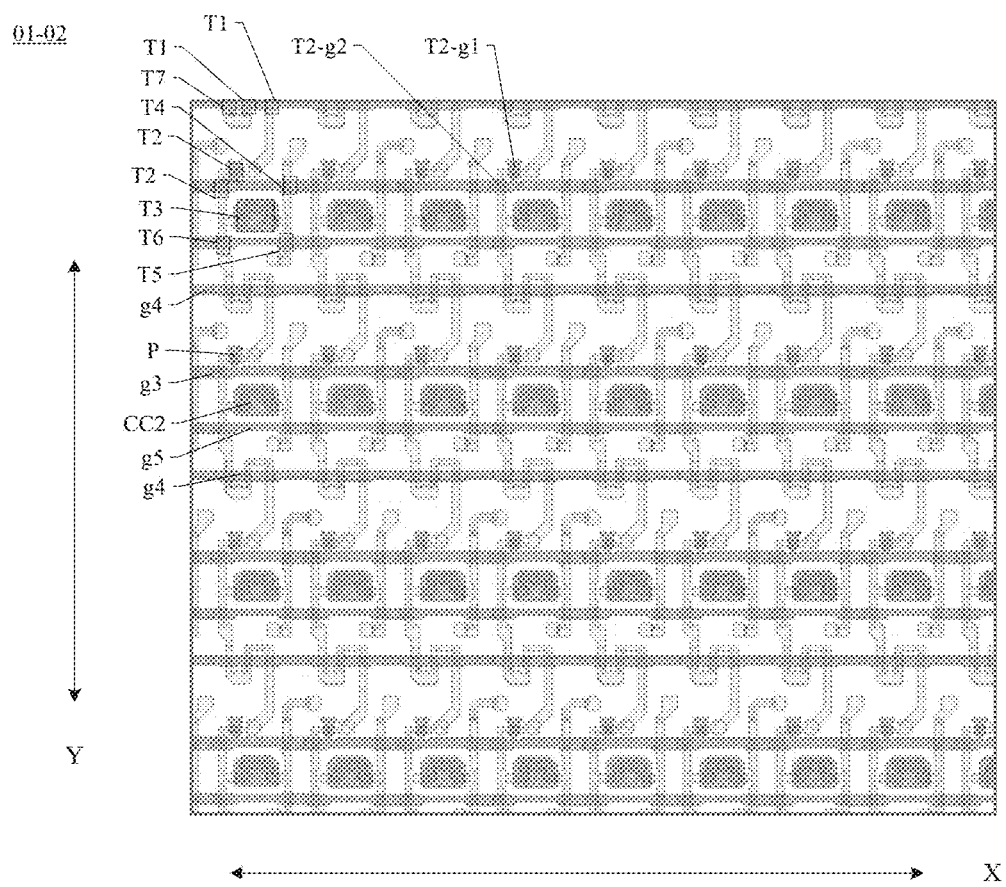
FIG. 18 is a schematic diagram of an active semiconductor layer and a first conductive layer that are laminated in a first display region according to some embodiments of the present application.

FIG. 17 is a schematic diagram of a first conductive layer in a first display region according to some embodiments of the present application. FIG. 18 is a schematic diagram of an active semiconductor layer and a first conductive layer that are laminated in a first display region according to some embodiments of the present application. A display panel includes a gate insulation layer on a side, distal from a substrate, of the active semiconductor layer 01, configured to insulate the active semiconductor layer 01 from a subsequently formed first conductive layer 02 (namely, a gate metal layer). FIG. 18 shows that the display substrate includes the first conductive layer 02 disposed on the gate insulation layer to be insulated from the active semiconductor layer 01. The first conductive layer 02 may include a second electrode CC2 of a capacitor C, a plurality of scan signal lines g3 extending in the row direction X, a plurality of reset control signal lines g4, a plurality of light-emitting control signal lines g5, and gates of a second reset control transistor T1, a threshold compensation transistor T2, a drive transistor T3, a data write transistor T4, a second light-emitting control transistor T5, a first light-emitting control transistor T6, and a first reset control transistor T7.

For example, with reference to FIG. 16 to FIG. 18, the gate of the data write transistor T4 may be a portion at which the scan signal line g3 is overlapped with the active semiconductor layer 01. The gate of the first light-emitting control transistor T6 may be a first portion at which the light-emitting control signal line g5 is overlapped with the active semiconductor layer 01. The gate of the second light-emitting control transistor T5 may be a second portion at which the light-emitting control signal line g5 is overlapped with the active semiconductor layer 01. The gate of the second reset control transistor T1 is a first portion at which the reset control signal line g4 is overlapped with the active semiconductor layer 01. The gate of the first reset control transistor T7 is a second portion at which the reset control signal line g4 is overlapped with the active semiconductor layer 01. The threshold compensation transistor T2 may be a dual-gate thin film transistor. A first gate of the threshold compensation transistor T2 may be a portion at which the scan signal line g3 is overlapped with the active semiconductor layer 01, and a second gate of the threshold compensation transistor T2 may be a portion at which a protrusion structure P protruding from the scan signal line g3 is overlapped with the active semiconductor layer 01. As shown in FIG. 18, a gate of the drive transistor T3 may be the second electrode CC2 of the capacitor C.

It should be noted that each dashed rectangular frame in FIG. 18 shows each portion at which the first conductive layer 02 is overlapped with the active semiconductor layer 01. Active semiconductor layers 01 on both sides of each channel region of each transistor are conductively formed as first and second electrodes of the transistor through a process such as ion doping. The source electrode and drain electrode of the transistor may be symmetrical in structure such that there may be no difference in a physical structure of the source and drain electrode. In this embodiment of the present application, to distinguish the transistors, one of the electrodes is directly described as the first electrode and the other electrode is directly described as the second electrode except for the gate serving as a control electrode. Therefore, the first electrode and the second electrode of all or at least one of the transistors in this embodiment of the present application may be interchanged as required.

As shown in FIG. 18, the scan signal line g3, the reset control signal line g4, and the light-emitting control signal line g5 are arranged in the column direction Y. The scan signal line g3 is located between the reset control signal line g4 and the light-emitting control signal line g5.

In the column direction Y, the second electrode CC2 of the capacitor C (namely, the gate of the drive transistor T3) is located between the scan signal line g3 and the light-emitting control signal line g5. The protrusion structure P protruding from the scan signal line g3 is located on a side, distal from the light-emitting control signal line g5, of the scan signal line g3.

A first insulation layer is formed on the first conductive layer 02 to insulate the first conductive layer 02 from a subsequently formed second conductive layer 03.

Figure 19:
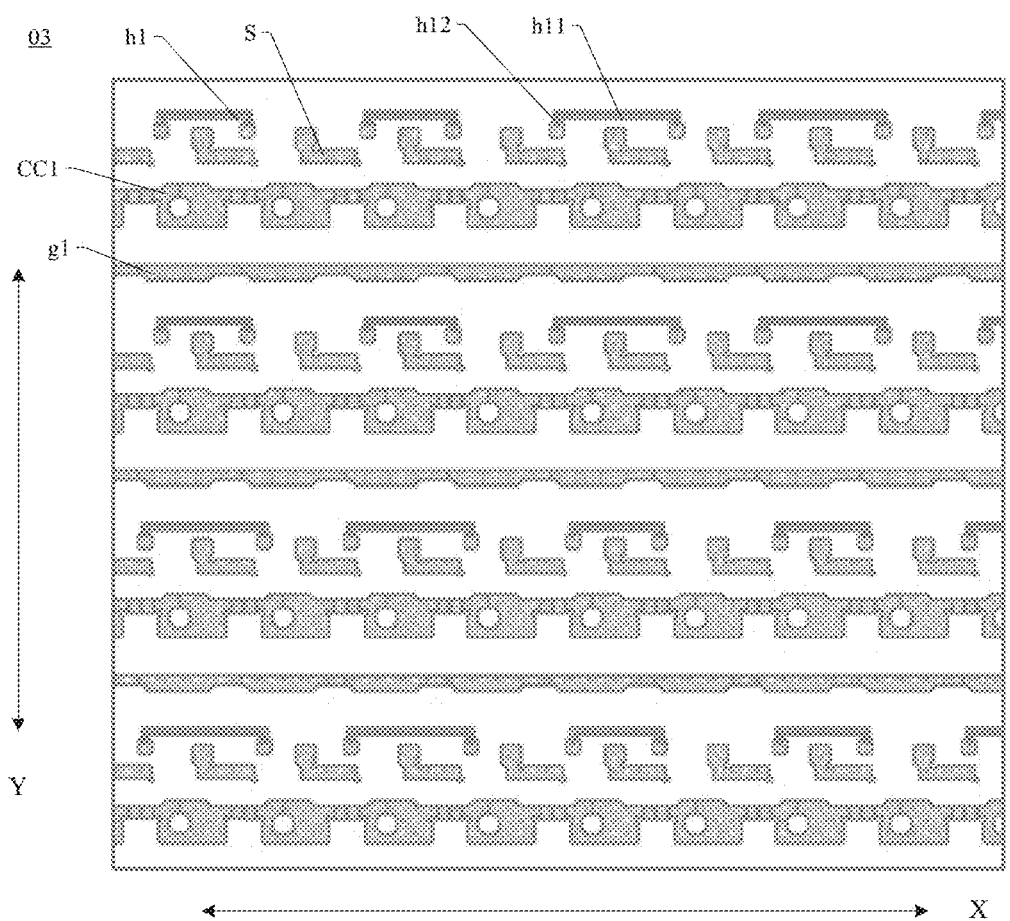
FIG. 19 is a schematic diagram of a partial planar structure of a second conductive layer in a first display region according to some embodiments of the present application.
Figure 20:
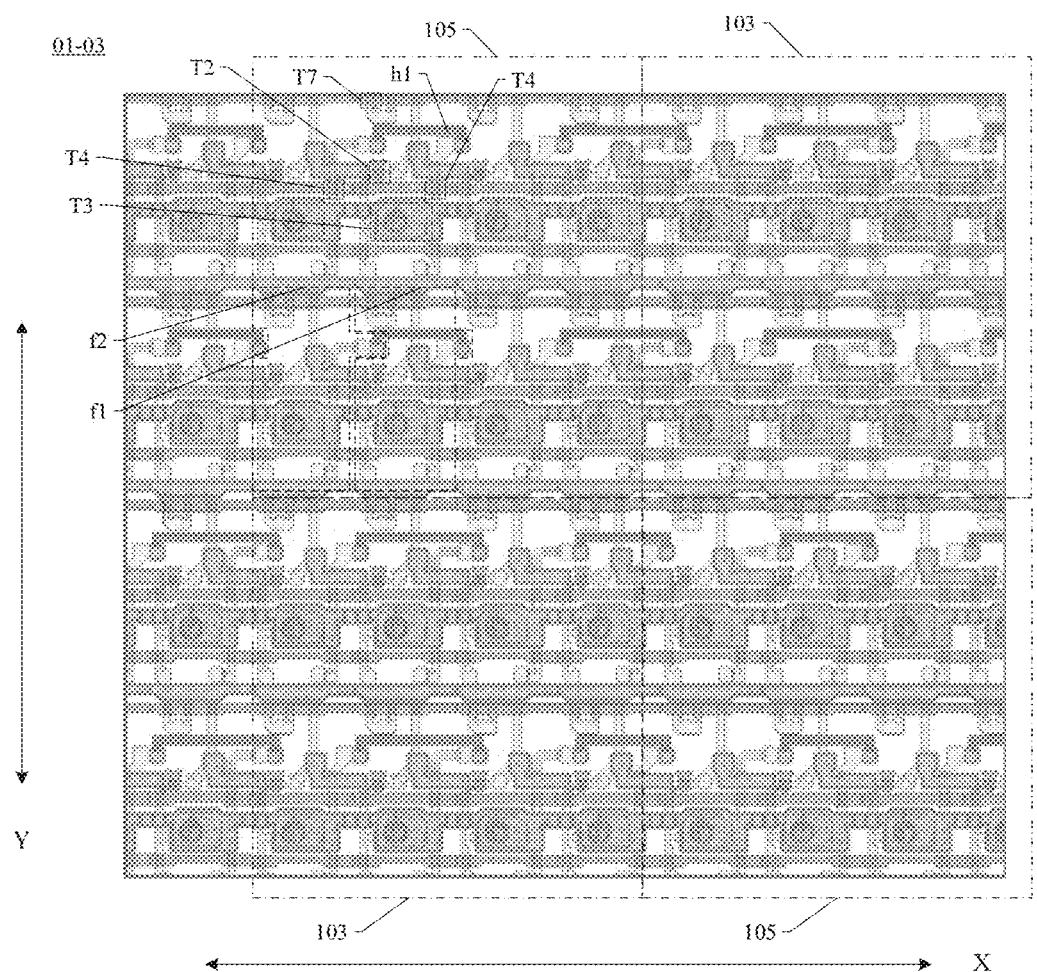
FIG. 20 is a schematic diagram of an active semiconductor layer, a first conductive layer, and a second conductive layer that are laminated in a first display region according to some embodiments of the present application.

FIG. 19 is a schematic diagram of a partial planar structure of a second conductive layer in a first display region according to some embodiments of the present application. FIG. 20 is a schematic diagram of an active semiconductor layer, a first conductive layer, and a second conductive layer that are laminated in a first display region according to some embodiments of the present application. As shown in FIG. 19 and FIG. 20, the second conductive layer 03 includes a first electrode CC1 of the capacitor C and a plurality of reset power signal lines g1 extending in the row direction X. The first electrode CC1 of the capacitor C is at least partially overlapped with the second electrode CC2 of the capacitor C to form the capacitor C. The second conductive layer 03 may be a gate metal layer.

Referring to FIG. 19 and FIG. 20, the display panel 10 provided in the embodiments of the present application further includes a plurality of first connection portions h1. A first end of at least one of the first connection portions h1 is connected to a second electrode of the data write transistor T4 of the first pixel circuit f1 in the first pixel circuit unit (for example, the first end of the first connection portion h1 may be directly connected to the second electrode of the data write transistor T4 of the first pixel circuit f1 in the first pixel circuit unit or electrically connected to the second electrode of the data write transistor T4 of the first pixel circuit f1 in the first pixel circuit unit through a conductive transfer layer). A second end of the first connection portion h1 is connected to a second electrode of the data write transistor T4 of the second pixel circuit f2 in the first pixel circuit unit. In this way, at least two data write transistors T4 of the first pixel circuit unit are connected to the same data line, and in the column direction, at least one of the first connection portions h1 is located between the second electrode of the data write transistor T4 in the first pixel circuit f1 and the first electrode of the first reset control transistor T7.

In this embodiment of the present application, the second electrodes of the data write transistors of at least two pixel circuits in the first display region 101a are connected through the first connection portion h1 to drive one light-emitting unit A to emit light such that the current and luminance of the light-emitting unit in the first display region 101a can be increased. For example, the current and luminance of the first light-emitting unit 1021 in the first display region 101a can be increased to 1.8 to 2 times those in the case of using one pixel circuit, to resolve a problem that the current and luminance in the first display region 101a are smaller and achieve a more uniform visual display effect of an overall screen.

Optionally, the first end of at least one of the first connection portion h1 is connected to a second electrode of the data write transistor T4 of the third pixel circuit in the second pixel circuit unit, and the second end of the first connection portion h1 is connected to the second electrode of the data write transistor T4 of the fourth pixel circuit in the second pixel circuit unit such that at least two data write transistors T4 of the second pixel circuit unit are connected to the same data line. In addition, in the column direction Y, the first connection portion h1 is located between the second electrode of the data write transistor T2 and the first electrode of the first reset control transistor T7 in the third pixel circuit. To facilitate subsequent description, the first pixel circuit unit and the second pixel circuit unit in the embodiments of the present application each are referred to as a pixel circuit pair f, the two pixel circuits included in each pixel circuit unit are referred to as the first pixel circuit and the second pixel circuit, the third pixel circuit in the second pixel circuit unit may be referred to as the first pixel circuit, and the fourth pixel circuit in the second pixel circuit unit may be referred to as the second pixel circuit.

Optionally, in the column direction Y, the first connection h1 is located between the second electrode of the threshold compensation transistor T3 and the first electrode of the first reset control transistor T7 in the first pixel circuit f1.

Optionally, the first connection portion h1 is disposed on a same layer as the reset power signal line g1.

Optionally, a second insulation layer is formed on the second conductive layer 03 to insulate the second conductive layer 03 from a subsequently formed source-drain metal layer 04.

Figure 21:
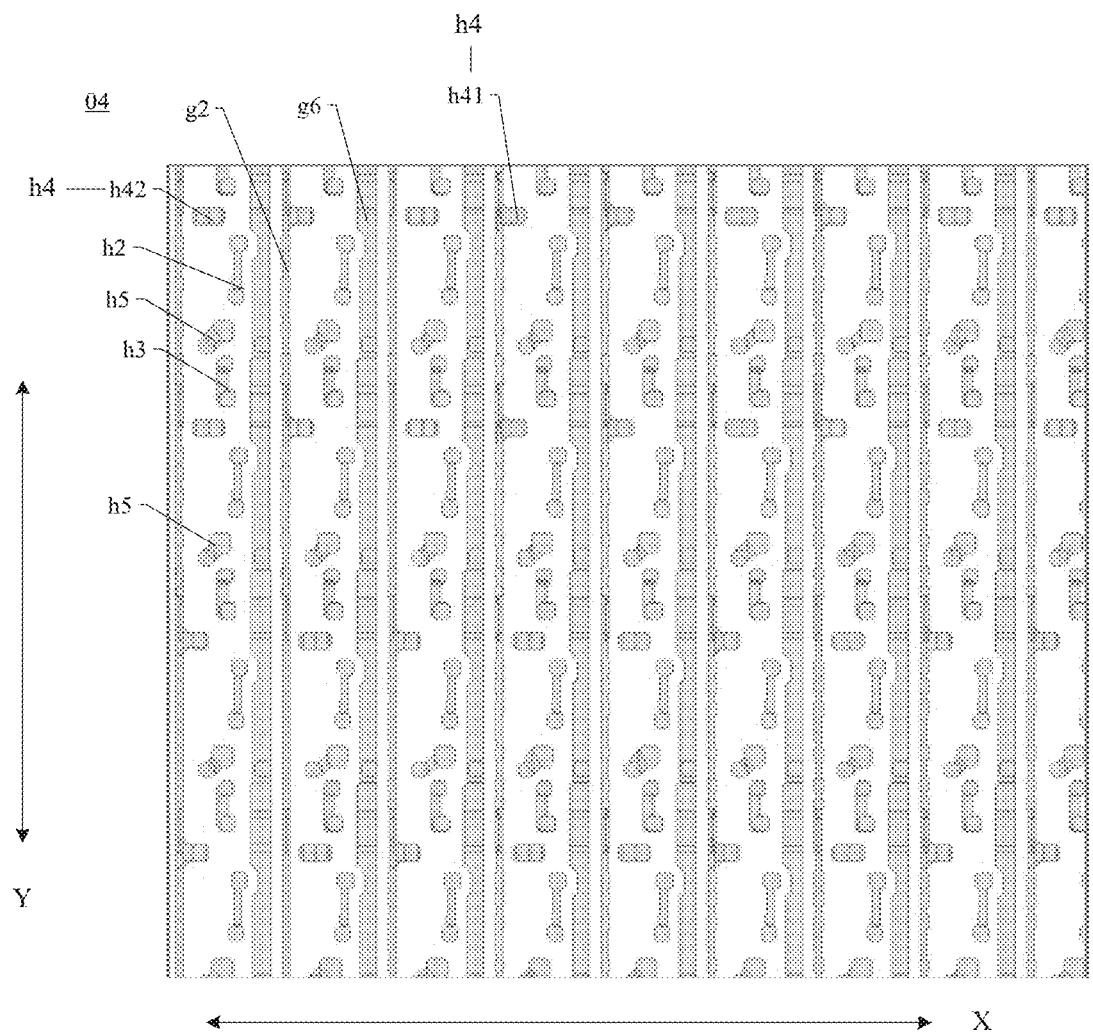
FIG. 21 is a schematic diagram of a partial planar structure of a source-drain metal layer in a first display region according to some embodiments of the present application.
Figure 22:
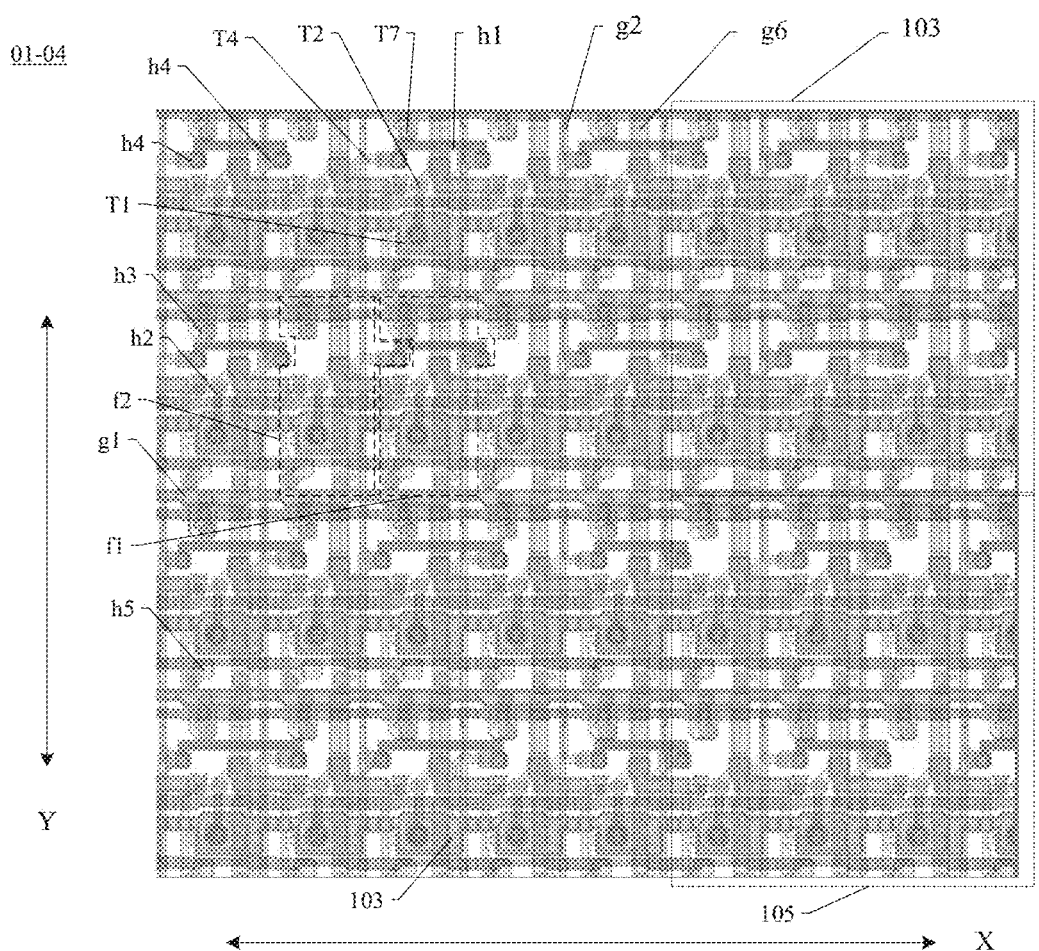
FIG. 22 is a schematic diagram of an active semiconductor layer, a first conductive layer, a second conductive layer, and a source-drain metal layer that are laminated in a first display region according to some embodiments of the present application.

FIG. 21 is a schematic diagram of a partial planar structure of a source-drain metal layer in a first display region according to some embodiments of the present application. FIG. 22 is a schematic diagram of an active semiconductor layer, a first conductive layer, a second conductive layer, and a source-drain metal layer that are laminated in a first display region according to some embodiments of the present application. As shown in FIG. 21 and FIG. 22, the source-drain metal layer 04 includes a data line g2 and a power signal line g6 extending in the column direction Y. The data line g2 is electrically connected to the second electrode of the data write transistor T4 through a via hole penetrating the gate insulation layer, the first insulation layer, and the second insulation layer. The power signal line g6 is electrically connected to the first electrode of the second light-emitting control transistor T5 through a via hole penetrating the gate insulation layer, the first insulation layer and the second insulation layer. The power signal line g6 and the data line g2 are alternately arranged in the row direction. The power signal line g6 is electrically connected to the first electrode CC1 of the capacitor C through a via hole penetrating the second insulation layer.

In this embodiment of the present application, a third insulation layer may be disposed on a side, distal from the substrate 101, of the source-drain metal layer 04 to protect the source-drain metal layer 04.

For example, FIG. 20 to FIG. 22 schematically show some pixel circuits in the first pixel circuit group 103 and some pixel circuits in the second pixel circuit group 105. The embodiments of the present disclosure schematically show that the first pixel circuit group 103 and the second pixel circuit group 105 each include a pixel circuit pair f. The pixel circuit pair f includes a first pixel circuit f1 and a second pixel circuit f2 arranged in the row direction X, and the second electrodes of the data write transistors T4 of the two pixel circuits in each pixel circuit pair f are connected through the first connection portion h1 to drive the same light-emitting unit to emit light. The embodiments of the present application are not limited thereto. For example, only the first pixel circuit group 103 includes the pixel circuit pair f, or only the second pixel circuit group 105 includes the pixel circuit pair f.

For example, as shown in FIG. 20 to FIG. 22, the first pixel circuit group 103 and the second pixel circuit group 105 may each include eight pixel circuits arranged in two rows, namely, four pixel circuit pairs f arranged in a two-dimensional array. The third pixel circuit group does not include the pixel circuit pair f (not shown), and includes only four pixel circuits arranged in a two-dimensional array. Two adjacent pixel circuits arranged in the row direction X in the third pixel circuit group each drive a light-emitting unit to emit light, and two data write transistors in the two adjacent pixel circuits are independent from each other and are connected to different data lines. Layouts of the third pixel circuit group and the first pixel circuit group 103 in this embodiment of the present application differ mainly in whether the first connection portion h1 is disposed, and a position of the second electrode of the data write transistor connected to the first connection portion h1.

For example, as shown in FIG. 20 to FIG. 22, the display panel 10 provided in the embodiments of the present application may use a quarter high definition (QHD). However, there is a small distance in the column direction between the second electrode of the threshold compensation transistor and the first electrode of the first reset control transistor of each pixel circuit designed at this resolution, for example, less than 2 μm, such as 1.4 μm to 1.8 μm. Therefore, it is difficult to dispose, between the second electrode of the threshold compensation transistor and the first electrode of the first reset control transistor, the first connection portion h1 connecting the second electrodes (data input nodes) of the two data write transistors of the pixel circuit pair f. As a size of a pixel in a QHD product is generally smaller than a size of a pixel in a full high definition (FHD) product, in the embodiments of the present application, a QHD pixel circuit is designed into an FHD pixel pitch to increase the distance in the column direction Y between the second electrode of the threshold compensation transistor T2 and the first electrode of the first reset control transistor T7 in each pixel circuit, so as to ensure that the data input nodes of the two pixel circuits in the pixel circuit pair f are connected through the first connection portion h1 in a punched manner.

Compared with the case that a first display region in a display panel includes a plurality of light-emitting units, a plurality of pixel circuits are connected to the plurality of light-emitting units in one-to-one correspondence, and a dummy pixel circuit is not connected to any light-emitting unit is disposed between adjacent pixel circuits, in the embodiments of the present application, for example, as shown in FIG. 20 to FIG. 22, the first connection portion h1 is configured to connect the dummy pixel circuit (a pixel circuit in the second pixel circuit group 105) and a pixel circuit connected to a first light-emitting unit 1021 in the first display region 101a. An overall structure of the pixel circuit can be changed as little as possible, and the dummy pixel circuit is effectively used such that the current and luminance of the light-emitting unit in (at least one of the second display region 101b and) the first display region 101a can be increased to achieve a more uniform visual display effect of the overall screen.

Optionally, the distance in the column direction Y between the second electrode of the threshold compensation transistor T2 and the first electrode of the first reset control transistor T7 is 7 μm to 12 μm to dispose the first connection portion h1 between the second electrode of the threshold compensation transistor T2 and the first electrode of the first reset control transistor T7.

As shown in FIG. 16 to FIG. 22, each pixel circuit further includes a second connection portion h2 and a third connection portion h3 disposed on a same layer as the data line g2. The second connection portion h2 is configured to connect the second electrode of the threshold compensation transistor T2 and the gate of the drive transistor T3, and the third connection portion h3 is configured to connect the first electrode of the first reset control transistor T7 and the reset power supply signal line g1. Optionally, one end of the second connection portion h2 is electrically connected to the second electrode of the threshold compensation transistor T2 through a via hole penetrating through the gate insulation layer, the first insulation layer, and the second insulation layer, and the other end of the second connection portion h2 is electrically connected to the gate of the drive transistor T3 (namely, the second electrode CC2 of the capacitor C) through a via hole penetrating through the first insulation layer and the second insulation layer. One end of the third connection portion h3 is electrically connected to the reset power signal line g1 through a via hole penetrating the second insulation layer, and the other end of the third connection portion h3 is electrically connected to the first electrode of the first reset control transistor T7 through a via hole penetrating the gate insulation layer, the first insulation layer, and the second insulation layer.

As shown in FIG. 16 to FIG. 22, in the first pixel circuit f1, a distance in the column direction between edges of the second connection portion h2 and the third connection portion h3 that are close to each other is 7 μm to 12 μm to dispose the first connection portion h1 between the second connection portion h2 and the third connection portion h3. For example, in the first pixel circuit f1, the distance in the column direction between the edges of the second connection portion h2 and the third connection portion h3 that are close to each other may be 8 μm to 11 μm.

As shown in FIG. 16 to FIG. 22, the first connection portion h1 is located in a different layer from the data line g2, and each first connection portion h1 is overlapped with the data line g2 and the power signal line g6 in a third direction perpendicular to the substrate. For example, one data line 410 and one power signal line g6 are disposed between two data write transistors T4 included in the pixel circuit pair f, and the first connection portion h1 connecting the two data write transistors T4 is overlapped with both the data line 410 and the power signal line g6.

As shown in FIG. 16 to FIG. 22, each pixel circuit further includes a fourth connection portion h4 disposed in the same layer as the data line g2. The fourth connection portion h4 is configured to connect the first connection portion h1 and the second electrode of the data write transistor T4. There is an interval between the fourth connection portion h4 of one pixel circuit (for example, the second pixel circuit f2) in the pixel circuit pair f and the adjacent data line g2. The fourth connection portion h4 of the other pixel circuit (for example, the first pixel circuit f1) in the pixel circuit pair f is integrally connected to the data line g2 such that the pixel circuit pair f is connected to only one data line g2. "Adjacent data line" in "there is an interval between the fourth connection portion h4 and the adjacent data line g2" means that there is no other data line between the fourth connection portion h4 and the data line g2.

As shown in FIG. 1 and FIG. 16 to FIG. 22, a plurality of third pixel circuit groups 110 are disposed in an array in the row direction X and the column direction Y. A plurality of first pixel circuit groups 103 and a plurality of second pixel circuit groups 105 are alternately arranged in the row direction X, a plurality of first pixel circuit groups 103 and a plurality of second pixel circuit groups 105 are alternately arranged in the column direction Y, and the first pixel circuit groups 103 and the second pixel circuit groups 105 are connected to different data lines g2.

A straight line extending in the row direction X passes through the second electrodes of the two data write transistors in the pixel circuit pair f, and the first connection portion h1 extends in the row direction. For example, different pixel circuit groups are connected to different data lines. Therefore, lengths of first connection portions h1 in different pixel circuit groups in the row direction X may be different. For example, in one pixel circuit group, lengths of first connection portions h1 in different pixel circuit pairs f in the row direction X may be different.

As shown in FIG. 21, for example, a fourth connection portion h4 integrally connected to a data line g2 is a first subportion h41, and a fourth connection portion h4 at an interval from an adjacent data line g2 is a second subportion h42, and the second pixel circuit group 105 includes eight pixel circuits arranged in an array (four pixel circuits arranged in the row direction and two pixel circuits arranged in the column direction). In the first pixel circuit group 103, two first subportions h41 are arranged in the column direction (that is, in one column), two second subportions h42 are arranged in the column direction Y (that is, in one column), and the first subportions h41 and the second subportions h42 are alternately arranged in the row direction X. Similarly, the arrangement of the first subportions and the second subportions in the second pixel circuit group 105 is the same as the arrangement of the first subportions and the second subportions in the first pixel circuit group 103. For the first pixel circuit groups 103 and the second pixel circuit groups 105 alternately arranged in the column direction Y, the first subportions in the first pixel circuit group 103 and the second subportions in the second pixel circuit group 105 are located in different columns such that the first pixel circuit group 103 and the second pixel circuit group 105 are connected to different data lines.

As no pixel circuit pair f is designed in the third light-emitting unit 110, fourth connection portions in two adjacent pixel circuits arranged in the row direction X or the column direction in the third light-emitting unit 110 each are integrally connected to a data line such that each pixel circuit is electrically connected to a corresponding data line.

As shown in FIG. 16 to FIG. 22, the display panel 10 further includes a plurality of covering portions S disposed on a same layer as the first connection portions h1, and each threshold compensation transistor T2 includes two gates T2-g1 and T2-g2, and an active semiconductor layer 01 between the two gates. In a direction perpendicular to a bearing surface of the substrate 101, the covering portion S is overlapped with the active semiconductor layer 01 between the two gates, the data line g2, and the power signal line g6.

The active semiconductor layer 01 between two channels of the dual-gate threshold compensation transistor T2 is in a floating state when the threshold compensation transistor T2 is turned off, and is prone to voltage transition due to impact of a surrounding line voltage, thereby affecting a leakage current of the threshold compensation transistor T2 and further affecting light-emitting luminance. To keep the voltage of the active semiconductor layer 01 between the two channels of the threshold compensation transistor T2 stable, the covering portion S is designed to form a capacitance with the active semiconductor layer 01 between the two channels of the threshold compensation transistor T2, and the covering portion S can be connected to the power signal line g6 to obtain a constant voltage such that the voltage of the active semiconductor layer 01 in the floating state can be kept stable. That the covering portion S overlaps the active semiconductor layer 01 between the two channels of the dual-gate threshold compensation transistor T2 can also prevent the active semiconductor layer 01 between the two gates from being illuminated to change its characteristic, for example, prevent a change in a voltage of a part of the active semiconductor layer 01, to prevent crosstalk. The power signal line g6 may be electrically connected to the covering portion S through a via hole penetrating the second insulation layer to supply a constant voltage to the covering portion S.

An orthographic projection of the covering portion S overlapped with the active semiconductor layer 01 onto a first straight line extending in the row direction X is overlapped with an orthographic projection of the first connection portion h1 onto the first straight line, and an orthographic projection of the fourth connection portion h4 onto a second straight line extending in the column direction Y is overlapped with an orthographic projection of the covering portion S onto the second straight line. To maintain a distance from the covering portion S disposed on the same layer, the first connection portion h1 has a non-linear shape, such as a zigzag shape.

For example, as shown in FIG. 16 to FIG. 22, the first connection portion h1 includes a body connection portion h1 extending in the row direction X and two end portions h12 located at both ends of the body connection portion h1 and extending in the column direction Y. The two end portions h12 are respectively connected to two fourth connection portions h4 of the pixel circuit pair f. Orthographic projections of the two end portions h12 onto the second straight line are overlapped with the orthographic projection of the covering portion S onto the second straight line. Therefore, the body connection portion and both end portions form the zigzag shape to maintain a distance from the covering portion.

For example, in the column direction Y, a distance between the covering portion S and the second electrode of the threshold compensation transistor T2 is smaller than a distance between the covering portion S and the first electrode of the first reset control transistor T7. In other words, the covering portion S is closer to the threshold compensation transistor T2. Therefore, to facilitate design and keep a distance between the first connection portion h1 and the covering portion S, the first connection portion h1 is disposed closer to the first electrode of the first reset control transistor T7. In other words, in the column direction Y, a distance between the body connection portion h1 and the second electrode of the threshold compensation transistor T2 in the first pixel circuit f1 is greater than a distance between the body connection portion h1 and the first electrode of the first reset control transistor T7 in the first pixel circuit f2.

Figure 23:
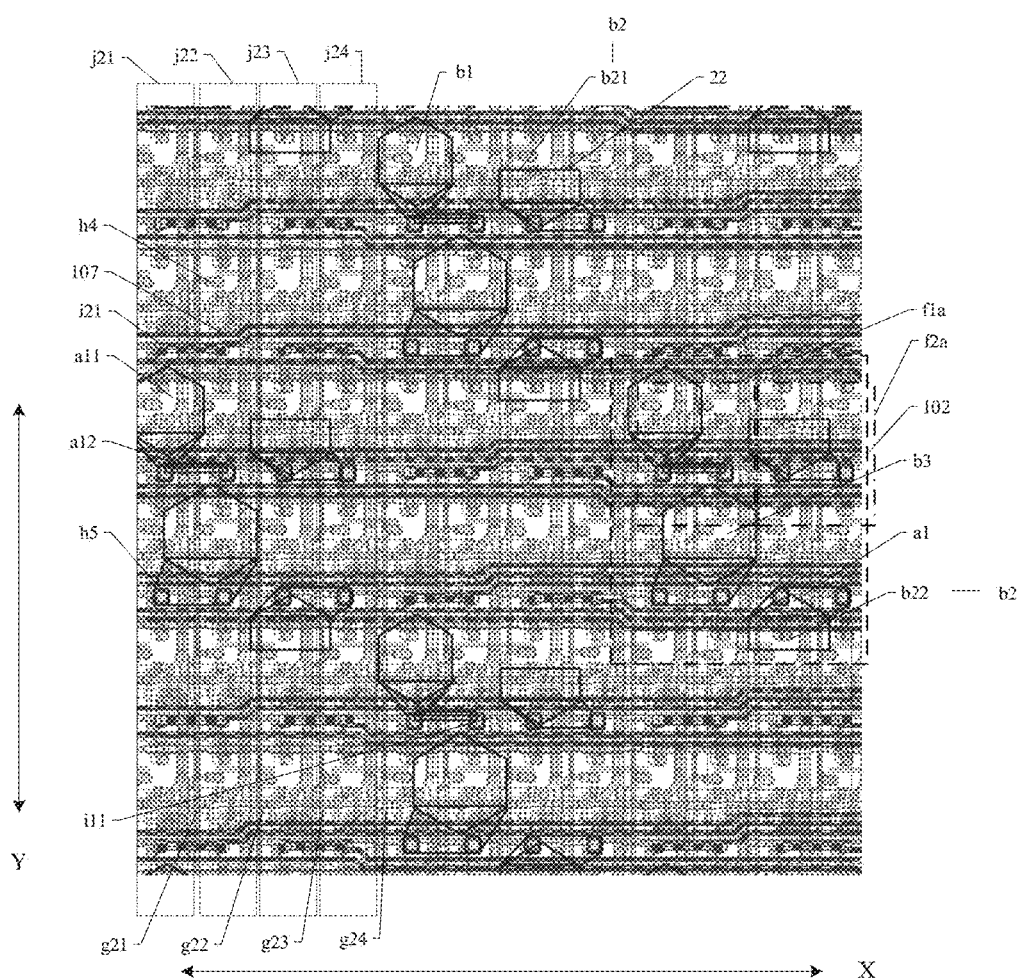
FIG. 23 is a schematic diagram of a connection relationship between a first light-emitting unit group and a first pixel circuit group in a first display region according to some embodiments of the present application.
Figure 24:
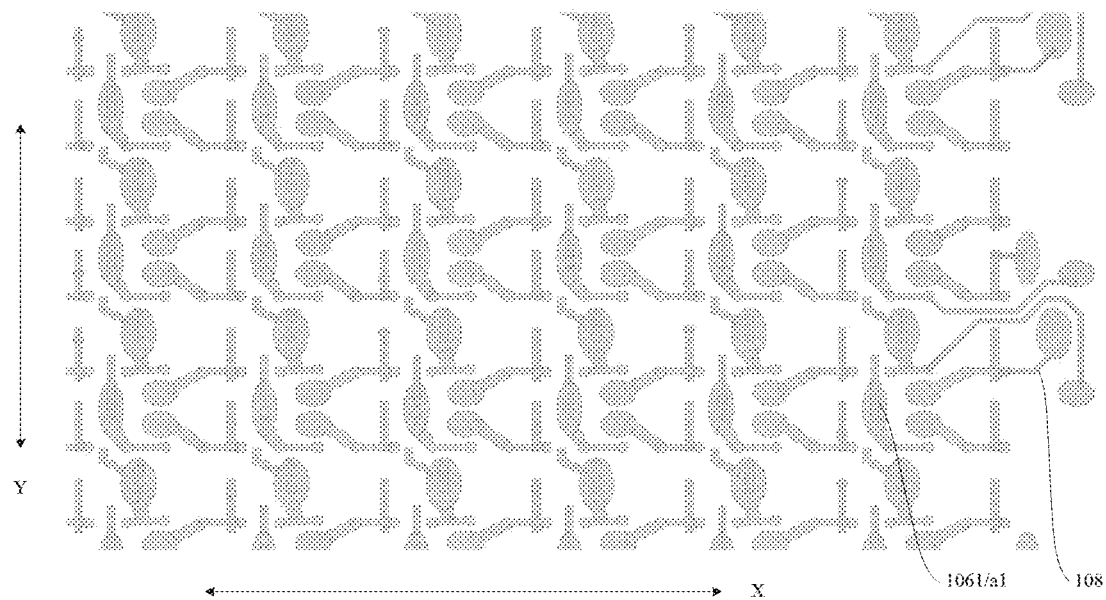
FIG. 24 is a schematic diagram of a first electrode and a dummy electrode pattern according to some embodiments of the present application.
Figure 25:
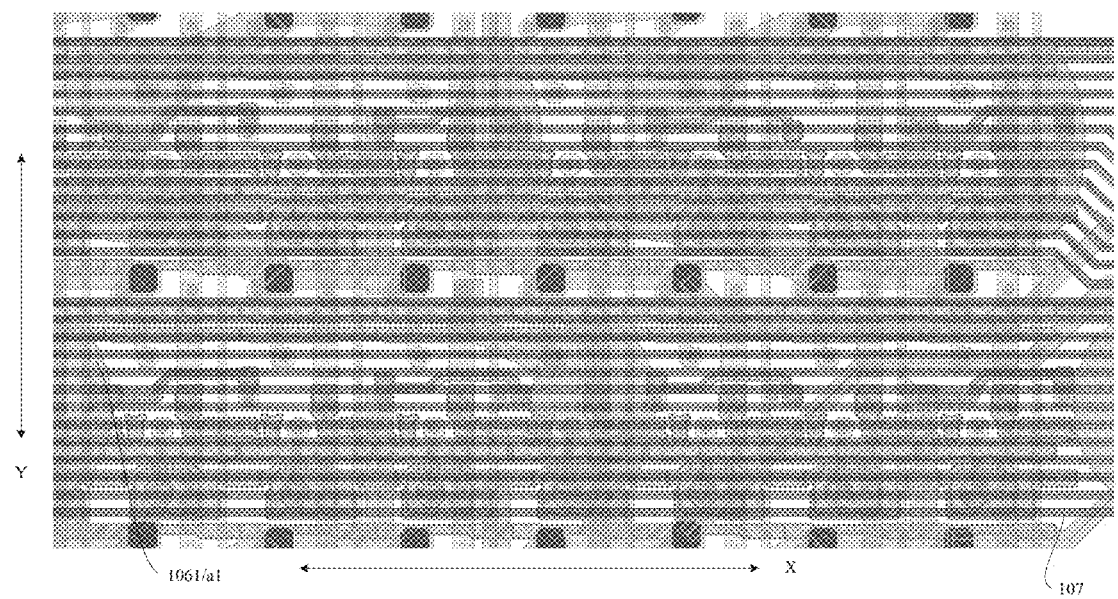
FIG. 25 is a schematic diagram of a first conductive layer, a second conductive layer, a source-drain metal layer, a first connection trace, a first electrode, and a dummy electrode pattern that are laminated in a first display region according to some embodiments of the present application.
Figure 26:
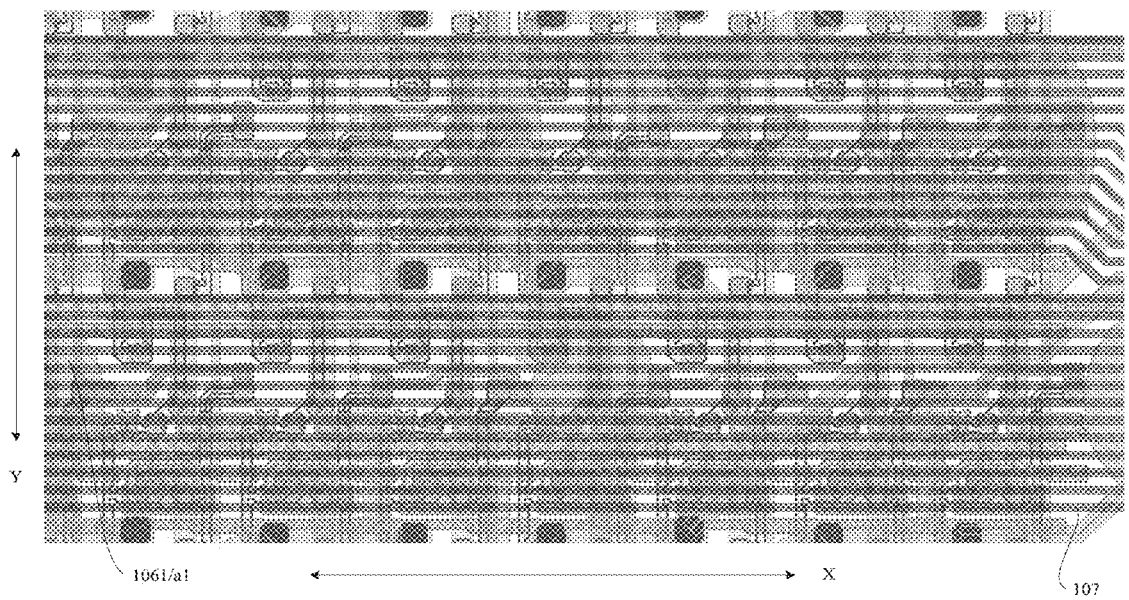
FIG. 26 is a schematic diagram of an active semiconductor layer, a first conductive layer, a second conductive layer, a source-drain metal layer, a first connection trace, a first electrode, and a dummy electrode pattern that are laminated in a first display region according to some embodiments of the present application.
Figure 27:
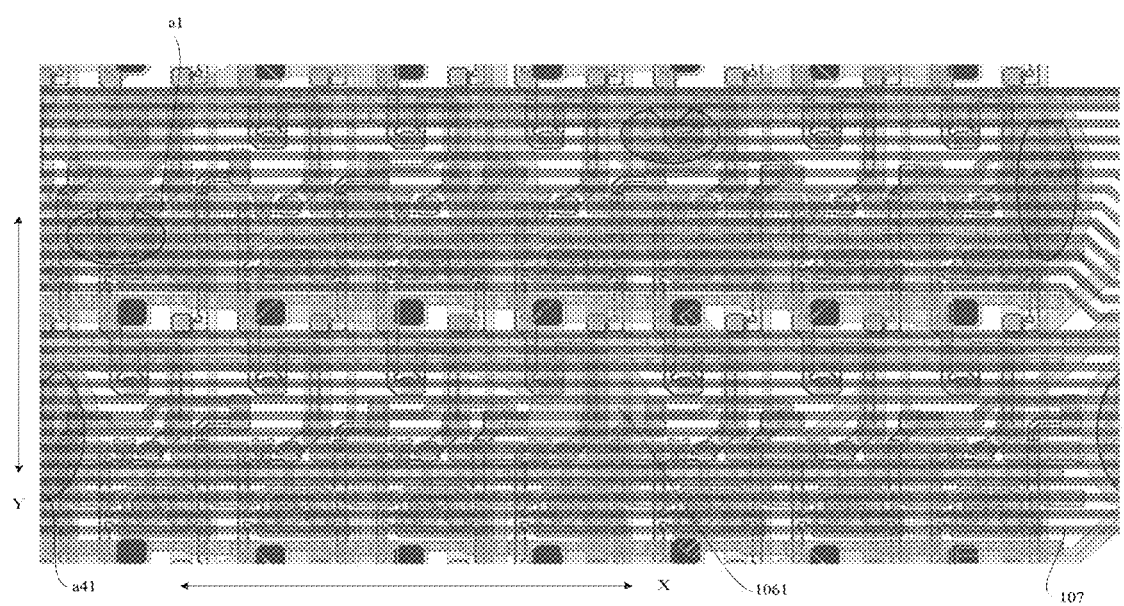
FIG. 27 is a schematic diagram of an active semiconductor layer, a first conductive layer, a second conductive layer, a source-drain metal layer, a first connection trace, a first electrode, a dummy electrode pattern, and a pixel definition layer that are laminated in a first display region according to some embodiments of the present application.

FIG. 23 is a schematic diagram of a connection relationship between a first light-emitting unit group and a first pixel circuit group in a first display region according to some embodiments of the present application. FIG. 24 is a schematic diagram of a first electrode and a dummy electrode pattern according to some embodiments of the present application. FIG. 25 is a schematic diagram of a first conductive layer, a second conductive layer, a source-drain metal layer, a first connection trace, a first electrode, and a dummy electrode pattern that are laminated in a first display region according to some embodiments of the present application. FIG. 26 is a schematic diagram of an active semiconductor layer, a first conductive layer, a second conductive layer, a source-drain metal layer, a first connection trace, a first electrode, and a dummy electrode pattern that are laminated in a first display region according to some embodiments of the present application. FIG. 27 is a schematic diagram of an active semiconductor layer, a first conductive layer, a second conductive layer, a source-drain metal layer, a first connection trace, a first electrode, a dummy electrode pattern, and a pixel definition layer that are laminated in a first display region according to some embodiments of the present application.

As shown in FIG. 1 to FIG. 27, each light-emitting unit group includes a plurality of light-emitting units. For example, the first light-emitting unit group 102 includes a plurality of first light-emitting units 1021, the second light-emitting unit group 104 includes a plurality of second light-emitting units 1041, and the third light-emitting unit group 109 includes a plurality of third light-emitting units 1091. With reference to FIG. 24 to FIG. 27, whether the pattern shown is the first electrode a1 or the dummy electrode pattern 1061 depends on whether the pixel definition layer a4 has an opening a41 therein. A pattern in a region in which the pixel definition layer a4 has an opening a41 is the first electrode a1, and a pattern in a region in which the pixel definition layer a4 does not have an opening is the dummy electrode pattern 1061.

For example, each first light-emitting unit group 1021 includes one first-color first light-emitting unit b1, one second-color first light-emitting unit pair b2, and one third-color first light-emitting unit b3. The first-color first light-emitting unit b1 and the third-color first light-emitting unit b3 are arranged in the column direction Y, and the second-color first light-emitting unit pair b2 includes two second-color first light-emitting units (b21 and b22) arranged in the column direction Y. The first-color first light-emitting unit b1 and the second-color first light-emitting unit pair b2 are arranged in the row direction. For example, an orthographic projection of a first electrode a1 in the first-color first light-emitting unit b1 onto a straight line extending in the column direction Y is overlapped with an orthographic projection of a first electrode a1 in the second-color first light-emitting unit b21 onto the straight line. An orthographic projection of a first electrode a1 in the third-color first light-emitting unit b3 onto the straight line extending in the column direction Y is overlapped with an orthographic projection of an interval between first electrodes a1 in the two second-color first light-emitting units (b21 and b22) onto the straight line. For example, an orthographic projection of a body pattern (described later) in the third-color first light-emitting unit b3 onto the straight line extending in the column direction Y is not overlapped with orthographic projections of body patterns in the two second-color first light-emitting units (b21 and b22) in the column direction Y.

For example, referring to FIG. 5, each light-emitting unit includes a first electrode a1, a light-emitting layer a2, and a second electrode a3 that are sequentially disposed in the direction away from the substrate 101. The display substrate further includes a pixel definition layer a4. The pixel definition layer a4 includes an opening a41 for defining a light-emitting region of a pixel unit. The opening a41 exposes a first electrode a1 of a light-emitting unit A. When a light-emitting layer a2 of a subsequent light-emitting unit A is formed in the opening a41 of the pixel definition layer a4, the light-emitting layer a2 is in contact with the first electrode a1 such that this portion can drive the light-emitting layer a2 to emit light to form an effective light-emitting region. The "effective light-emitting region" may be a two-dimensional planar region that is parallel to the substrate. It should be noted that due to process reasons, a size of a part, distal from the substrate, of the opening a41 of the pixel definition layer is slightly larger than a size of a part proximal to the substrate, or a size of the opening gradually increases in a direction from a side proximal to the substrate to a side distal from the substrate. Therefore, a size of the effective light-emitting region may be slightly different based on sizes of different positions of the opening a41 of the pixel definition layer, but a shape and size of an overall region are approximately the same. For example, an orthographic projection of the effective light-emitting region onto the substrate approximately is in coincide with an orthographic projection of the corresponding opening a41 of the pixel definition layer onto the substrate. For example, the orthographic projection of the effective light-emitting region onto the substrate completely falls within the orthographic projection of the corresponding opening a41 of the pixel definition layer onto the substrate. Shapes of the two orthographic projections are similar, and an area of the orthographic projection of the effective light-emitting region onto the substrate is slightly smaller than an area of the orthographic projection of the corresponding opening a41 of the pixel definition layer onto the substrate.

As shown in FIG. 1 to FIG. 27, each pixel circuit further includes a fifth connection portion h5 disposed in the same layer as the data line g2, and the first electrode a1 of each of light-emitting units A in the second display region 101b and the third display region 101c can be electrically connected to the second electrode of the first light-emitting control transistor T6 through the fifth connection portion h5. For example, in the third display region 101c, the second electrode of each third light-emitting unit 1091 in the third light-emitting unit group 109 may be electrically connected to the second electrode of the first light-emitting control transistor T6 through the fifth connection portion h5 of the corresponding pixel circuit in the third pixel circuit group 110. In the first display region 101a, the second electrode of each first light-emitting unit 1021 in the first light-emitting unit group 102 may be electrically connected to the second electrode of the first light-emitting control transistor T6 through the fifth connection part h5 of the corresponding pixel circuit in the first pixel circuit group 103. For example, in the first display region 101a, the second electrode of each first light-emitting unit 1021 in the first light-emitting unit group 102 may be connected to the fifth connection portion h5 through a first via hole i1 in the third insulation layer.

Referring to FIG. 1 to FIG. 27, the first pixel circuit group 103 includes a plurality of pixel circuit pairs f, and the first electrode a1 of each first light-emitting unit 1021 in the first light-emitting unit group 102 includes a first body pattern and connection patterns (a first connection pattern and a second connection pattern). A shape of the body pattern is approximately the same as that of an effective light-emitting region of each first light-emitting unit 1021, and the connection pattern (first connection pattern 1021-2) is configured to be directly electrically connected to the fifth connection portion h5 to be electrically connected to second electrodes of two first light-emitting control transistors T6 of the pixel circuit pair f.

As shown in FIG. 1 to FIG. 27, the display panel 10 further includes a plurality of first connection traces 107 located between the first electrode a1 and the film layer in which the data line g2 is located, and each first connection trace 107 extends in the row direction X. For example, the second pixel circuit group 105 includes a plurality of pixel circuit pairs f, and the first connection trace 107 is configured to connect the first electrode a1 of each second light-emitting unit 1041 in the first-type second light-emitting unit group 104a and the fifth connection portion h5 to electrically connect the first electrode a1 of each second light-emitting unit 1041 in the first-type second light-emitting unit group 104 to second electrodes of two first light-emitting control transistors T6 of the pixel circuit pair f in the second pixel circuit group 105.

In the first display region 101a, the first connection trace 107 is electrically connected to the fifth connection portion h5 in the second pixel circuit group 105 through a second via hole i21 in the third insulation layer. In the second display region 101b, the first electrode a1 of the second light-emitting unit 1041 is connected to the first connection trace 107 to be connected to the pixel circuit in the first display region 101a.

Figure 28:
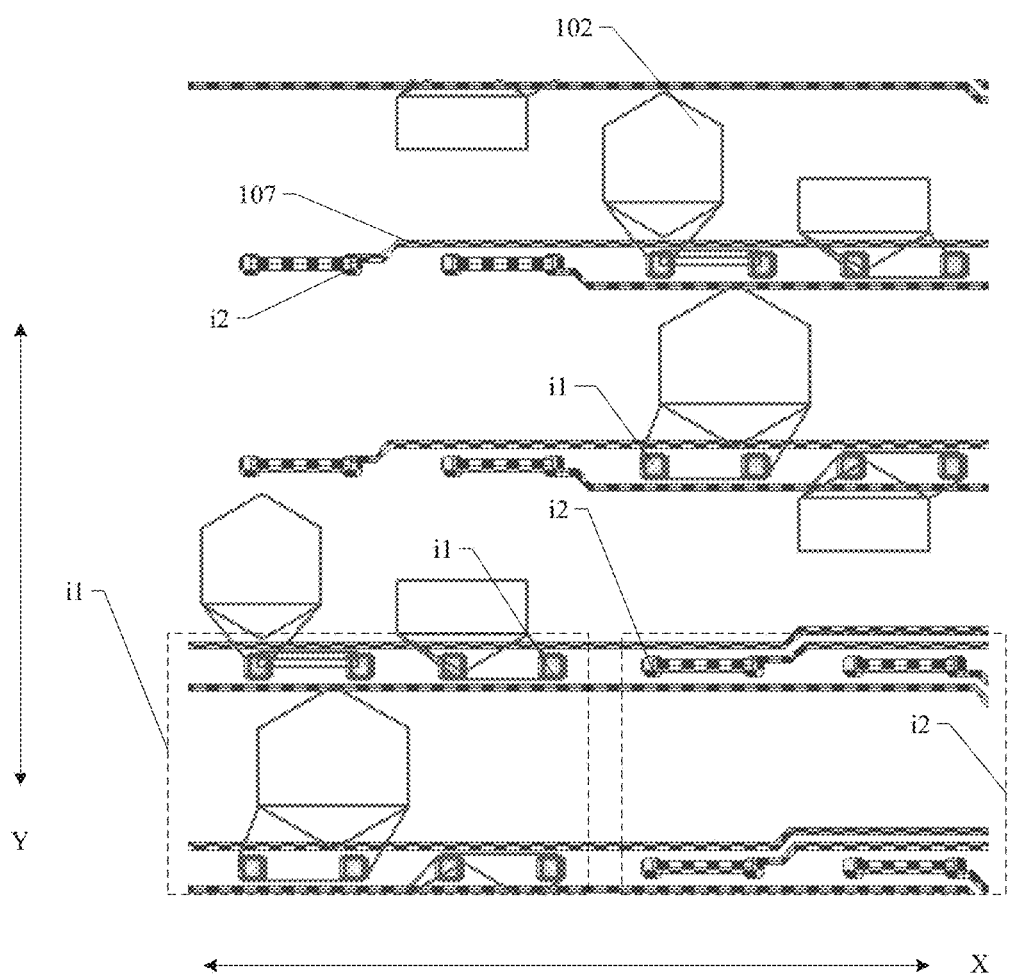
FIG. 28 is a schematic diagram of a position relationship between the first light-emitting unit group and a via hole in the first display region shown in FIG. 23.

For example, FIG. 28 is a schematic diagram of a position relationship between the first light-emitting unit group and a via hole in the first display region shown in FIG. 23. The dummy electrode pattern group 106 and the fourth connection pattern 1021-3 of the first electrode a1 in each light-emitting unit in the light-emitting unit group are not shown in FIG. 28. As shown in FIG. 23 and FIG. 28, a plurality of first via holes i11 connecting one first light-emitting unit group 102 and one first pixel circuit group 103 form one first via hole group i1, and a plurality of second via holes i21 connecting one second light-emitting unit group 104 and one second pixel circuit group 105 form one second via hole group i2. A plurality of first via hole groups i1 and a plurality of second via hole groups i2 are alternately arranged in the row direction X; and a plurality of first via hole groups i1 and a plurality of second via hole groups i2 are alternately arranged in the column direction Y. Compared with a case in which both the first light-emitting unit group 102 and the second light-emitting unit group 104 are connected to the fifth connection portion through the film layer in which the first connection traces 105 are located, in this embodiment of the present application, the first electrode a1 in each light-emitting unit in the first light-emitting unit group 102 is directly connected to the fifth connection portion, and the first electrode a1 of each light-emitting unit in the second light-emitting unit group 104 is connected to the fifth connection portion through the first connection trace 107 such that more space can be left for transparent traces, and crosstalk of signals can be prevented.

Figure 29:
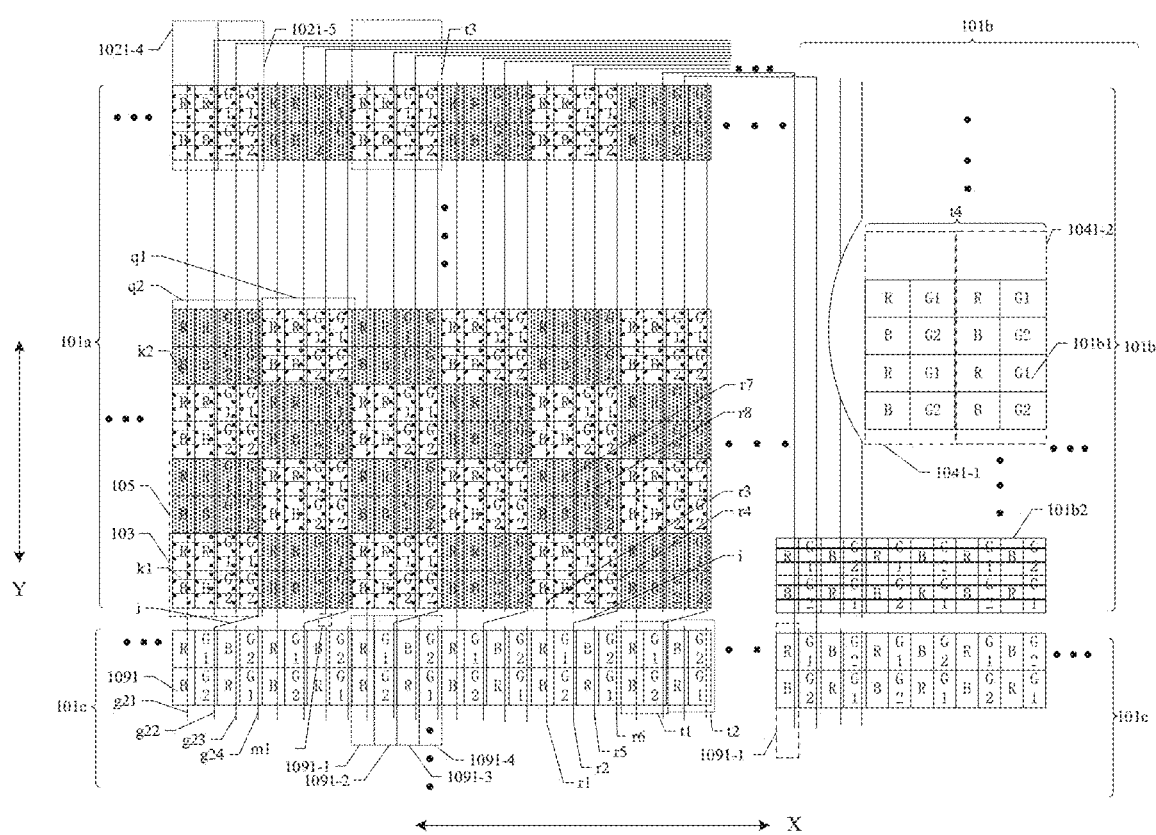
FIG. 29 is a partial plan view of a first display region and a third display region in the display panel shown in FIG. 1.

For example, FIG. 29 is a partial plan view of a first display region and a third display region in the display panel shown in FIG. 1. As shown in FIG. 1 and FIG. 29, in this embodiment of the present application, the third display region 101c and the first display region 101a in the display panel 10 each include a plurality of pixel circuits arranged in the row direction X and the column direction Y to form a plurality of pixel circuit rows j1 and a plurality of pixel circuit columns j2. The plurality of pixel circuits in the third display region 101c includes a plurality of third sub pixel circuits k3. The plurality of pixel circuits in the first display region 101a include a plurality of first sub pixel circuits k1. The plurality of third light-emitting units 1091 (namely, light-emitting units of three colors included in the third light-emitting unit group 109, such as R, G1, G2, and B shown in the figure) in the third display region 101c are connected to the plurality of third sub pixel circuits k3 in a one-to-one correspondence. Each of the first light-emitting units 1021 (namely, light-emitting units of three colors included in the first light-emitting unit group 102, such as R, G1, G2, and B shown in the figure) in the first display region 101a is connected to at least two of the first sub pixel circuits k1.

As shown in FIG. 1, the third display region 101c borders the first display region 101a in the column direction Y (namely, the extension direction of the data line). The second display region 101b includes the central region 101b1 and the edge region 101b2 surrounding the central region 101b1, and the edge region 101b2 of the second display region 101b borders the third display region 101c in the column direction Y. FIG. 1 schematically shows that the second display region 101b is a rectangle, the central region 101b1 of the second display region 101b is circular, and the edge region 101b2 is a region in the rectangle other than the circular central region. The embodiments the present application are not limited thereto. Shapes of the central region 101b1 and the edge region 101b2 of the second display region 101b may be set based on actual product requirements.

For example, as shown in FIG. 1, the central region 101b1 and the edge region 101b2 of the second display region 101b are both provided with second light-emitting unit groups 104. The plurality of second light-emitting unit groups 104 in the second display region 101b are respectively electrically connected to the plurality of second pixel circuit groups 105 in the first display area 101a through the first connection traces 107 or second connection traces 108 to drive the second light-emitting unit groups 104 to emit light. The central region 101b1 of the second display region 101b is provided only with the light-emitting unit groups but without pixel circuit groups such that a metal coverage area can be reduced to achieve higher transmittance. The edge region 101b2 of the second display region 101b is provided with a light blocking structure in addition to the light-emitting unit groups such that a light transmission region having a preset shape (namely, the central region 101b1) is formed in the second display region 101b. For example, the light blocking structure disposed in the edge region 101b2 of the second display region 101b in this embodiment of the present application may be a plurality of dummy pixel circuit groups 111. The plurality of dummy pixel circuit groups 111 include at least one dummy pixel circuit group located between the second light-emitting unit groups 104 and the substrate 101 and at least one dummy pixel circuit group located between adjacent second light-emitting unit groups 104. Each dummy pixel circuit group 111 is not connected to any light-emitting unit group and includes merely suspended pixel circuits. For example, the edge region 101b2 is an annular trace region. For example, lines connected to the second pixel circuit group 105, such as the data line, scan signal line g3, power signal line, reset control line, light-emitting control signal line, and reset power signal line, are located in the annular region.

For example, as shown in FIG. 1, the second light-emitting unit groups 104 in the second display region 101b may be controlled in a left and right half control manner by second pixel circuit groups 105 in the two first display regions 101a axially symmetrical about a central line Y extending in the column direction in the second display region 101b. For example, second light-emitting unit groups 104 on the left side of the central line are controlled by second pixel circuit groups 105 in the first display region 101a on the left side of the central line, and second light-emitting unit groups 104 on the right side of the central line are controlled by second pixel circuit groups 105 in the first display region 101a on the right side of the central line. The traces configured to drive the light-emitting units in the circular central region 101b1 are arranged in the edge region 101b2 in a dense arrangement manner such that the circular central region 101b1 used as a under-screen display region can have an area as large as possible.

For example, as shown in FIG. 1, the third display region 101c and the first display region 101a each include a plurality of pixel circuits arranged in the row direction X and the column direction Y to form a plurality of pixel circuit rows j1 and a plurality of pixel circuit columns j2. For example, the edge region 101b2 of the second display region 101b includes a plurality of dummy pixel circuits 1111 arranged in the row direction X and column direction Y to form a plurality of dummy pixel circuit columns and a plurality of dummy pixel circuit rows. The dummy pixel circuits in the second display region 101b are also referred to as pixel circuits. Although the dummy pixel circuits are not connected to any light-emitting unit, but their structures may be approximately the same as those in other regions, such as a 7T1C structure (namely, seven transistors and one capacitor). Optionally, a plurality of data lines g2 extending in column direction Y are connected to the plurality of pixel circuit columns j2, respectively.

For example, as shown in FIG. 1 to FIG. 23, each pixel circuit column j2 includes a pixel circuit column group in four adjacent columns. Each pixel circuit column group includes a first pixel circuit column j21, a second pixel circuit column j22, a third pixel circuit column j23, and a fourth pixel circuit column j24 sequentially arranged in the row direction X (namely, the direction intersecting the extension direction of the data line g2). The first pixel circuit column j21, the second pixel circuit column j22, the third pixel circuit column j23, and the fourth pixel circuit column j24 in the third display region 101c are respectively connected to a first data line g21, a second data line g22, a third data line g23, and a fourth data line g24 sequentially arranged in the row direction X. At least one pixel circuit in the first pixel circuit column j21, at least one pixel circuit in the second pixel circuit column j22, at least one pixel circuit in the third pixel circuit column j23, and at least one pixel circuit in the fourth pixel circuit column j24 in the first display region 101a are respectively connected to the first data line g21, the second data line g22, the third data line g23, and the fourth data line g24 sequentially arranged in the row direction X.

For example, as shown in FIG. 1 to FIG. 23, in at least one pixel circuit column group in the first display region 101a, data output ends (namely, fourth connection portions h4) of two pixel circuits in the pixel circuit row j1 and in the first pixel circuit column j21 and the second pixel circuit column j22 are electrically connected to form a first pixel circuit pair f1a, and data output ends (namely, fourth connection portions h4) of two pixel circuits in the pixel circuit row j1 and in the third pixel circuit column j23 and the fourth pixel circuit column j24 are electrically connected to form a second pixel circuit pair f2a. The embodiments of the present application schematically use an example in which each pixel circuit column group in the first display region 101a includes the first pixel circuit pair f1a and the second pixel circuit pair f2a for description, but are not limited thereto, and settings can be made based on actual product requirements.

For example, as shown in FIG. 1 to FIG. 23, the third display region 101c, the first display region 101a, and the second display region 101b each include a plurality of light-emitting units A. The plurality of light-emitting units 1091 in the third display region 101c are respectively connected to the plurality of pixel circuits in the third display region 101c. The plurality of light-emitting units 1021 in the first display region 101a are respectively connected to some pixel circuits in the first display region 101a, and the plurality of light-emitting units 1041 in the second display region 101b are respectively connected to the other pixel circuits in the first display region 101a. In other words, in the first display region 101a, the light-emitting units 1021 in the first light-emitting unit group 102 are connected to the pixel circuits in the first pixel circuit group 103. The second light-emitting units 1041 in the second display unit group 104 in the second display area 101b are connected to the pixel circuits in the second pixel circuit group 105 in the first display region 101a. The embodiments of the present application schematically show that the first display region 101a includes only the first pixel circuit group 103 and the second pixel circuit group 105, but are not limited thereto, and setting can be made based on factors such as product space design requirements. The first display region 101a may alternatively include another pixel circuit group, such as a dummy pixel circuit group (not connected to the light-emitting units).

For example, as shown in FIG. 1 to FIG. 23, the first pixel circuit group 103 and the second pixel circuit group 105 in the first display region 101a each include a first pixel circuit pair f1a and a second pixel circuit pair f2a. In the first display region 101a and the second display region 101b, the plurality of light-emitting units are respectively connected to the plurality of first pixel circuit pairs f1a and the plurality of second pixel circuit pairs f2a in the first display region 101a.

For example, in the embodiments of the present application, the light-emitting unit in the third display region 101c may be referred to as the third light-emitting unit 1091, the light-emitting unit in the first display region 101a may be referred to as the first light-emitting unit 1021, and the light-emitting unit in the second display region 101b may be referred to as the second light-emitting unit 1041.

The first pixel circuit groups 103 and the second pixel circuit groups 105 are alternately arranged in the row direction X and column direction Y, and the first pixel circuit groups 103 and the second pixel circuit groups 105 in a same column arranged in the column direction Y are connected to different data lines g2. Therefore, at least one pixel circuit in the first pixel circuit column j21 in the first display region 101a is connected to the first data line g21, for example, the pixel circuits in the first pixel circuit group 103 in the first pixel circuit column j21 are connected to the first data line g21, and the pixel circuits in the second pixel circuit group 105 in the first pixel circuit column j21 are not connected to the first data line g21. Similarly, at least one pixel circuit in the second pixel circuit column j22 in the first display region 101a is connected to the second data line g22, for example, the pixel circuits in the second pixel circuit group 105 in the second pixel circuit column j22 are connected to the second data line g22, and the pixel circuits in the first pixel circuit group 103 in the second pixel circuit column j22 are not connected to the second data line g22. At least one pixel circuit in the third pixel circuit column j23 in the first display region 101a is connected to the third data line g23, for example, the pixel circuits in the second pixel circuit group 105 in the third pixel circuit column j23 are connected to the third data line g23, and the pixel circuits in the first pixel circuit group 103 in the third pixel circuit column j23 are not connected to the third data line g23. At least one pixel circuit in the fourth pixel circuit column j24 in the first display region 101a is connected to the fourth data line g24, for example, the pixel circuits in the first pixel circuit group 103 in the fourth pixel circuit column j24 are connected to the fourth data line 422, and the pixel circuits in the second pixel circuit group 105 in the fourth pixel circuit column j24 are not connected to the fourth data line g24.

As shown in FIG. 1 to FIG. 23, the plurality of first pixel circuit pairs f1a connected to the plurality of light-emitting units in the first display region 101a are connected to the first data line g21, the plurality of second pixel circuit pairs f2a connected to the plurality of light-emitting units in the first display region 101a are connected to the fourth data line g24, the plurality of first pixel circuit pairs f1a connected to the plurality of light-emitting units in the second display region 101b are connected to the second data line g22, and the plurality of second pixel circuit pairs f2a connected to the plurality of light-emitting units in the second display region 101b are connected to the third data line g23.

For example, in the first pixel circuit group 103, two pixel circuits in the first pixel circuit pair f1a are connected to the first data line g21, and two pixel circuits in the second pixel circuit pair f2a are connected to the fourth data line g24. In the second pixel circuit group 105, two pixel circuits in the first pixel circuit pair f1a are connected to the second data line g22, and two pixel circuits in the second pixel circuit pair f2a are connected to the third data line g23.

For example, as shown in FIG. 1 to FIG. 23, the first pixel circuit pair f1a connected to the first-color light-emitting unit b1 and the third-color light-emitting unit b3 in the first light-emitting unit group 102 is connected to the first data line g21, and the second pixel circuit pair f2a connected to the second-color light-emitting unit pair b2 in the light-emitting unit group 102 is connected to the fourth data line g24.

Figure 30:
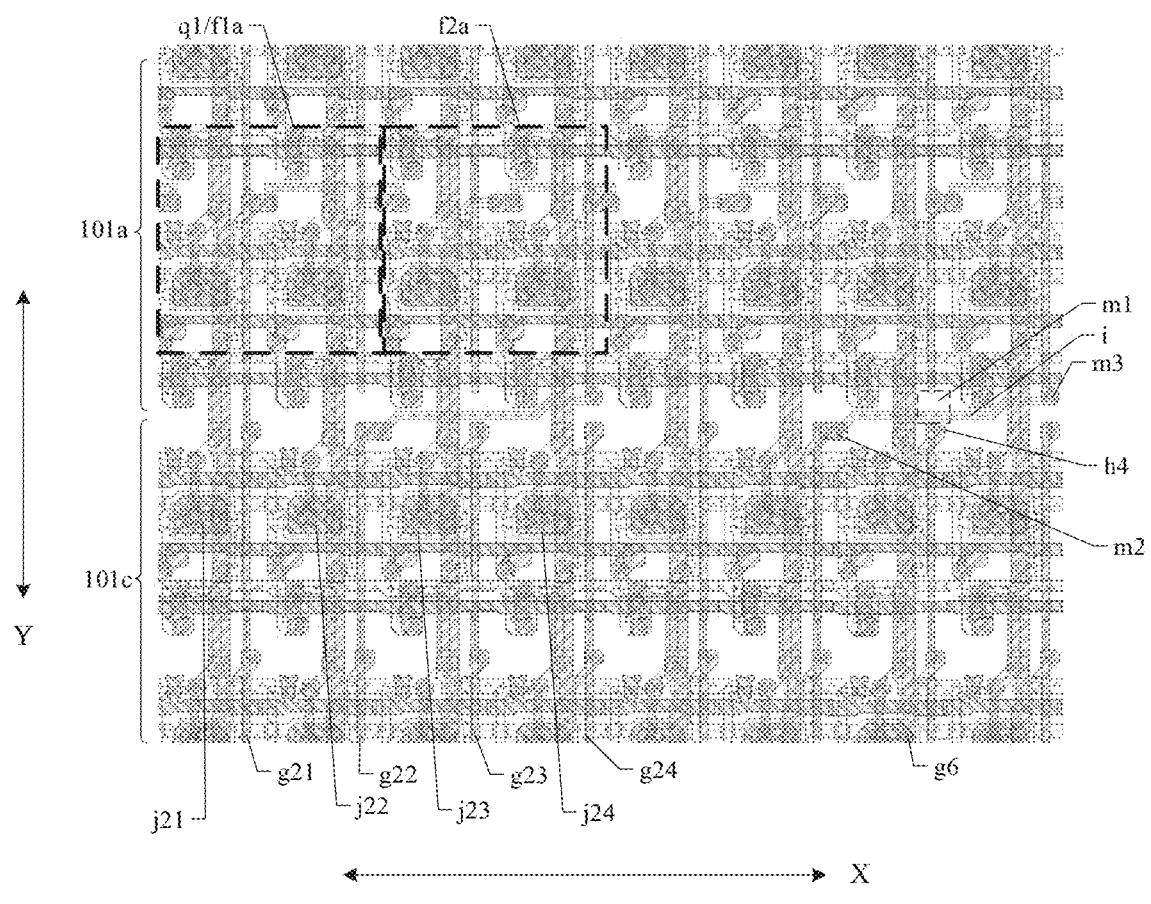
FIG. 30 is a schematic structural diagram of a pixel circuit at an intersection of a third display region and a first display region according to some embodiments of the present application.
Figure 31:
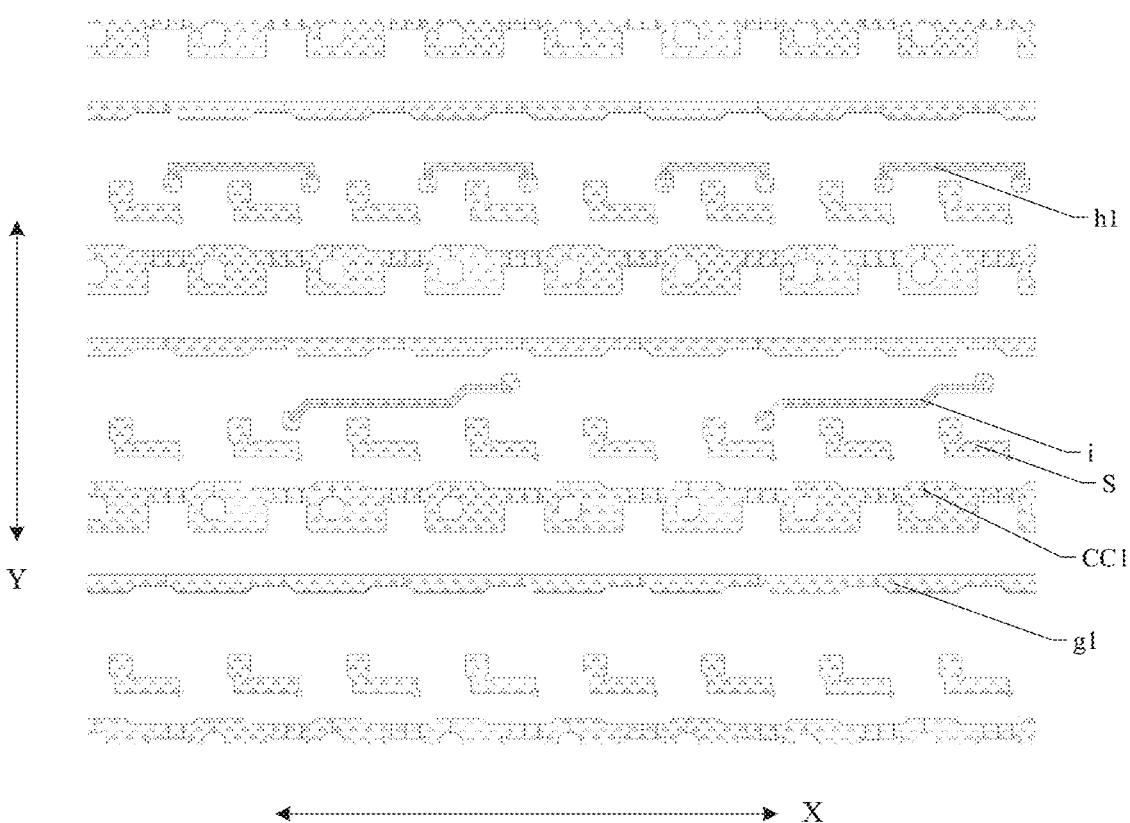
FIG. 31 is a schematic structural diagram of a film layer in which a connection portion of a data line is located in a position shown in FIG. 30.
Figure 32:
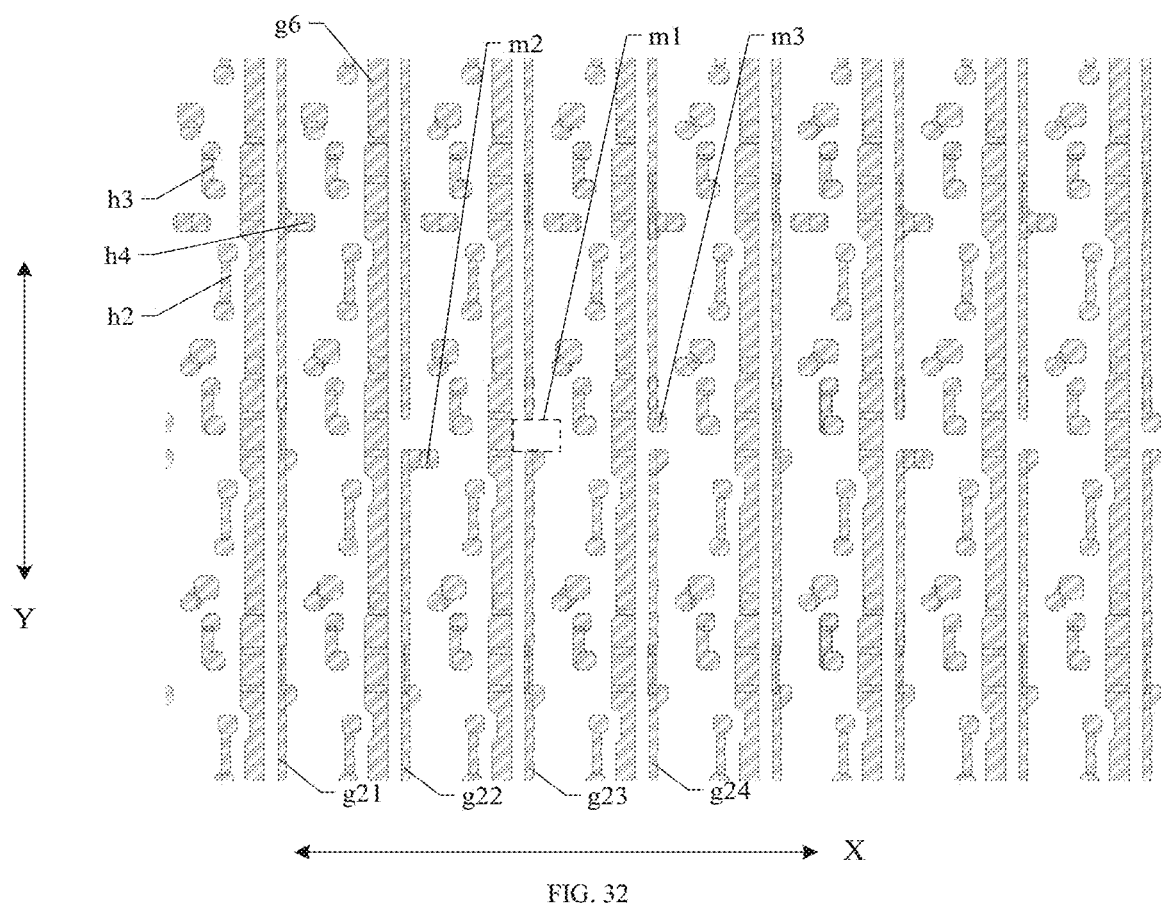
FIG. 32 is a schematic structural diagram of a film layer in which a data line is located in a position shown in FIG. 30.

FIG. 30 is a schematic diagram of a partial pixel circuit structure at an intersection of a third display region and a first display region according to some embodiments of the present application. FIG. 31 is a schematic structural diagram of a film layer in which a connection portion of a data line is located in a position shown in FIG. 30. FIG. 32 is a schematic structural diagram of a film layer in which a data line is located in a position shown in FIG. 30. As shown in FIG. 1 to FIG. 32, at an intersection of the third display region 101c and the first display region 101a, the second data line g22, the third data line g23, and the fourth data line g24 connected to at least one pixel circuit column group are broken to form a first break m1, and the first data line g21 remains continuous without a break. In other words, a part in the first display region 101a and a part in the third display region 101c of the second data line g22 are not connected at the intersection of the third display region 101c and the first display region 101a. Similarly, a part in the first display region 101a and a part in the third display region 101c of the third data line g23 are not connected at the intersection of the third display region 101c and the first display region 101a. A part in the first display region 101a and a part in the third display region 101c of the fourth data line g24 are not connected at the intersection of the third display region 101c and the first display region 101a. An end point m2 of the second data line g22 in the third display region 101c proximal to the first display region 101a is connected to an end point m3 of the fourth data line g24 in the first display region 101a proximal to the third display region 101c through a data line connection portion i. The data line connection portion i passes through the first break m1 of the third data line g23. The first data line g21, the second data line g22, the third data line g23, and the fourth data line g24 each may be a continuous data line, for example, the first data line g21 is a continuous data line; or a discontinuous data line connected to a same column of pixel circuits, such as the second data line g22, the third data line g23, and the fourth data line g24. Therefore, the second data line g22 connected to the third sub pixel circuit and the second data line g22 connected to the first sub pixel circuit are configured to transmit different signals; the third data line g23 connected to the third sub pixel circuit and the third data line g23 connected to the first sub pixel circuit are configured to transmit different signals; and the fourth data line g24 connected to the third sub pixel circuit and the fourth data line g24 connected to the first sub pixel circuit are configured to transmit different signals.

In other words, in the embodiments of the present application, although data lines located in a same straight line in the third display region and the first display region are all referred to as second data lines, third data lines, or fourth data lines, the second data lines (third data lines or fourth data lines) located in different display regions are configured to transmit different signals.

The embodiments of the present application schematically show that the end point, proximal to the first display region, of the second data line in the third display region is connected to the end point, proximal to the third display region, of the fourth data line in the first display region through the data line connection portion, but are not limited thereto. The end point, proximal to the first display region, of the second data line in the third display region may alternatively be connected to the end point, proximal to the third display region, of the third data line in the first display region through a data line connection portion.

In the embodiments of the present application, the pixel circuits in the third display region are referred to as third sub pixel circuits k3, the pixel circuits connected to the light-emitting units in the first display region 101a are referred to as first sub pixel circuits k1, and the pixel circuits connected to the light-emitting units in the second display region 101b are referred to as second sub pixel circuits k2.

As shown in FIG. 30, in this embodiment of the present application, for example, the plurality of light-emitting units connected to the first pixel circuit column j21 in the third display region 101c include a first-color light-emitting unit and a third-color light-emitting unit, the plurality of light-emitting units connected to the second pixel circuit column j22 in the third display region 101c include a second-color light-emitting unit pair, the plurality of light-emitting units connected to the third pixel circuit column j23 in the third display region 101c include a first-color light-emitting unit and a third-color light-emitting unit, and the plurality of light-emitting units connected to the fourth pixel circuit column j24 in the third display region 101c include a second-color light-emitting unit pair.

In this embodiment of the present application, data signals are transmitted from a source drive integrated circuit (IC) on a side, distal from the first display region 101a, of the third display region 101c to the pixel circuits in the third display region 101c and the first display region 101a through data lines. A data signal transmitted to a pixel circuit connected to a light-emitting unit of a specific color in the first display region 101a needs to be the same as a data signal transmitted to a pixel circuit connected to a light-emitting unit of the same color in the third display region 101c. Therefore, when a same pixel circuit column in the third display region 101c is connected to the same data line and the pixel circuit pair f in the first display region 101a is connected to the same data line, such a case is prone to a problem that the data signal transmitted to the pixel circuit connected to the first-color light-emitting unit in the third display region 101c is the same as the data signal transmitted to the pixel circuit pair f connected to the second-color light-emitting unit pair in the first display region 101a, resulting in a mismatch of the data signals of the third display region 101c and the first display region 101a.

For example, in the third display region 101c, each third light-emitting unit group 109 includes one first-color light-emitting unit b1, one second-color light-emitting unit pair b2, and one third-color light-emitting unit b3. Each second-color light-emitting unit pair includes a first light-emitting unit b21 and a second light-emitting unit b22. The first-color light-emitting unit b1 and the third-color light-emitting unit b3 are arranged in a direction (the column direction Y) parallel to the extension direction of the data line. The first light-emitting unit b21 and the second light-emitting unit b22 included in the second-color light-emitting unit pair b2 are arranged in the column direction Y. The first-color light-emitting unit b1 and the second-color light-emitting unit pair b2 are arranged in the row direction X. First-color light-emitting units in two adjacent third light-emitting unit groups point to third-color light-emitting units in opposite directions. In other words, the light-emitting units connected to four pixel circuits in the pixel circuit column group in the first row of pixel circuits in the third display region 101c proximal to the first display region 101a are sequentially the first-color light-emitting unit b1, the first light-emitting unit b21, the third-color light-emitting unit b3, and the second light-emitting unit b22. Four light-emitting units connected to the second row of pixel circuits in the pixel circuit column group in the third display region 101c proximal to the first display region 101a are sequentially the third-color light-emitting unit b3, the second light-emitting unit b22, the first-color light-emitting unit b1, and the first light-emitting unit b21.

Therefore, the arrangement of the first-color light-emitting unit and the third-color light-emitting unit connected to the pixel circuits in the first pixel circuit column is different from that in the third pixel circuit column, and the arrangement of the first light-emitting unit b21 and the second light-emitting unit b22 connected to the pixel circuits in the second pixel circuit column is different from that in the fourth pixel circuit column. The data signal transmitted by the data line is related to the arrangement of the light-emitting unit of the corresponding colors, and matched data signals need to be transmitted in the third display region and the first display region based on the light-emitting unit arrangement.

As shown in FIG. 1 to FIG. 32, the plurality of light-emitting units connected to the first pixel circuit column j21 in the first display region 101a includes first-color light-emitting units b1 and third-color light-emitting units b3 alternately arranged, and the light-emitting unit connected to the pixel circuit in the first pixel circuit column j21 in a row, proximal to the third display region 101c, in the first display region 101a is, for example, the third-color light-emitting unit b3. The plurality of light-emitting units connected to the first pixel circuit column j21 in the third display region 101c includes first-color light-emitting units b1 and third-color light-emitting units b3 alternately arranged, and the light-emitting unit connected to the pixel circuit in the first pixel circuit column j21 in a row, proximal to the first display region 101a, in the third display region 101c is, for example, the first-color light-emitting unit b1. Therefore, the pixel circuit in a pixel circuit row, proximal to the first display region 101a, in the third display region 101c and connected to the first data line is connected to the first-color light-emitting unit b1, and the pixel circuit in a pixel circuit row, proximal to the third display region 101c, in the first display region 101a and connected to the same first data line is connected to the third-color light-emitting unit b3. The arrangement mode of the light-emitting units is matched with the data signals transmitted over the first data line such that the first data line can remain continuous at the intersection of the third display region 101c and the first display region 101a and does not need to be broken at the intersection of the two display regions.

As shown in FIG. 1 to FIG. 32, the plurality of second-color light-emitting unit pairs b2 connected to the fourth pixel circuit column j24 in the first display region 101a includes first light-emitting units b21 and second light-emitting units b22 alternately arranged, and the light-emitting unit connected to the pixel circuit in the fourth pixel circuit column j24 in a row, proximal to the third display region 101c, in the first display region 101a is, for example, the second light-emitting unit b22. The plurality of second-color light-emitting unit pairs connected to the fourth pixel circuit column j24 in the third display region 101c include first light-emitting units b21 and second light-emitting units b22 alternately arranged, and the light-emitting unit connected to the pixel circuit in the fourth pixel circuit column j24 in a row, proximal to the first display region 101a, in the third display region 101c is also the second light-emitting unit b22. Therefore, a light-emitting unit connected to a pixel circuit in the fourth pixel circuit column in a pixel circuit row, proximal to the first display region 101a, in the third display region 101c and a light-emitting unit connected to a pixel circuit in the fourth pixel circuit column in a pixel circuit row, proximal to the third display region 101c in the first display region are the same type of light-emitting unit. The data signal over the fourth data line connected to the fourth pixel circuit column in the third display region 101c does not match the data signal over the fourth data line connected to the fourth pixel circuit column in the first display region 101a. Therefore, the fourth data line needs to be broken at the intersection of the third display region 101c and the first display region 101a.

As shown in FIG. 1 to FIG. 32, the plurality of second-color light-emitting unit pairs b2 connected to the second pixel circuit column j22 in the third display region 101c includes first light-emitting units b21 and second light-emitting units b22 alternately arranged, and the light-emitting unit connected to the pixel circuit in the second pixel circuit column j22 in a row, proximal to the first display region 101a, in the third display region 101c is, for example, the first light-emitting unit b21. Therefore, the data signal over the fourth data line connected to the fourth pixel circuit column in the first display region 101a matches the data signal over the second data line connected to the second pixel circuit column in the third display region 101c. A part of the second data line in the third display region 101c is disconnected from a part in the first display region 101a at the intersection of the two display regions, and the second data line in the third display region 101c is connected to the fourth data line in the first display region 101a through a data line connection portion such that an IC in the third display region 101c and the first display region 101a is processed by using a uniform algorithm.

In this embodiment of the present application, the second data line, the third data line, and the fourth data line are broken at the intersection of the third display region 101c and the first display region 101a, and the end point, proximal to the first display region 101a, of the second data line in the third display region 101c is connected to the end point, proximal to the third display region 101c, of the fourth data line in the first display region 101a through the data line connection portion to ensure that the data signal transmitted over the data line to the light-emitting unit in the third display region 101c matches the data signal transmitted over the data line to the light-emitting unit in the first display region 101a.

As shown in FIG. 30 to FIG. 32, the data line connection portion i is located at a different layer from the plurality of data lines g2. For example, the data line connection portion i is overlapped with the power signal line g6 in the direction perpendicular to the substrate. As the data line connection portion needs to pass through the first break of the third data line and two power signal lines to connect the end point of the second data line and the end point of the fourth data line, the data line connection portion needs to be arranged in a different layer from the data lines.

Optionally, as shown in FIG. 30 to FIG. 32, the data line connection portion i is located in the same layer as the reset power signal line g1 to facilitate the design.

As shown in FIG. 30 to FIG. 32, the data line connection portion i is disposed between the second electrode of the threshold compensation transistor T2 and the first electrode of the first reset control transistor T7 in two pixel circuits in the third pixel circuit column j23 and the fourth pixel circuit column j24 in the first pixel circuit row j1 in the third display region 101c adjacent to the first display region 101a.

In this embodiment of the present application, the intersection of the third display region 101c and the first display region 101a is an interval between the first electrode of the first reset control transistor and the second electrode of the data write transistor of the pixel circuit in the pixel circuit row j1 in the third display region 101c proximal to the first display region 101a.

For example, in the pixel circuit row j1 in the third display region 101c adjacent to the first display region 101a, the distance in the column direction Y between the second electrode of the threshold compensation transistor T2 and the first electrode of the first reset control transistor T7 is 7 μm to 12 μm to dispose the data line connection portion i between the second electrode of the threshold compensation transistor T2 and the first electrode of the first reset control transistor T7.

In the pixel circuit in the third display region 101c, a distance in the column direction Y between edges of the second connection portion h2 and the third connection portion h3 that are close to each other is 7 μm to 12 μm to dispose the data line connection portion i between the second connection portion h2 and the third connection portion h3. In this embodiment of the present application, although the first connection portion h1 and the data line connection portion are respectively disposed in the first display region and the intersection of the third display region and the first display region, by adjusting the distance between the second electrode of the threshold compensation transistor and the first electrode of the first reset control transistor in the pixel circuit, the first connection portion h1 and the data line connection portion can both be disposed in reserved larger space between the second electrode of the threshold compensation transistor and the first electrode of the first reset control transistor in the pixel circuit to prevent interference with other signals.

Figure 33:
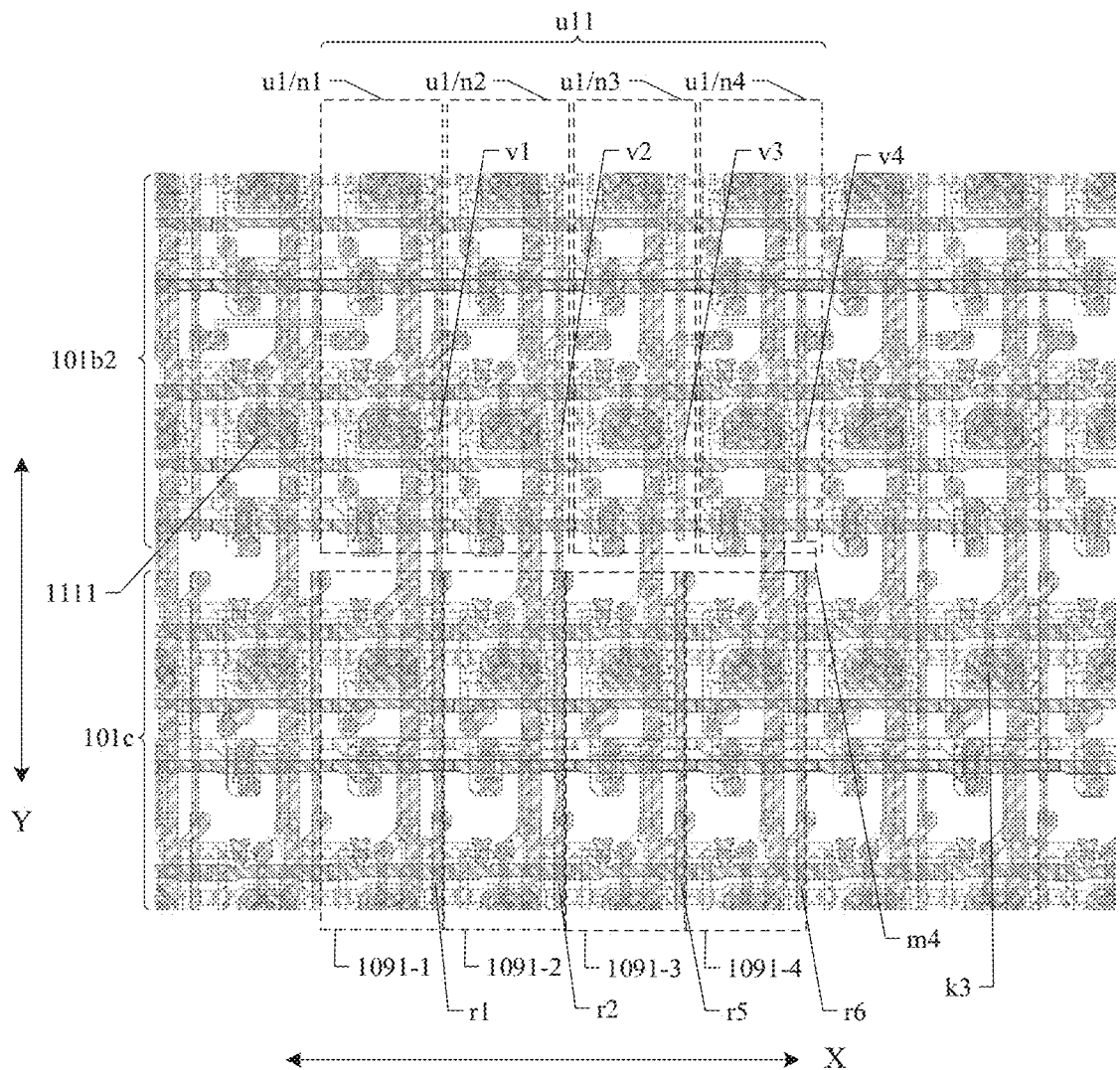
FIG. 33 is a schematic structural diagram of a pixel circuit at an intersection of a third display region and an edge region of a second display region according to some embodiments of the present application.

FIG. 33 is a schematic diagram of a partial pixel circuit structure at an intersection of a third display region and an edge region of a second display region according to some embodiments of the present application. Referring to FIG. 33, the plurality of dummy pixel circuit columns in the second display region 101b includes a dummy pixel circuit column group in four adjacent columns. Each dummy pixel circuit column group includes a first dummy pixel circuit column n1, a second dummy pixel circuit column n2, a third dummy pixel circuit column n3, and a fourth dummy pixel circuit column n4 sequentially arranged in the column direction Y. At least one dummy pixel circuit 1111 in the first dummy pixel circuit column n1, at least one dummy pixel circuit 1111 in the second dummy pixel circuit column n2, at least one dummy pixel circuit 1111 in the third dummy pixel circuit column n3, and at least one dummy pixel circuit 1111 in the fourth dummy pixel circuit column n4 are respectively connected to the first data line g21, the second data line g22, the third data line g23, and the fourth data line g24 sequentially arranged in the column direction Y. An interval (for example, an intersection of the edge region 101b2 of the second display region 101b and the third display region 101c) between the dummy pixel circuit 1111 and the first sub pixel circuit k3, the third data line g23 and the fourth data line g24 are broken to form a second break m4.

The first dummy pixel circuit column n1, second dummy pixel circuit column n2, third dummy pixel circuit column n3, and fourth dummy pixel circuit column n4 may also be referred to as a first pixel circuit column, a second pixel circuit column, a third pixel circuit column, and a fourth pixel circuit column, respectively.

As shown in FIG. 1 to FIG. 33, the pixel circuit pair f connected to the first-color light-emitting unit b1 and the third-color light-emitting unit b3 in the second light-emitting unit group 104 may be one of the first pixel circuit pair f1a and the second pixel circuit pair f2a, and the pixel circuit pair f connected to the second-color light-emitting unit pair b2 in the second light-emitting unit group 104 may be the other of the first pixel circuit pair f1a and the second pixel circuit pair f2a.

Optionally, the pixel circuit pair f connected to the first-color light-emitting unit b1 and the third-color light-emitting unit b3 in the second light-emitting unit group 104 may be connected to one of the second data line g22 and the third data line g23, and the pixel circuit pair f connected to the first light-emitting unit b21 and the second light-emitting unit b22 in the second light-emitting unit group 104 may be connected to the other of the second data line g22 and the third data line g23. For example, the pixel circuit pair f connected to the first-color light-emitting unit b1 and the third-color light-emitting unit b3 in the second light-emitting unit group 104 may be connected to the third data line g23, and the pixel circuit pair f connected to the first light-emitting unit b21 and the second light-emitting unit b22 in the second light-emitting unit group 104 may be connected to the second data line g22.

As the second data line and the third data line are broken at the intersection of the third display region 101c and the first display region 101a, the matched data signal over the data line in the third display region 101c connected to the first display region 101a cannot be input to the pixel circuit connected to the second light-emitting unit group 104. Therefore, in this embodiment of the present application, the pixel circuit pair f connected to the first light-emitting unit b21 and the second light-emitting unit b22 in the second light-emitting unit group 104 and the pixel circuit pair f connected to the first-color light-emitting unit b1 and the third-color light-emitting unit b3 in the second light-emitting unit group 104 are respectively connected to the first data line and the second data line that are continuous at the intersection of the edge region of the second display region and the third display region 101c to input a matched data signal to the pixel circuit connected to the second light-emitting unit group 104 and process the IC in the third display region 101c and the second display region 101b by using the uniform algorithm.

The plurality of light-emitting units in the second display region 101b connected to the third pixel circuit column j23 in the first display region 101a include first-color light-emitting units b1 and third-color light-emitting units b3 alternately arranged, and the light-emitting unit connected to the pixel circuit in the third pixel circuit column j23 in the first row, distal from the third display region 101c, in the first display region 101a is the third-color light-emitting unit b3. The plurality of light-emitting units 20 connected to the first pixel circuit column j21 in the third display region 101c include first-color light-emitting units b1 and third-color light-emitting units b3 alternately arranged, and the data line connected to the pixel circuit, distal to the third display region 101c, in the second display region 101b and connected to the first-color light-emitting unit b1 is the first data line.

The plurality of light-emitting units in the second display region 101b connected to the second pixel circuit column j22 in the first display region 101a include first light-emitting units b21 and second light-emitting units b22 alternately arranged, and the light-emitting units connected to the pixel circuits in the second pixel circuit column j22 in the first row, distal from the third display region 101c, in the first display region 101a are second light-emitting units b22. The plurality of light-emitting units connected to the second pixel circuit column j22 in the third display region 101c include first light-emitting units b21 and second light-emitting units b22 alternately arranged, and the data line connected to the pixel circuit in a row, proximal to the third display region 101c, in the second display region 101b and connected to the first light-emitting unit b21 is the second data line. Therefore, the data signals over the first data line and the second data line in the intersection of the third display region 101c and the edge region 101b2 of the second display region 101b respectively match the data signals over the third data line and the second data line in the first display region 101a. The data signals transmitted over the third data line and the fourth data line in the intersection of the third display region 101c and the edge region 101b2 of the second display region 101b do not match the data signals over the third data line and the second data line in the first display region 101a. At the intersection of the edge region 101b2 of the second display region 101b and the third display region 101c, the first data line and the second data line remain continuous, and the third data line and the fourth data line are broken.

As shown in FIG. 1 to FIG. 33, the display panel 10 further includes the peripheral region 101d on a side, distal from the third display region 101c, of the second display region 101b. The first data line g21 in the edge region 101b2 of the second display region 101b bypasses the central region 101b1 to be connected to one of the second data line g22 and the third data line g23 in the first display region 101a in the peripheral region 101d, and the second data line g22 in the edge region 101b2 of the second display region 101b bypasses the central region 101b1 to be connected to the other of the second data line g22 and the third data line g23 in the first display region 101a in the peripheral region 101d.

For example, this embodiment of the present application schematically shows that the first data line g21 in the edge region 101b2 of the second display region 101b bypasses the central region 101b1 to be connected to the third data line g23 in the first display region 101a in the peripheral region 101d, and the second data line g22 in the edge region 101b2 of the second display region 101b bypasses the central region 101b1 to be connected to the second data line g22 in the first display region 101a in the peripheral region 101d, to facilitate routing of the data lines in the second display region and the first display region.

As shown in FIG. 1 to FIG. 33, a display panel 10 provided in another embodiment of the present application includes the third display region 101c and the first display region 101a. The third display region 101c includes a plurality of third light-emitting units 1091 and a plurality of third sub pixel circuits k3. The plurality of third light-emitting units 1091 include a first light-emitting unit column 1091-1 and a second light-emitting unit column 1091-2 that are adjacent. Each light-emitting unit column is connected to a corresponding column of third sub pixel circuits k3. The first display region 101a includes a plurality of first light-emitting units 1021 and a plurality of first sub pixel circuits k1. The plurality of first light-emitting units 1021 include a third light-emitting unit column 1021-4 and a fourth light-emitting unit column 1021-5 that are adjacent. Each light-emitting unit column in the first display region 101a is connected to one column of first sub pixel circuit pairs q1. Each column of first sub pixel circuit pairs q1 includes two adjacent columns of first sub pixel circuits k1.

As shown in FIG. 1 to FIG. 33, the display panel 10 further includes a plurality of first data sublines r1, a plurality of second data sublines r2, a plurality of third data sublines r3, and a plurality of fourth data sublines r4 extending in the column direction Y. Each first data subline r1 is connected to each first light-emitting unit column 1091-1, each second data subline r2 is connected to each second light-emitting unit column 1091-2, each third data subline r3 is connected to each third light-emitting unit column 1021-4, and each fourth data subline r4 is connected to each fourth light-emitting unit column 1021-5.

As shown in FIG. 1 to FIG. 33, the arrangement direction of the first light-emitting unit column 1091-1 and the second light-emitting unit column 1091-2 is the same as the arrangement direction of the third light-emitting unit column 1021-4 and the fourth light-emitting unit column 1021-5. One column of third sub pixel circuits k3 connected to the first light-emitting unit column 1091-1 and one column of first sub pixel circuits k1 connected to the third light-emitting unit column 1021-4 are in the same column. The first data subline r1 and the third data subline r3 each are a continuous data line extending in the column direction Y. Two columns of first sub pixel circuits k1 connected to the fourth light-emitting unit column 1021-5 and one column of third sub pixel circuits k3 connected to the second light-emitting unit column 1091-2 are in different columns. The second data subline r2 and the fourth data subline r4 are connected through the data line connection portion i. The extension direction of the data line connection portion i intersects the column direction Y.

The first data subline r1, the second data subline r2, the third data subline r3, and the fourth data subline r4 have different meanings from the first data line g21, the second data line g22, the third data line g23, and the fourth data line g24 in the foregoing embodiments. The first data subline r1 is the data line connected to the pixel circuit in the third display region in the first data line g21 in the foregoing embodiments, and the second data subline r2 is the data line connected to the pixel circuit in the third display region in the second data line g22 in the foregoing embodiments, the third data subline r3 is the data line connected to the pixel circuit in the first display region in the first data line g21 in the foregoing embodiments, and the fourth data subline r4 is the data line connected to the pixel circuit in the first display region 101a in the fourth data line g24 in the foregoing embodiments.

At the intersection of the pixel circuit in the third display region 101c and the pixel circuit in the first display region 101a, the second data subline r2 and the fourth data subline r4 are broken, and the second data subline r2 and the fourth data subline r4 are connected through the data line connection portion i to ensure that the data signal transmitted over the data line to the light-emitting unit in the third display region 101c matches the data signal transmitted over the data line to the light-emitting unit in the first display region 101a.

As shown in FIG. 1 to FIG. 33, one column of third sub pixel circuits k3 connected to the second light-emitting unit column 1091-2 and another column of first sub pixel circuits k1 connected to the third light-emitting unit column 1021-4 are in the same column.

As shown in FIG. 1 to FIG. 33, the third display region 101c further includes a fifth light-emitting unit column 1091-3 and a sixth light-emitting unit column 1091-4 that are adjacent. The first light-emitting unit column 1091-1, the second light-emitting unit column 1091-2, the fifth light-emitting unit column 1091-3, and the sixth light-emitting unit column 1091-4 are repeatedly arranged in the row direction X. and the third light-emitting unit column 1021-4 and the fourth light-emitting unit column 1021-5 are alternately arranged in the row direction X.

As shown in FIG. 1 to FIG. 33, the display panel 10 further includes a plurality of fifth data sublines r5 and a plurality of sixth data sublines r6 extending in the column direction Y. Each fifth data subline r5 is connected to each fifth light-emitting unit column 1091-3, and each sixth data subline r6 is connected to each sixth light-emitting unit column 1091-4.

As shown in FIG. 1 to FIG. 33, one column of third sub pixel circuits k3 connected to the fifth light-emitting unit column 1091-3 and one column of first sub pixel circuits k1 connected to the fourth light-emitting unit column 1021-5 are in the same column, and one column of third sub pixel circuits k3 connected to the sixth light-emitting unit column 1091-4 and another column of first sub pixel circuits k1 connected to the fourth light-emitting unit column 1021-5 are in the same column. There is an interval between the sixth data subline r6 or the fifth data subline r5 and the fourth data subline r4. FIG. 29 schematically shows that the pixel circuit connected to the sixth data subline r6 and the pixel circuit connected to the fourth data subline r4 are in the same column, and there is an interval between the sixth data subline r6 and the fourth data subline r4, but is not limited thereto. When the pixel circuit connected to the fourth data subline r4 and the pixel circuit connected to the fifth data subline r5 are in the same column, there is an interval between the fourth data subline r4 and the fifth data subline r5. The fifth data subline r5 is the data line connected to the pixel circuit in the third display region 101c in the third data line g23 in the foregoing embodiments, and the sixth data subline r6 is the data line connected to the pixel circuit in the third display region 101c in the fourth data line g24 in the foregoing embodiments.

Figure 34:
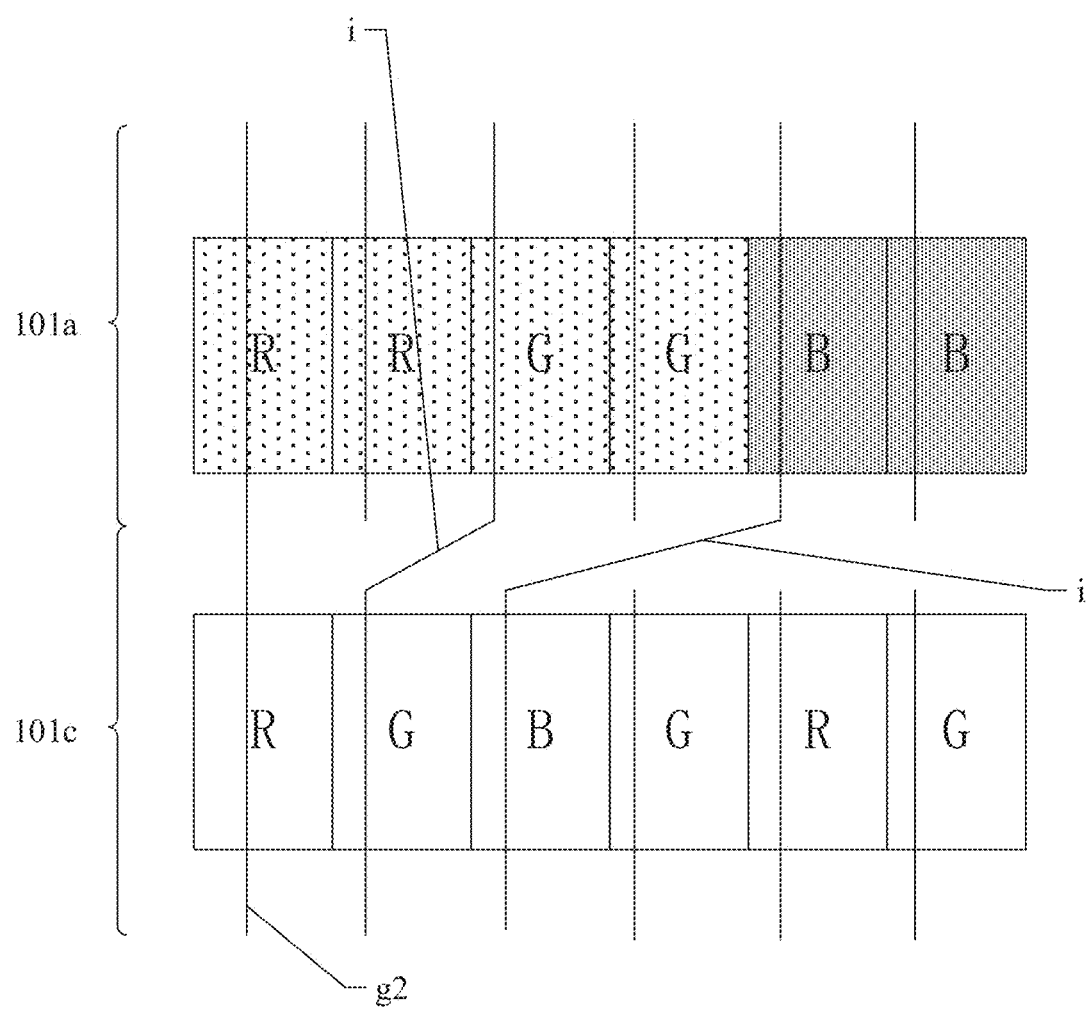
FIG. 34 is a partial plan view of a third display region and a first display region in a display panel according to some embodiments of the present application.

FIG. 34 is a partial plan view of a third display region and a first display region in a display panel according to another example of some embodiments of the present application. The example shown in FIG. 34 differs from the example shown in FIG. 29 in the arrangement of pixels: GGRB arrangement in the example shown in FIG. 29 and realRGB arrangement in the example shown in FIG. 34. As shown in FIG. 34, every six RGB light-emitting units in the third display region 101c are one repetition period. The data line g2 connected to the first column of R light-emitting units in the third display region 101c and the data line g2 connected to the first column of R light-emitting units in the first display region 101a are the same continuous data line. There is an interval between the data line g2 connected to the second column of G light-emitting units in the third display region 101c and the data line g2 connected to the second column of R light-emitting units in the first display region 101a. The data line g2 connected to the second column of G light-emitting units in the third display region 101c is connected to the data line g2 connected to the third column of G (or the fourth column of G) light-emitting units in the first display region 101a through the data line connection portion i. There is an interval between the data line g2 connected to the third column of B light-emitting units in the third display region 101c and the data line g2 connected to the third column of G light-emitting units in the first display region 101a. The data line g2 connected to the third column of B light-emitting units in the third display region 101c is connected to the data line g2 connected to the fifth column of B (or the sixth column of B) light-emitting units in the first display region 101a through the data line connection portion i. There is an interval between the data line g2 connected to the fourth column of G light-emitting units in the third display region 101c and the data line g2 connected to the fourth column of G light-emitting units in the first display region 101a. There is an interval between the data line g2 connected to the fifth column of R light-emitting units in the third display region 101c and the data line g2 connected to the fifth column of B light-emitting units in the first display region 101a. There is an interval between the data line g2 connected to the sixth column of G light-emitting units in the third display region 101c and the data line g2 connected to the sixth column of B light-emitting units in the first display region 101a. The embodiments of the present application are not limited to the foregoing connection, provided that one R light-emitting unit in the third display region 101c and one R light-emitting unit in the first display region 101a are connected to the same data line, one B light-emitting unit in the third display region 101c and one B light-emitting unit in the first display region 101a are connected to the same data line, and one G light-emitting unit in the third display region 101c and one G light-emitting unit in the first display region 101a are connected to the same data line.

As shown in FIG. 1 to FIG. 34, the third display region 101c includes a plurality of first sub light-emitting unit groups t1 and a plurality of second sub light-emitting unit groups t2 alternately arranged in the row direction X and the column direction Y. The first sub light-emitting unit group t1 includes light-emitting units in the first light-emitting unit column 1091-1 and the second light-emitting unit column 1091-2. The second sub light-emitting unit group t2 includes light-emitting units in the fifth light-emitting unit column 1091-3 and the sixth light-emitting unit column 1091-4. The first display region 101a includes a plurality of third sub light-emitting unit groups t3.

As shown in FIG. 1 to FIG. 34, each sub light-emitting unit group includes one first-color light-emitting unit R, one second-color light-emitting unit pair G1 and G2, and one third-color light-emitting unit B. The first-color light-emitting unit R and the third-color light-emitting unit B are arranged in the column direction Y. The second-color light-emitting unit pair G1 and G2 includes two second-color light-emitting units arranged in the column direction Y. The first-color light-emitting unit R and the second-color light-emitting unit pair G1 and G2 are arranged in the row direction X, and the arrangement direction of the first-color light-emitting unit R and the third-color light-emitting unit B in the first sub light-emitting unit group t1 is opposite to the arrangement direction of the first-color light-emitting unit R and the third-color light-emitting unit B in the second sub light-emitting unit group t2. The relative position distribution of light-emitting units in the first sub light-emitting unit group t1 is the same as that of the light-emitting units in the third sub light-emitting unit group t3. The embodiments of the present application schematically show an example in which the first-color light-emitting unit is a red light-emitting unit, the second-color light-emitting unit pair is a green light-emitting unit pair, and the third-color light-emitting unit is a blue light-emitting unit, but are not limited thereto. For example, the first-color light-emitting unit may be a blue light-emitting unit, the second-color light-emitting unit pair may be a green light-emitting unit pair, and the third-color light-emitting unit may be a red light-emitting unit. For example, the first-color light-emitting unit may be a green light-emitting unit, the second-color light-emitting unit pair may be a red light-emitting unit pair, and the third-color light-emitting unit may be a blue light-emitting unit.

As shown in FIG. 1 to FIG. 34, the first display region 101a further includes a plurality of second sub pixel circuit pairs q2, and the second display region 101b includes a plurality of second light-emitting units 1041. The plurality of second light-emitting units 1041 include a seventh light-emitting unit column 1041-1 and an eighth light-emitting unit column 1041-2 that are adjacent. The arrangement direction of the first light-emitting unit column 1091-1 and the second light-emitting unit column 1091-2 is the same as the arrangement direction of the seventh light-emitting unit column 1041-1 and the eighth light-emitting unit column 1041-2. Each light-emitting unit column in the second display region 101b is connected to one column of second sub pixel circuit pairs q2. Each column of second sub pixel circuit pairs q2 includes two adjacent columns of second sub pixel circuit pairs q2.

As shown in FIG. 1 to FIG. 34, the display panel 10 further includes a plurality of seventh data sublines r7 and a plurality of eighth data sublines r8 extending in the column direction Y. Each seventh data subline r7 is connected to each seventh light-emitting unit column 1041-1, and each eighth data subline r8 is connected to each eighth light-emitting unit column 1041-2.

As shown in FIG. 1 to FIG. 34, at least one of the seventh data subline r7 and the eighth data subline r8 is disposed between the third data subline r3 and the fourth data subline r4. The seventh data subline r7 is the data line connected to the pixel circuit in the first display region 101a in the second data line g22 in the foregoing embodiments, and the eighth data subline r8 is the data line connected to the pixel circuit in the first display region 101a in the third data line g23 in the foregoing embodiments.

As shown in FIG. 1 to FIG. 34, the seventh data subline r7 and the eighth data subline r8 are both disposed between the third data subline r3 and the fourth data subline r4, and there is an interval between the eighth data subline r8 and the fifth data subline r5 to dispose the data line connection portion i.

For example, the eighth data subline r8 and the fifth data subline r5 each have a break at an interval between the pixel circuit in the third display region 101c and the pixel circuit in the first display region 101a, and the data line connection portion i is disposed at the break.

As shown in FIG. 1 to FIG. 34, the plurality of second sub pixel circuit pairs q2 are configured to be connected to the plurality of fourth sub light-emitting unit groups t4. The relative positional distribution of the light-emitting units in each fourth sub light-emitting unit group t4 is the same as that of the light-emitting units in the third sub light-emitting unit group t3. The first sub pixel circuit pairs q1 connected to the third sub light-emitting unit groups t3 and the second sub pixel circuit pairs q2 connected to the fourth sub light-emitting unit group 14 are alternately arranged in the row direction X and the column direction Y.

As shown in FIG. 1 to FIG. 34, the second display region 101b includes the central region 101b1 and the edge region 101b2 surrounding the central region 101b1. The edge region 101b2 includes a plurality of dummy pixel circuits arranged in the row direction X and the column direction Y to form a plurality of dummy pixel circuit columns u1 and a plurality of dummy pixel circuit rows.

As shown in FIG. 1 to FIG. 34, the plurality of dummy pixel circuit columns u1 in the second display region 101b include a dummy pixel circuit column group u11 in four adjacent columns. Each dummy pixel circuit column group u11 includes a first dummy pixel circuit column n1, a second dummy pixel circuit column n2, a third dummy pixel circuit column n3, and a fourth dummy pixel circuit column n4 sequentially arranged in the row direction X.

As shown in FIG. 1 to FIG. 34, the display panel 10 further includes a first dummy data line v1, a second dummy data line v2, a third dummy data line v3, and a fourth dummy data line v4. The first dummy data line v1 is connected to the first dummy pixel circuit column n1, the second dummy data line v2 is connected to the second dummy pixel circuit column n2, the third dummy data line v3 is connected to the third dummy pixel circuit column n3, and the fourth dummy data line v4 is connected to the fourth dummy pixel circuit column n4.

As shown in FIG. 1 to FIG. 34, one column of third sub pixel circuits k3 connected to the first light-emitting unit column 1091-1 and the first dummy pixel circuit column n1 are in the same column. One column of third sub pixel circuits k3 connected to the second light-emitting unit column 1091-2 and the second dummy pixel circuit column n2 are in the same column. One column of third sub pixel circuits k3 connected to the fifth light-emitting unit column 1091-3 and the third dummy pixel circuit column n3 are in the same column. One column of third sub pixel circuits k3 connected to the sixth light-emitting unit column 1091-4 and the fourth dummy pixel circuit column n4 are in the same column. Two data lines connected to the first sub light-emitting unit group t1 and corresponding two dummy data lines are two continuous data lines, or two data lines connected to the second sub light-emitting unit group t2 and corresponding two dummy data lines are two continuous data lines.

As shown in FIG. 1 to FIG. 34, the display panel 10 further includes the peripheral region 101d on the side, distal from the third display region 101c, of the second display region 101b. Two dummy data lines connected to the first sub light-emitting unit group t1 or the second sub light-emitting unit group t2 bypass the central region 101b1 to be respectively connected to the seventh data subline r7 and the eighth data subline r8 in the peripheral region 101d.

Referring to FIG. 33, the first dummy data line v1 and the first data subline r1 are one continuous data line. The second dummy data line v2 and the second data subline r2 are one continuous data line. There is an interval between the third dummy data line v3 and the fifth data subline r5 and between the fourth dummy data line v4 and the sixth data subline r6.

As shown in FIG. 1 to FIG. 34, the first dummy data line v1 bypasses the central region 101b1 to be connected the seventh data subline r7 in the peripheral region 101d, and the second dummy data line v2 bypasses the central region 101b1 to be connected to the eighth data subline r8 in the peripheral region 101d.

Figure 35:
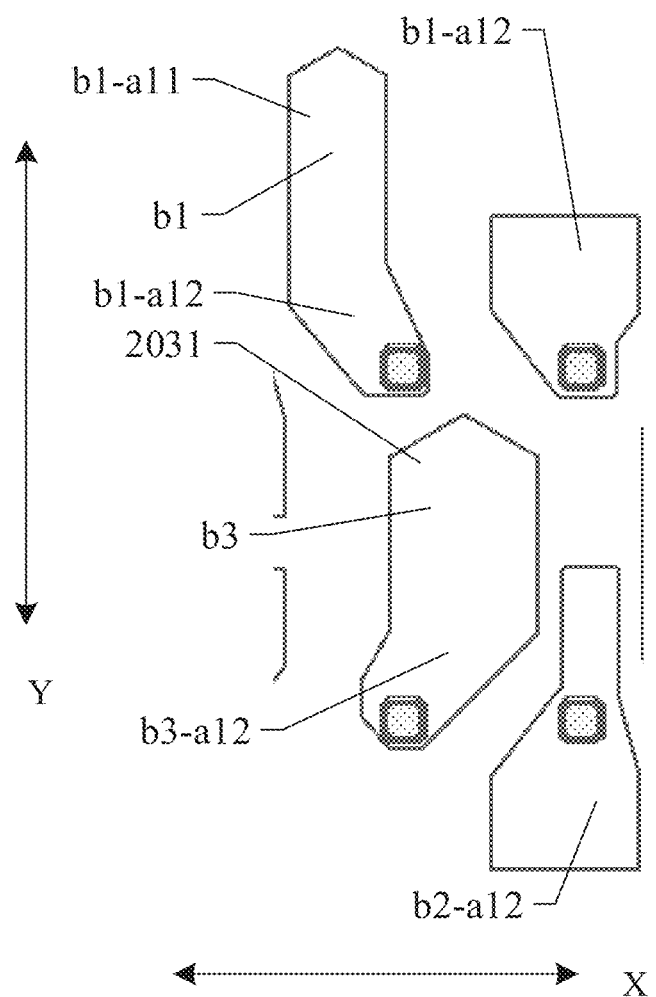
FIG. 35 is a schematic diagram of a first electrode in a light-emitting unit group in a third display region according to some embodiments of the present application.
Figure 36:
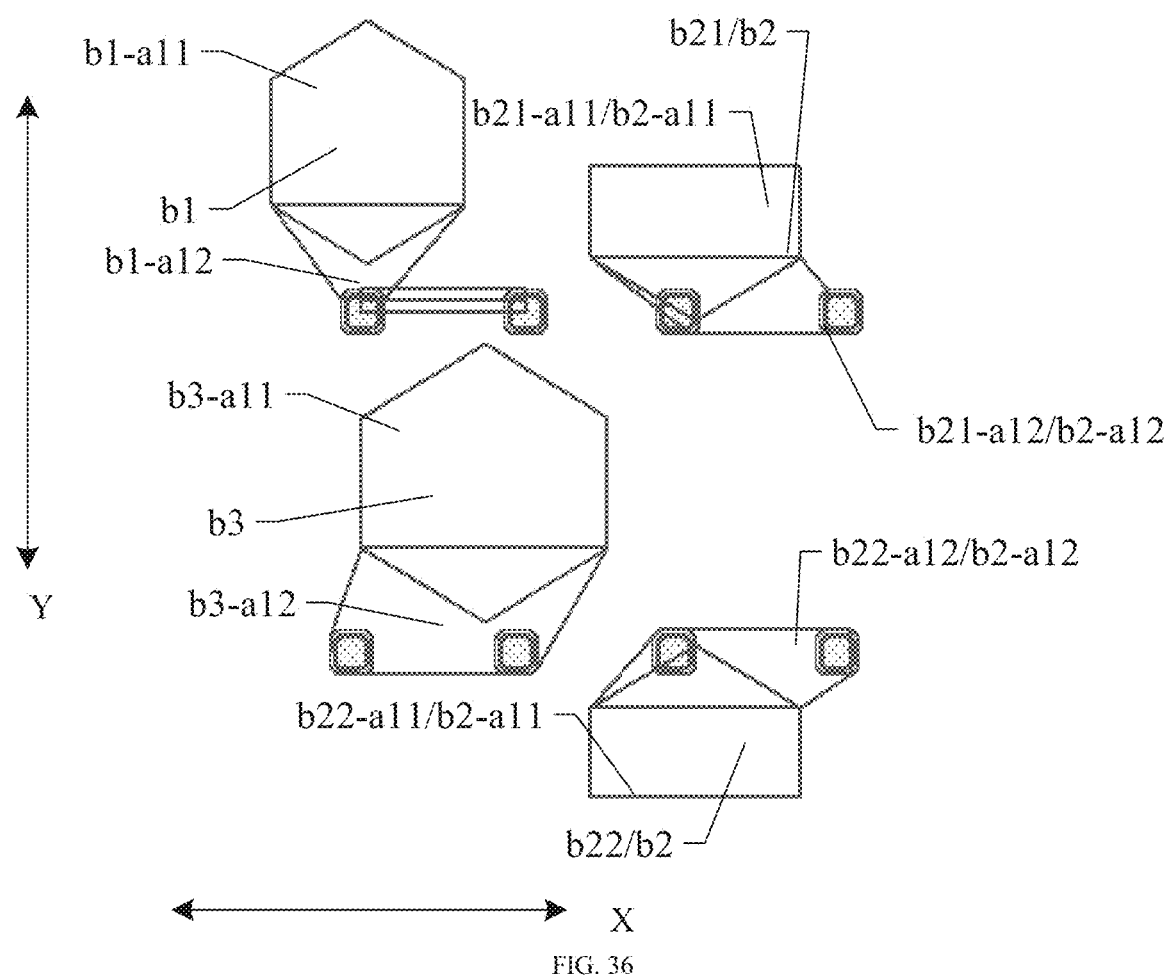
FIG. 36 is a schematic diagram of a first electrode in a light-emitting unit group in a non-edge region of a first display region according to some embodiments of the present application.
Figure 37:
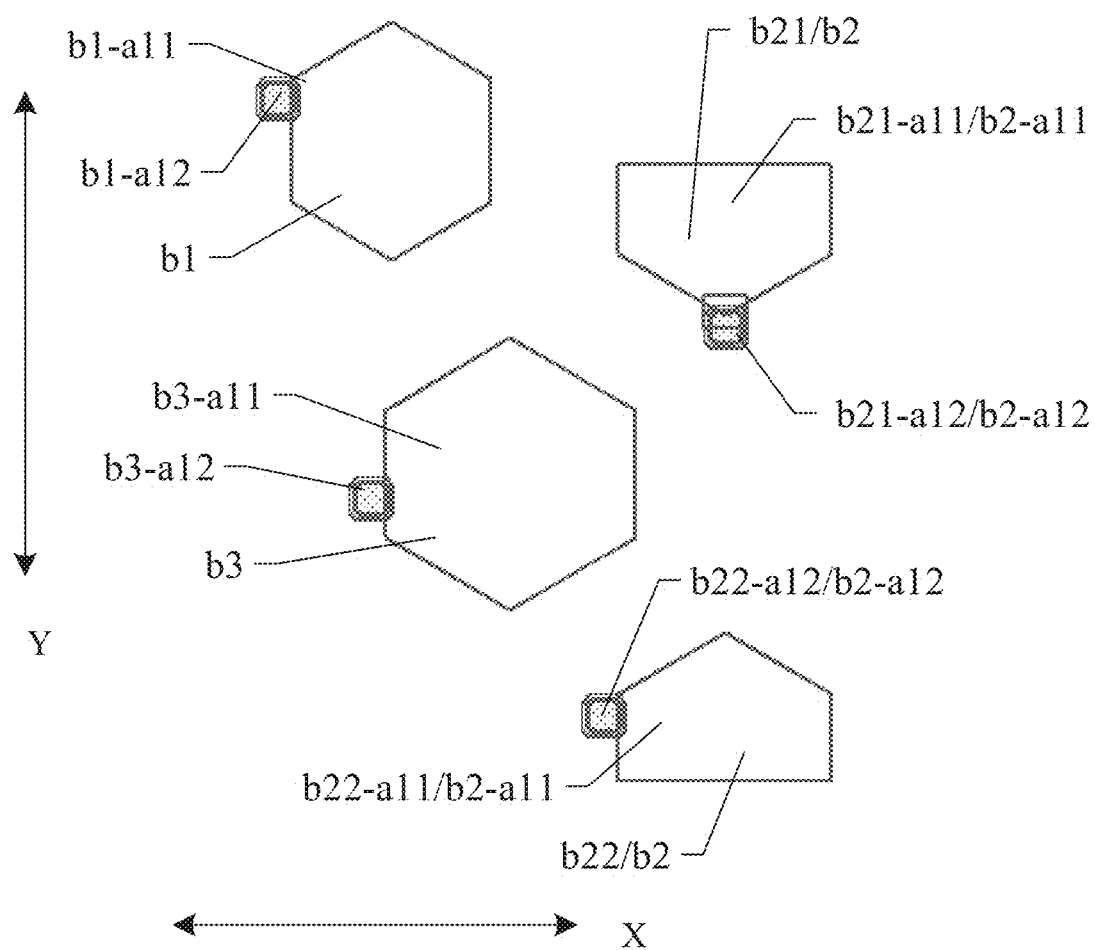
FIG. 37 is a schematic diagram of a first electrode in a light-emitting unit group in a second display region according to some embodiments of the present application.

FIG. 35 is a schematic diagram of a first electrode in a light-emitting unit group in a third display region according to some embodiments of the present application. FIG. 36 is a schematic diagram of a first electrode in a light-emitting unit group in a non-edge region of a first display region according to some embodiments of the present application. FIG. 37 is a schematic diagram of a first electrode in a light-emitting unit group in a second display region according to some embodiments of the present application. As shown in FIG. 1 to FIG. 37, the first electrode a1 in each light-emitting unit includes the body pattern a11 and the connection pattern a12. The shape of the body pattern a11 is approximately the same as that of the effective light-emitting region of each light-emitting unit. The connection pattern a12 is configured to be electrically connected to the second electrode in the first light-emitting control transistor T6 in the pixel circuit through the fifth connection portion h5. Each light-emitting unit group in the display region includes a plurality of light-emitting units of different colors. For example, each light-emitting unit group includes one first-color light-emitting unit b1, one second-color light-emitting unit pair b2, and one third-color light-emitting unit b3.

In the embodiments of the present application, the area of the body pattern in a light-emitting unit of a specific color in at least one of the non-edge region of the first display region 101a and the second display region 101b is larger than the area of the body pattern in a light-emitting unit of the same color as the light-emitting unit of the specific color in the third display region 101c. The area of the body pattern in the light-emitting unit of each color is related to the area of the effective light-emitting region thereof. In this embodiment of the present application, the area of the body pattern in a light-emitting unit of a specific color in at least one of the non-edge region of the first display region and the second display region is set to be larger than the area of the body pattern in a light-emitting unit of the same color as the light-emitting unit of the specific color in the third display region such that the area of the effective light-emitting region of the light-emitting unit of the specific color in at least one of the non-edge region of the first display region and the second display region can be larger than the area of the effective light-emitting region of the light-emitting unit of the same color as the light-emitting unit of the specific color in the third display region.

In this embodiment of the present application, as the density of the light-emitting unit groups in the first display region 101a and that in the second display region 101b are both less than the density of the light-emitting unit groups in the third display region, the area of the body pattern in a light-emitting unit in at least one of the first display region 101a and the second display region 101b is designed to be larger than the area of the body pattern in a light-emitting unit in the third display region such that the area of the effective light-emitting region of the light-emitting unit of the specific color in at least one of the non-edge region of the first display region and the second display region can be larger than the area of the effective light-emitting region of the light-emitting unit of the same color as the light-emitting unit of the specific color in the third display region. Therefore, the luminance of at least one of the first display region and the second display region can be increased while the lifetime of the light-emitting material of the light-emitting units is ensured, to achieve a more uniform visual display effect of the overall screen.

This embodiment of the present application schematically shows that in the non-edge region of the first display region 101a and the second display region 101b, the area of the body pattern in a light-emitting unit of a specific color is larger than the area of the body pattern in a light-emitting unit of the same color as the light-emitting unit of the specific color in the third display region 101c such that the area of the effective light-emitting region of the light-emitting unit of the specific color in the non-edge region and the second display region is designed to be larger than the area of the effective light-emitting region of the light-emitting unit of the same color as the light-emitting unit of the specific color in the third display region. Therefore, the luminance of the first display region and the second display region can be increased while the lifetime of the light-emitting material of the light-emitting units is ensured, to achieve a more uniform visual display effect of the overall screen.

For example, in an example of the embodiments of the present application, each light-emitting unit in the third display region 101c, the first display region 101a, and the second display region 101b is connected to one pixel circuit. In other words, each light-emitting unit in the first display region and the second display region may not be connected to a pixel circuit pair f but to only one pixel circuit. In this case, the density of the light-emitting unit groups in the first display region 101a and that in the second display region 101b are both less than the density of the light-emitting unit groups in the third display region. The area of the body pattern in a light-emitting unit in at least one of the first display region 101a and the second display region 101b is set to be larger than the area of the body pattern in a light-emitting unit in the third display region 101c such that the area of the effective light-emitting region of the light-emitting unit of the specific color in at least one of the non-edge region of the first display region 101a and the second display region 101b is designed to be larger than the area of the effective light-emitting region of the light-emitting unit of the same color as the light-emitting unit of the specific color in the third display region 101c, and the display effect of each display region can be as uniform as possible.

For example, in another example of the embodiments of the present application, each pixel circuit group includes a plurality of pixel circuits. At least one of the first pixel circuit group 103 and the second pixel circuit group 105 in the first display region includes a plurality of pixel circuit pairs f, and two pixel circuits included in each pixel circuit pair f are configured to be electrically connected to the first electrode a1 in the same light-emitting unit. For example, the first pixel circuit group 103 and the second pixel circuit group 105 in the first display region 101a each include a plurality of pixel circuit pairs f. Each pixel circuit pair f in the first pixel circuit group 103 is connected to each light-emitting unit in the first light-emitting unit group 102, and each pixel circuit pair f in the second pixel circuit group 105 is connected to each light-emitting unit in the second light-emitting unit group 104. The density of the light-emitting unit groups in the first display region 101a and that in the second display region 101b are both less than the density of the light-emitting unit groups in the third display region 101c. The combination of the solution of designing the pixel circuits connected to the light-emitting units in the first display region 101a and the second display region 101b as pixel circuit pairs f and the solution of setting the area of the body pattern in each of the light-emitting units in the first display region 101a and the second display region 101b to be larger than the area of the body pattern in each of the light-emitting units in the third display region 101c can increase the current and luminance of each of the light-emitting units in the first display region 101a and the second display region 101b to 1.8 to 2 times those in the case of using one pixel circuit to resolve the problem that the current and luminance in the first display region 101a and the second display region 101b and achieve a more uniform visual display effect of the overall screen while the lifetime of the light-emitting material of the light-emitting units is ensured.

As shown in FIG. 1 to FIG. 37, each light-emitting unit group includes a first-color light-emitting unit b1. The ratio of the area of the body pattern b1-a11 of each first-color light-emitting unit in at least one of the non-edge region of the first display region 101a and the second display region 101b to the area of the body pattern b1-a11 of each first-color light-emitting unit in the third display region 101c is 1.5 to 2.5. For example, each light-emitting unit group includes a first-color light-emitting unit b1. The ratio of the area of the body pattern b1-a11 of each first-color light-emitting unit in at least one of the non-edge region of the first display region 101a and the second display region 101b to the area of the body pattern b1-a11 of each first-color light-emitting unit in the third display region 101c is 1.9 to 2.1.

Optionally, the ratio of the area of the effective light-emitting region of each first-color light-emitting unit b1 in at least one of the non-edge region of the first display region 101$a$ and the second display region 101$b$ to the area of the effective light-emitting region of each first-color light-emitting unit b1 in the third display region 101$c$ is 2.

As shown in FIG. 1 to FIG. 37, the body pattern b1-$a$11 of the first electrode a1 and the effective light-emitting region of each first-color light-emitting unit b1 in each display region are both hexagonal. Certainly, referring to FIG. 9, the effective light-emitting region of the body pattern (for example, the first body pattern 1021-1 in FIG. 9) in each first-color light-emitting unit in each display region, and the second body pattern 1061-1 of the dummy electrode pattern 1062 may alternatively be both elliptical. In the embodiments of the present application, the shape of the body pattern of the first electrode a1 in each first-color light-emitting unit in each display region is not limited. In addition, the area of the connection pattern b1-$a$12 of each first-color light-emitting unit in the non-edge region of the first display region 101$a$ may be larger than the area of the connection pattern b1-$a$12 of each first-color light-emitting unit in the third display region 101$c$ to implement the connection to the pixel circuit pair f.

Optionally, the ratio of the area of the body pattern b2-$a$11 of each second-color light-emitting unit pair in at least one of the non-edge region of the first display region 101$a$ and the second display region 101$b$ to the area of the body pattern b2-$a$11 of each second-color light-emitting unit pair in the third display region 101$c$ is 1.5 to 2.5. For example, the ratio of the area of the body pattern b2-$a$11 of each second-color light-emitting unit pair in at least one of the non-edge region of the first display region 101$a$ and the second display region 101$b$ to the area of the body pattern b2-$a$11 of each second-color light-emitting unit pair in the third display region 101$c$ is 1.9 to 2.1.

Optionally, the ratio of the area of the effective light-emitting region of each second-color light-emitting unit pair b2 in the non-edge region of the first display region 101$a$ and the second display region 101$b$ to the area of the effective light-emitting region of each second-color light-emitting unit pair b2 in the third display region 101$c$ is 2.

Optionally, the ratio of the area of the body pattern b21-$a$11 of each first light-emitting unit in at least one of the non-edge region of the first display region 101$a$ and the second display region 101$b$ to the area of the body pattern b21-$a$11 of each first light-emitting unit in the third display region 101$c$ is 1.5 to 2.5. For example, the ratio of the area of the body pattern b22-$a$11 of each second light-emitting unit in at least one of the non-edge region of the first display region 101$a$ and the second display region 101$b$ to the area of the body pattern b22-$a$11 of each second light-emitting unit in the third display region 101$c$ is 1.5 to 2.5. For example, the ratio of the area of the body pattern b21-$a$11 of each first light-emitting unit in at least one of the non-edge region of the first display region 101$a$ and the second display region 101$b$ to the area of the body pattern b21-$a$11 of each first light-emitting unit in the third display region 101$c$ is 1.9 to 2.1. For example, the ratio of the area of the body pattern b22-$a$11 of each second light-emitting unit in at least one of the non-edge region of the first display region 101$a$ and the second display region 101$b$ to the area of the body pattern b22-$a$11 of each second light-emitting unit in the third display region 101$c$ is 1.9 to 2.1.

Optionally, the area of the connection pattern b21-$a$12 of each first light-emitting unit in the non-edge region of the first display region 101$a$ is larger than the area of the connection pattern b21-$a$12 of each first light-emitting unit in the third display region 101$c$. The area of the connection pattern b22-$a$12 of each second light-emitting unit in the non-edge region of the first display region 101$a$ is larger than the area of the connection pattern b22-$a$12 of each second light-emitting unit in the third display region 101$c$ to facilitate the connection to the pixel circuit pair f.

The ratio of the area of the body pattern b3-$a$11 of each third-color light-emitting unit in at least one of the non-edge region of the first display region 101$a$ and the second display region 101$b$ to the area of the body pattern b3-$a$11 of each third-color light-emitting unit in the third display region 101$c$ is 1.5 to 2.5. For example, the ratio of the area of the body pattern b3-$a$11 of each third-color light-emitting unit in at least one of the non-edge region of the first display region 101$a$ and the second display region 101$b$ to the area of the body pattern b3-$a$11 of each third-color light-emitting unit in the third display region 101$c$ is 1.9 to 2.1.

For example, the ratio of the area of the body pattern b3-$a$11 of each third-color light-emitting unit in the non-edge region of the first display region 101$a$ and the second display region 101$b$ to the area of the body pattern b3-$a$11 of each third-color light-emitting unit in the third display region 101$c$ is 2. For example, the ratio of the area of the effective light-emitting region of each third-color light-emitting unit b3 in the non-edge region of the first display region 101$a$ and the second display region 101$b$ to the area of the effective light-emitting region of each third-color light-emitting unit b3 in the third display region 101$c$ is 2.

For example, the area of the connection pattern b3-$a$12 of each third-color light-emitting unit in the non-edge region of the first display region 101$a$ is larger than the area of the connection pattern b3-$a$12 of each third-color light-emitting unit in the third display region 101$c$ to implement the connection to the pixel circuit pair f.

The body pattern and the effective light-emitting region of each third-color light-emitting unit in each display region are both hexagonal. Certainly, the body pattern and the effective light-emitting region of each third-color light-emitting unit in each display region may alternatively be both elliptical. In the embodiments of the present application, the shape of the body pattern of the first electrode a1 in each third-color light-emitting unit in each display region is not limited. In the embodiments of the present application, to simplify the description, the body pattern of the first electrode in the light-emitting unit is referred to as the body pattern of the light-emitting unit, and the connection pattern of the first electrode in the light-emitting unit is referred to as the connection pattern of the light-emitting unit.

As shown in FIG. 36 and FIG. 37, when the first electrode a1 of each light-emitting unit in the light-emitting unit group in the first display region 101$a$ is directly connected to the pixel circuit pair f, the connection pattern of the light-emitting unit in the first display region 101$a$ has a relatively large area. When the first electrode a1 of each light-emitting unit in the light-emitting unit group in the second display region is connected to the pixel circuit pair f in the first display region through the first connection trace or the second connection trace, the connection pattern of the light-emitting unit in the second display region may be set to have a relatively small area.

Figure 38:
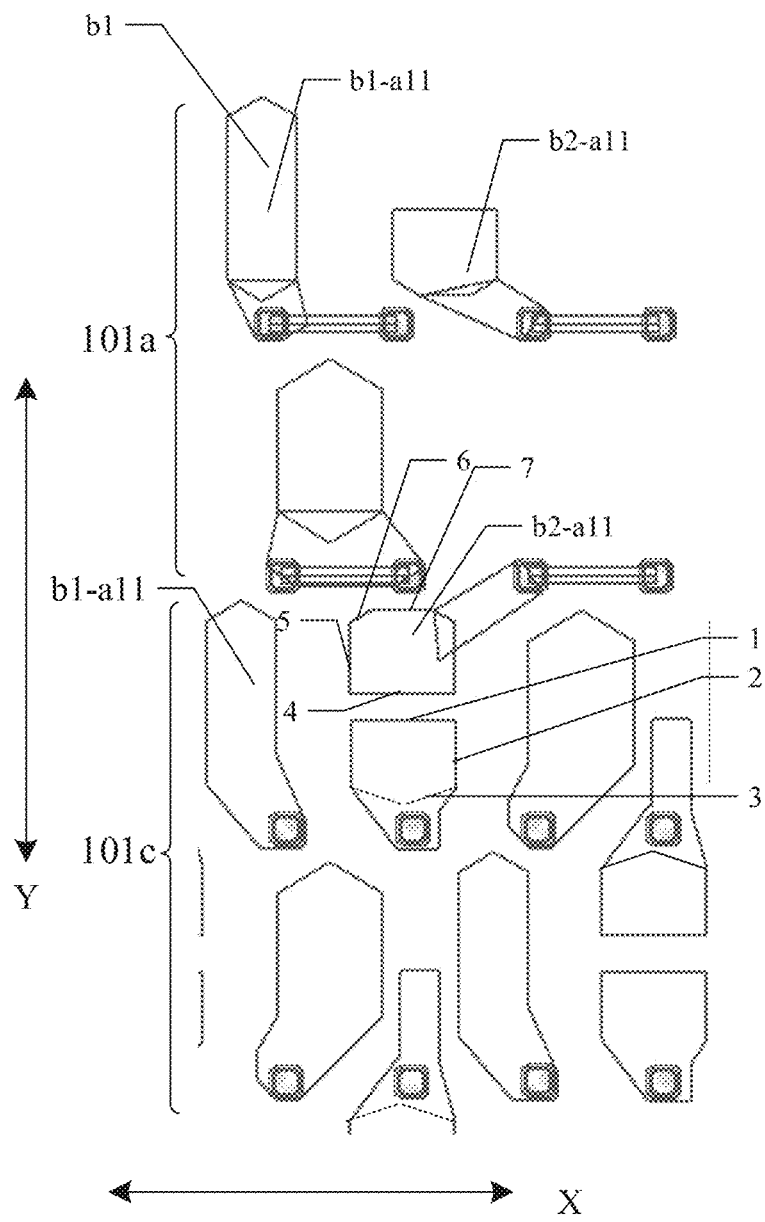
FIG. 38 is a schematic diagram of a first electrode in each light-emitting unit in two rows of light-emitting unit groups at an intersection of a first display region and a third display region according to some embodiments of the present application.

FIG. 38 is a schematic diagram of a first electrode in each light-emitting unit in two rows of light-emitting unit groups at an intersection of a first display region and a third display region according to some embodiments of the present application. As shown in FIG. 1 to FIG. 38, the shape and area of the body pattern b1-$a$11 of each first-color light-emitting unit in a row of light-emitting unit groups in the first display region 101$a$ adjacent to the third display region 101$c$ in the column direction Y are approximately the same as those of the body pattern b1-a11 of each first-color light-emitting unit in the third display region 101c. In this embodiment of the present application, the shapes and areas of the body patterns of first-color light-emitting units in two rows of light-emitting unit groups in the first display region adjacent to the third display region in the column direction Y are set to be approximately the same. In other words, the area of the body pattern of the first-color light-emitting unit in the edge region of the first display region is designed to be different from the area of the body pattern of the first-color light-emitting unit in the non-edge region of the first display region to prevent the body patterns of light-emitting units in two rows from spatially conflicting while the luminance of most first-color light-emitting units in the first display region is increased to achieve a uniform display effect of the overall screen.

Optionally, the ratio of the area of the body pattern b2-a11 of each second-color light-emitting unit pair in a row of light-emitting unit group in the first display region 101a adjacent to the third display region 101c in the row direction X to the area of the body pattern b2-a11 of each second-color light-emitting unit pair in the third display region 101c is 0.9 to 1.1. In this embodiment of the present application, the areas of the body patterns of second-color light-emitting units in two rows of light-emitting unit groups in the first display region adjacent to the third display region in the column direction Y are set to be approximately the same. In other words, the area of the body pattern of the second-color light-emitting unit in the edge region of the first display region is designed to be different from the area of the body pattern of the second-color light-emitting unit in the non-edge region of the first display region to prevent the body patterns of light-emitting units in two rows from spatially conflicting while the luminance of most second-color light-emitting units in the first display region is increased to achieve a uniform display effect of the overall screen.

As shown in FIG. 1 to FIG. 38, the shapes of the body patterns of two second-color light-emitting units included in the second-color light-emitting unit pair b2 in the third display region 101c are different from those of the two body patterns of each second-color light-emitting unit pair b2 in a row of light-emitting unit groups in the first display region 101a adjacent to the third display region 101c in the row direction X.

In this embodiment of the present application, the size of a gap of a pixel definition layer between two adjacent light-emitting units in the non-edge region of the first display region is approximately the same as the size of a gap of a pixel definition layer between two adjacent light-emitting units in the edge region of the first display region such that displayed image light in the first display region is uniform.

As shown in FIG. 1 to FIG. 38, body patterns of two second-color light-emitting units included in the second-color light-emitting unit pair b2 in the third display region 101c are both pentagonal. Alternatively, the body patterns of the two second-color light-emitting units included in the second-color light-emitting unit pair b2 in the third display region 101c are both elliptical. In the embodiments of the present application, the shape of the body pattern of the first electrode a1 in the second-color light-emitting unit is not limited.

When the body patterns of the two second-color light-emitting units included in the second-color light-emitting unit pair b2 in the third display region 101c are both pentagonal, referring to FIG. 38, each pentagon includes one first side 1 extending in the row direction X, two second sides 2 extending in the column direction Y, and two third sides 3 connected to the two second sides 2. The two third sides 3 intersect to form a sharp angle. Two sharp angles of the body patterns of the two second-color light-emitting units are close to each other. Each body pattern 2021 of each second-color light-emitting unit pair b2 in a row of light-emitting unit groups in the first display region adjacent to the third display region 101c in the column direction Y 101a includes one fourth side 4 extending in the row direction X, two fifth sides 5 extending in the column direction Y, two sixth sides 6 connecting the two fifth sides 5, and one seventh side 7 connecting the two sixth sides 6. Two seventh sides 7 of the body patterns of two second-color subpixels are close to each other.

As shown in FIG. 35 to FIG. 38, the length of the second side 2 of the body pattern of the second-color light-emitting unit in the third display region 101c is less than the length of the fifth side 5 of the body pattern of the second-color light-emitting unit in the first display region 101a to ensure that the area of the body pattern of the second-color light-emitting unit in the third display region 101c is approximately equal to the area of the body pattern of the second-color light-emitting unit in the first display region.

For example, as shown in FIG. 35 to FIG. 38, when the area of the body pattern of the second-color light-emitting unit in the edge region of the first display region 101a is set to the same as the area of the body pattern of the second-color light-emitting unit in the third display region 101c, to ensure that the gap of the pixel definition layer between the second-color light-emitting unit and the first-color light-emitting unit (or third-color light-emitting unit) in the edge region of the first display region 101a is the same as the gap of the pixel definition layer between the second-color light-emitting unit and the first-color light-emitting unit (or third-color light-emitting unit) in the non-edge region of the first display region 101a, a connection line between centers of two body patterns of each second-color light-emitting unit pair in a row of light-emitting unit groups in the first display region 101a adjacent to the third display area 101c in the row direction X is not parallel to a connection line between centers of two body patterns of each second-color light-emitting unit pair in the third display region.

When the area of the body pattern of the second-color light-emitting unit in the edge region of the first display region 101a is set to the same as the area of the body pattern of the second-color light-emitting unit in the third display region 101c, to ensure that the gap of the pixel definition layer between the second-color light-emitting unit and the first-color light-emitting unit (or third-color light-emitting unit) in the edge region of the first display region 101a is the same as the gap of the pixel definition layer between the second-color light-emitting unit and the first-color light-emitting unit (or third-color light-emitting unit) in the non-edge region of the first display region 101a, if the body pattern of the second-color light-emitting unit in the edge region of the first display region 101a is a pentagon including a sharp angle, there is a spatial conflict with the connection pattern of the first-color light-emitting unit (or third-color light-emitting unit). Therefore, the shape of the body pattern of the second-color light-emitting unit in the edge region of the first display region does not include a sharp angle. In this case, to ensure that the area of the body pattern of the second-color light-emitting unit in the edge region of the first display region is approximately the same as the area of the body pattern of the second-color light-emitting unit in the third display region, it is necessary to compensate for the shape of the body pattern of the second-color light-emitting unit in the edge region of the first display region, that is, to add two sixth sides 6 and one seventh side 7 connecting the two sixth sides 6 such that the area of the body pattern of the second-color light-emitting unit in the edge region of the first display region is equal to the area of the body pattern of the second-color light-emitting unit in the third display region without spatial conflicts.

As shown in FIG. 1 to FIG. 38, the shape and area of the body pattern b3-a11 of each third-color light-emitting unit in a row of light-emitting unit groups in the first display region 101a adjacent to the third display region 101c in the column direction Y are approximately the same as those of the body pattern b3-a11 of each third-color light-emitting unit in the third display region 101c. In this embodiment of the present application, the shapes and areas of the body patterns of third-color light-emitting units in two rows of light-emitting unit groups in the first display region adjacent to the third display region in the column direction Y are set to be approximately the same. In other words, the area of the body pattern of the third-color light-emitting unit in the edge region of the first display region is designed to be different from the area of the body pattern of the third-color light-emitting unit in the non-edge region of the first display region to prevent the body patterns of light-emitting units in two rows from spatially conflicting while the luminance of most third-color light-emitting units in the first display region is increased to achieve a uniform display effect of the overall screen.

Figure 39:
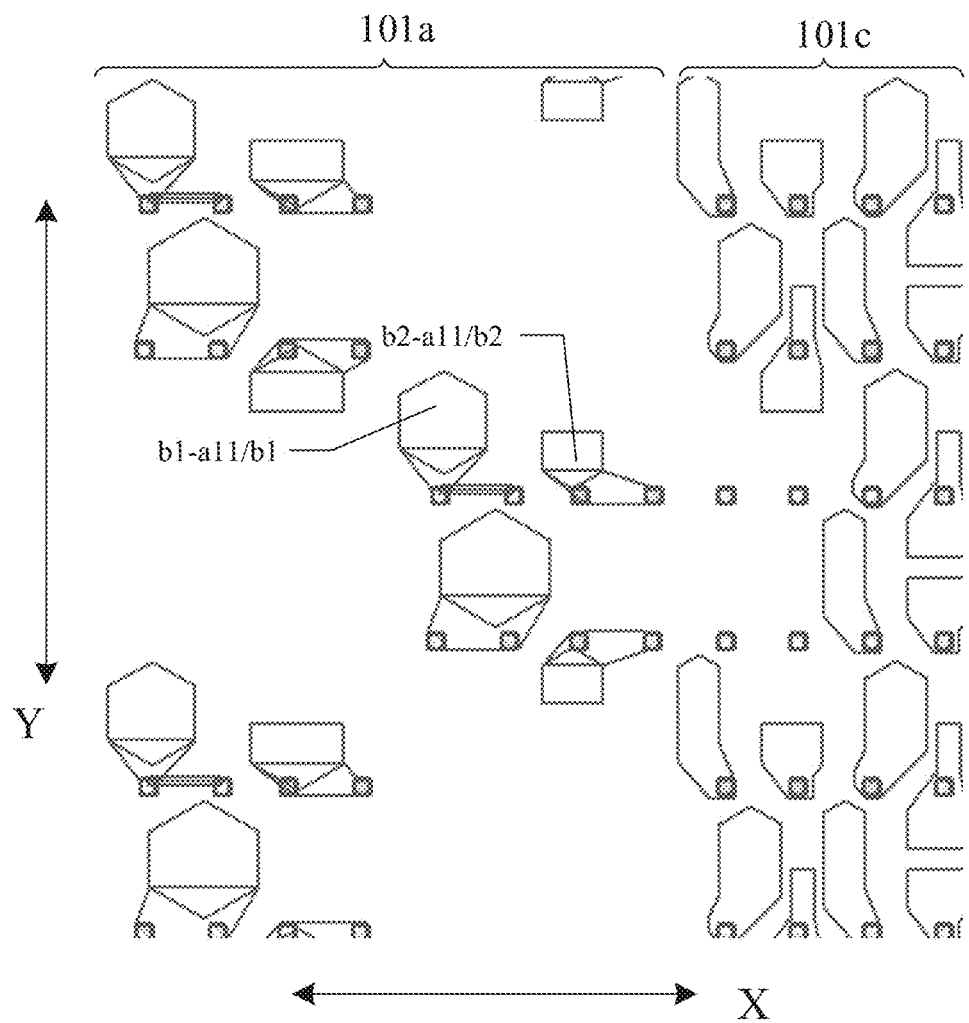
FIG. 39 is a schematic diagram of a first electrode in each light-emitting unit in two columns of light-emitting unit groups at an intersection of a first display region and a third display region according to some embodiments of the present application.

FIG. 39 is a schematic diagram of a first electrode in each light-emitting unit in two columns of light-emitting unit groups at an intersection of a first display region and a third display region according to some embodiments of the present application. As shown in FIG. 39, in a column of light-emitting unit groups in the first display region 101a adjacent to the third display region 101c in the row direction X, a second-color light-emitting unit pair b2 is located on a side, proximal to the third display region 101c, of a first-color light-emitting unit b1 and a third-color light-emitting unit b3. The area and shape of the body pattern b2-a11 of each second-color light-emitting unit pair in the column of light-emitting unit groups are approximately the same as the body pattern b2-a11 of each second-color light-emitting unit pair in the third display region 101c. In this embodiment of the present application, the shapes and areas of the body patterns of second-color light-emitting unit pairs in two columns of light-emitting unit groups in the first display region adjacent to the third display region in the row direction X are set to be approximately the same. In other words, the area of the body pattern of the second-color light-emitting unit pair in the edge region of the first display region is designed to be different from the area of the body pattern of the second-color light-emitting unit pair in the non-edge region of the first display region to prevent the body patterns of light-emitting units in two columns from spatially conflicting while the luminance of most second-color light-emitting unit pairs in the first display region is increased to achieve a uniform display effect of the overall screen.

A second pixel circuit group 105 is disposed between two adjacent first light-emitting unit groups 102 arranged in the column direction Y. Therefore, no light-emitting unit group is disposed at the interval between the two adjacent first light-emitting unit groups 102 arranged in the column direction Y. There is an interval between two adjacent third light-emitting unit groups in a column of third light-emitting unit groups, proximal to the first display area 101a, in the third display region 101c in the row direction X, and a third pixel circuit group not connected to a light-emitting unit group is disposed at the interval. In addition, in the row direction X, the third pixel circuit group and a column of first light-emitting unit groups 102 adjacent to the third display region 101c are in the same straight line. Therefore, the luminance distribution of the third display region and the first display region in the row direction X can be balanced.

Optionally, the ratio of the area of the body pattern b1-a11 of each first-color light-emitting unit in a column of light-emitting unit groups in the first display region 101a adjacent to the third display region 101c in the row direction X to the area of the body pattern b1-a11 of each first-color light-emitting unit in the third display region 101c is 1.5 to 2.5. For example, the ratio of the area of the effective light-emitting region of each first-color light-emitting unit b1 in a column of light-emitting unit groups in the first display region 101a adjacent to the third display region 101c in the row direction X to the area of the effective light-emitting region of each first-color light-emitting unit b1 in the third display region 101c is 2.

In this embodiment of the present application, when it is ensured that the body pattern of each light-emitting unit in a column of light-emitting unit groups in the first display region adjacent to the third display region in the row direction X has no spatial conflict, the shape and area of the body pattern of the first-color light-emitting unit in the edge region of the first display region is designed to be approximately the same as those of the body pattern of the first-color light-emitting unit in the non-edge region of the first display region to prevent the body patterns of light-emitting units in two columns from spatially conflicting while the luminance of most first-color light-emitting units in the first display region is increased to achieve a uniform display effect of the overall screen.

Optionally, the ratio of the area of the body pattern b3-a11 of each third-color light-emitting unit b3-a11 in a column of light-emitting unit groups in the first display region 101a adjacent to the third display area 101c in the row direction X to the area of the body pattern of each third-color light-emitting unit in the third display region 101c is 1.5 to 2.5. For example, the ratio of the area of the body pattern b3-a11 of each third-color light-emitting unit b3-a11 in a column of light-emitting unit groups in the first display region 101a adjacent to the third display area 101c in the row direction X to the area of the body pattern of each third-color light-emitting unit in the third display region 101c is 1.9 to 2.1.

Optionally, the ratio of the area of the effective light-emitting region of each third-color light-emitting unit b3 in a column of light-emitting unit groups in the first display region 101a adjacent to the third display region 101c in the row direction X to the area of the effective light-emitting region of each third-color light-emitting unit b3 in the third display region 101c is 2. In this embodiment of the present application, when it is ensured that the body pattern of each light-emitting unit in a column of light-emitting unit groups in the first display region adjacent to the third display region in the row direction X has no spatial conflict, the shape and area of the body pattern of the third-color light-emitting unit in the edge region of the first display region is designed to be approximately the same as those of the body pattern of the third-color light-emitting unit in the non-edge region of the first display region to prevent the body patterns of light-emitting units in two columns from spatially conflicting while the luminance of most third-color light-emitting units in the first display region is increased to achieve a uniform display effect of the overall screen.

Figure 40:
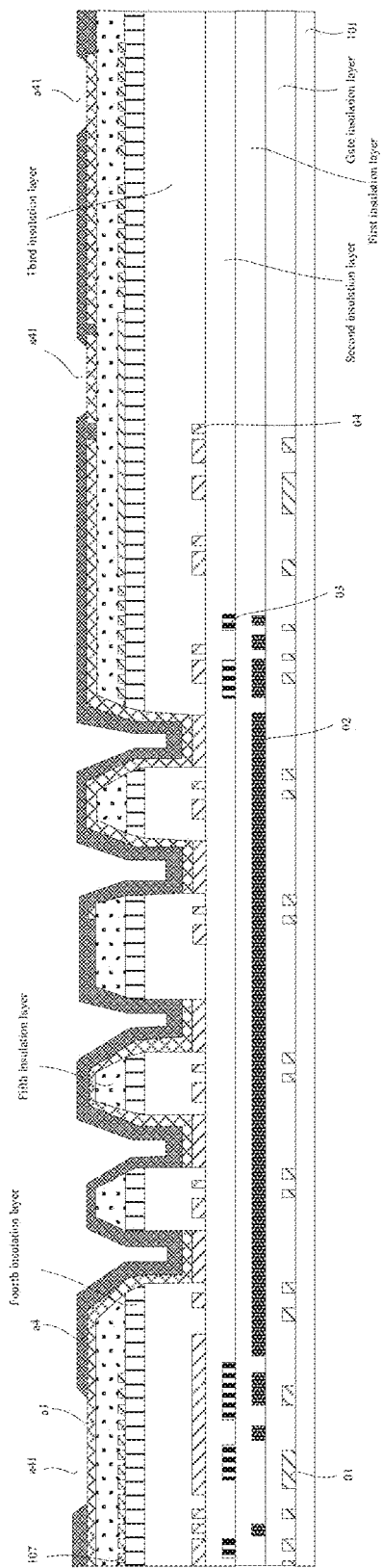
FIG. 40 is a sectional view in a direction A1-A2 in FIG. 3.
Figure 41:
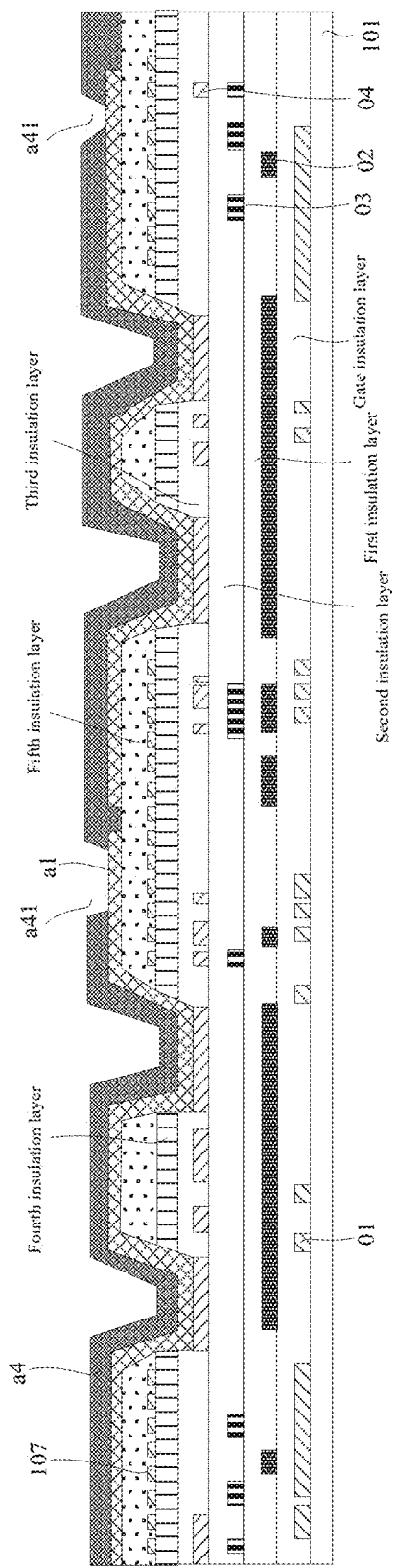
FIG. 41 is a sectional view in a direction B1-B2 in FIG. 7.

FIG. 40 is a sectional view in a direction A1-A2 in FIG. 3. FIG. 41 is a sectional view in a direction B1-B2 in FIG. 7. With reference to FIG. 40 and FIG. 41, the display panel 10 may include a fourth insulation layer and a fifth insulation layer. The fourth insulation layer is located on a side of a pixel circuit film layer. The plurality of first connection traces 107 are located on a side, distal from the pixel circuit film layer, of the fourth insulation layer. The fifth insulation layer is located on a side, distal from the fourth insulation layer, of the plurality of first connection traces 107. The first electrode a1 of each light-emitting unit is located on a side, distal from the plurality of first connection traces 107, of the fifth insulation layer. The pixel definition layer a4 is located on a side, distal from the fifth insulation layer, of the first electrode a1.

The pixel circuit film layer is a film layer composed of pixel circuits. For example, with reference to FIG. 40 and FIG. 41, the pixel circuit film layer includes the active semiconductor layer 01, gate insulation layer, first conductive layer 02, first insulation layer, second conductive layer 03, second insulation layer, source-drain metal layer 04, and third insulation layer that are sequentially laminated on a side distal from the substrate 101.

The third and fifth blocks in the first conductive layer 02 from left to right in FIG. 41 are second electrodes CC2 of capacitors C, and the fourth block is a light-emitting control signal line. The second and fifth block in the second conductive layer 03 from left to right are blocking blocks, and the third and fourth blocks are first electrodes CC1 of capacitors C. The first, fourth, seventh, tenth, thirteenth, sixteenth, nineteenth, twenty-first, and twenty-fourth blocks in the source-drain metal layer 04 from left to right are all signal lines for outputting voltage signals VDD. The fifth, eighth, eleventh, fourteenth, seventeenth, twentieth, twenty-second, and twenty-fifth blocks in the source-drain metal layer 04 from left to right are all data signals Data.

Figure 42:
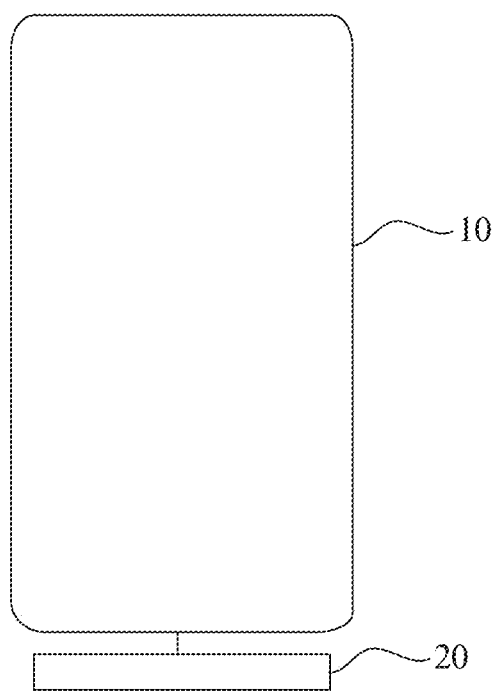
FIG. 42 is a schematic structural diagram of a display device according to some embodiments of the present application.

The second and sixth blocks in the first conductive layer 02 from left to right in FIG. 42 are light-emitting control signal lines, the third block is a reset control signal line, and the fifth block is a second electrode CC2 of a capacitor C. The second block in the second conductive layer 03 from left to right is a blocking block, the third block is a connection block, the fourth block is a reset signal Vinit, and the fifth block is a first electrode CC1 of a capacitor C. The third, sixth, eleventh, and fourteenth blocks in the source-drain metal layer 04 from left to right are data signals Data. The fourth, seventh, tenth, and thirteenth blocks in the source-drain metal layer 04 from left to right are signal lines for outputting voltage signals VDD.

In summary, the embodiments of the present application provide the display panel. The plurality of second pixel circuit groups in the first display region in the display panel includes the first-type second pixel circuit group distal from the second display region and the second-type second pixel circuit group proximal to the second display region. The first-type second pixel circuit group is connected to the first-type second light-emitting unit group, distal from the first display region, in the second display region through the first connection trace. The second-type second pixel circuit group is connected to the second-type second light-emitting unit group, proximal to the first display region, in the second display region through the second connection trace. In the solution provided in the embodiments of the present application, the drive signal can be provided for the second-type second light-emitting unit group through the second connection trace located in the different layer from the first connection trace. Therefore, the quantity of second light-emitting unit groups that are disposed in the second display region can be increased without increasing the quantity of first connection traces, to ensure the display effect of the second display region in the display panel.

FIG. 42 is a schematic structural diagram of a display device according to some embodiments of the present application. Referring to FIG. 42, the display device may include a power supply component 20 and the display panel 10 provided in the foregoing embodiments. The power supply component 20 is configured to supply power to the display panel 10. The display device may be a curved display apparatus.

Optionally, the display apparatus may be any product or component with a display function and a fingerprint recognition function, such as an OLED display panel, electronic paper, a mobile phone, a tablet computer, a TV, a display, a notebook computer, a digital photo frame, or a navigator.

The foregoing descriptions are merely optional embodiments of the present application and are not intended to limit the present application. Any modification, equivalent replacement, and improvement within the spirit and principle of the present application shall be included within the protection scope of the present application.

The invention claimed is:
1. A display panel, comprising:
a substrate with a first display region and a second display region which are adjoining;
first light-emitting unit groups in the first display region;
first pixel circuit groups in the first display region, wherein each of the first pixel circuit groups is connected to one of the first light-emitting unit groups;
second light-emitting unit groups in the second display region, wherein the second light-emitting unit groups comprise a first-type second light-emitting unit group and a second-type second light-emitting unit group, the second-type second light-emitting unit group being closer to the first display region than the first-type second light-emitting unit group;
second pixel circuit groups in the first display region, wherein the second pixel circuit groups comprise a first-type second pixel circuit group and a second-type second pixel circuit group, the second-type second pixel circuit group being closer to the second display region than the first-type second pixel circuit group;
dummy electrode pattern groups in the first display region, wherein the dummy electrode pattern groups comprise a first pattern group and a second pattern group, the second pattern group being closer to the second display region than the first pattern group;
first connection traces, wherein the first connection traces are in a different layer from the dummy electrode pattern groups, each of the first connection traces has one end connected to the first-type second light-emitting unit group, and another end connected to the first-type second pixel circuit group through the first pattern group; and
second connection traces, wherein the second connection traces are in a different layer from the first connection traces, each of the second connection traces has one end connected to the second-type second light-emitting unit group, and another end connected to the second-type second pixel circuit group through the second pattern group;

wherein the first connection traces are in the first display region and the second display region, and another ends of the first connection traces are flush.

2. The display panel according to claim 1, wherein an orthographic projection of each of the dummy electrode pattern groups onto the substrate at least partially overlaps an orthographic projection of at least one of the second pixel circuit groups onto the substrate, and does not overlap an orthographic projection of any one of the first light-emitting unit groups onto the substrate.

3. The display panel according to claim 1, wherein each of the first light-emitting unit groups and the second light-emitting unit groups comprises light-emitting units, and each of the light-emitting units comprises a first electrode, a light-emitting layer, and a second electrode that are sequentially laminated on the substrate; and
    each of the dummy electrode pattern groups comprises dummy electrode patterns, a quantity of the dummy electrode patterns in each of the dummy electrode pattern groups is the same as a quantity of the light-emitting units in each of the light-emitting unit groups, and the dummy electrode patterns are in a same layer as the first electrode.

4. The display panel according to claim 3, further comprising a pixel definition layer between the first electrode and the light-emitting layer; wherein
    the pixel definition layer comprises openings, the first electrode in one of the light-emitting units is exposed through one of the openings, and orthographic projections of the openings onto the substrate do not overlap an orthographic projection of any one of the dummy electrode patterns onto the substrate.

5. The display panel according to claim 4, wherein the dummy electrode patterns in each of the dummy electrode pattern groups correspond to the first light-emitting units in each of the first light-emitting unit groups in a one-to-one correspondence, and each of the dummy electrode patterns has a same shape and area as the first electrode in the first light-emitting unit corresponding to the dummy electrode pattern.

6. The display panel according to claim 5, wherein each of the first light-emitting unit groups comprises one first-color first light-emitting unit, two second-color first light-emitting units, and one third-color first light-emitting unit; and
    each of the second light-emitting unit groups comprises one first-color second light-emitting unit, two second-color second light-emitting units, and one third-color second light-emitting unit.

7. The display panel according to claim 6, wherein a distance between centers of the first-color first light-emitting units of two adjacent first light-emitting unit groups among the first light-emitting unit groups in a row direction in the first display region is equal to a distance between centers of the first-color second light-emitting units of two adjacent second light-emitting unit groups among the second light-emitting unit groups in the row direction in the second display region;
    a distance between centers of the second-color first light-emitting units of two adjacent first light-emitting unit groups among the first light-emitting unit groups in the row direction in the first display region is equal to a distance between centers of the second-color second light-emitting units of two adjacent second light-emitting unit groups among the second light-emitting unit groups in the row direction in the second display region; and
    a distance between centers of the third-color first light-emitting units of two adjacent first light-emitting unit groups among the first light-emitting unit groups in the row direction in the first display region is equal to a distance between centers of the third-color second light-emitting units of two adjacent second light-emitting unit groups among the second light-emitting unit groups in the row direction in the second display region.

8. The display panel according to claim 6, wherein an area of an orthographic projection of an opening among the openings exposing the first-color first light-emitting unit in the first display region onto the substrate is equal to an area of an orthographic projection of an opening among the openings exposing the first-color second light-emitting unit in the second display region onto the substrate, and an area of an orthographic projection of the first electrode in the first-color first light-emitting unit in the first display region onto the substrate is greater than an area of an orthographic projection of the first electrode in the first-color second light-emitting unit in the second display region onto the substrate;
    an area of an orthographic projection of an opening among the openings exposing the second-color first light-emitting unit in the first display region onto the substrate is equal to an area of an orthographic projection of an opening among the openings exposing the second-color second light-emitting unit in the second display region onto the substrate, and an area of an orthographic projection of the first electrode in the second-color first light-emitting unit in the first display region onto the substrate is greater than an area of an orthographic projection of the first electrode in the second-color second light-emitting unit in the second display region onto the substrate; and
    an area of an orthographic projection of an opening among the openings exposing the third-color first light-emitting unit in the first display region onto the substrate is equal to an area of an orthographic projection of an opening among the openings exposing the third-color second light-emitting unit in the second display region onto the substrate, and an area of an orthographic projection of the first electrode in the third-color first light-emitting unit in the first display region onto the substrate is greater than an area of an orthographic projection of the first electrode in the third-color second light-emitting unit in the second display region onto the substrate.

9. The display panel according to claim 3, wherein the first electrode in each of the first light-emitting units in each of the light-emitting unit groups comprises a first body pattern and a first connection pattern connected to the first body pattern, the first body pattern is at least partially in contact with the light-emitting layer in the first light-emitting unit, and the first connection pattern is connected to one of the first pixel circuit groups; and
    each of the dummy electrode patterns comprises a second body pattern, and a second connection pattern and a third connection pattern connected to the second body pattern, the second body pattern is not in contact with the light-emitting layer in any one of the first light-emitting units, the second connection pattern is connected to one of the second pixel circuit groups, and the third connection pattern is connected to one of the second light-emitting unit groups through one of the first connection traces or second connection traces.

10. The display panel according to claim 9, wherein the first electrode in the first light-emitting unit further comprises a fourth connection pattern connected to the first body pattern;
- an orthographic projection of the first body pattern of the first electrode in the first light-emitting unit onto the substrate has a same shape and area as an orthographic projection of the second body pattern of the dummy electrode pattern corresponding to the first light-emitting unit onto the substrate;
- an orthographic projection of the first connection pattern of the first electrode in the first light-emitting unit onto the substrate has a same shape and area as an orthographic projection of the second connection pattern of the dummy electrode pattern corresponding to the first light-emitting unit on the substrate; and
- an orthographic projection of the fourth connection pattern of the first electrode in the first light-emitting unit onto the substrate has a same shape and area as an orthographic projection of the third connection pattern of the dummy electrode pattern corresponding to the first light-emitting unit onto the substrate.

11. The display panel according to claim 10, wherein the orthographic projection of the first connection pattern onto the substrate does not overlap orthographic projections of the first connection traces onto the substrate, and the orthographic projection of the fourth connection pattern onto the substrate at least partially overlaps the orthographic projections of the first connection traces onto the substrate; and
- the orthographic projection of the second connection pattern onto the substrate does not overlap the orthographic projections of the first connection traces onto the substrate, and the orthographic projection of the third connection pattern onto the substrate at least partially overlaps the orthographic projections of the first connection traces onto the substrate.

12. The display panel according to claim 9, wherein the first light-emitting units corresponding to two target dummy electrode patterns in two adjacent first pattern groups in the row direction have a same color, and third connection patterns of the two target dummy electrode patterns each are connected to one of the second light-emitting unit groups through one of the first connection traces; and
- in the two target dummy electrode patterns, a connection line between a connection portion of the third connection pattern in one target dummy electrode pattern and a connection portion of the third connection pattern in the other target dummy electrode pattern intersects the row direction, and the connection portion of the third connection pattern is connected to one of the first connection traces.

13. The display panel according to claim 3, wherein each of the first pixel circuit groups comprises first pixel circuit units, each of the first pixel circuit units comprising a first pixel circuit and a second pixel circuit, and the first pixel circuit and the second pixel circuit in each of the first pixel circuit units are electrically connected to the first electrode of a same first light-emitting unit in one of the first light-emitting unit groups.

14. The display panel according to claim 13, wherein the first connection pattern of the first electrode in the first light-emitting unit comprises a first body connection portion extending in a target direction and two first end portions disposed at both ends of the first body connection portion; and the two first end portions are electrically connected to the first pixel circuit and the second pixel circuit, respectively, and the target direction is parallel to the row direction.

15. The display panel according to claim 3, wherein each of the second pixel circuit groups comprises second pixel circuit units, each of the second pixel circuit units comprising a third pixel circuit and a fourth pixel circuit, and the third pixel circuit and the fourth pixel circuit in each of the second pixel circuit units are electrically connected to a same dummy electrode pattern.

16. The display panel according to claim 15, wherein the second connection pattern of the dummy electrode pattern comprises a second body connection portion extending in the target direction and two second end portions disposed at both ends of the second body connection portion; and
- the two second end portions are electrically connected to the third pixel circuit and the fourth pixel circuit, respectively, and the target direction is approximately parallel to the row direction.

17. The display panel according to claim 1, wherein a connection line of the other ends of the first connection traces is parallel to an edge, distal from the second display region, of the first display region, and a distance between the connection line of the other ends of the first connection traces and the edge, distal from the second display region, of the first display region is less than a distance threshold.

18. The display panel according to claim 17, wherein the connection line of the other ends of the first connection traces and the edge, distal from the second display region, of the first display region both are approximately parallel to a column direction.

19. The display panel according to claim 18, wherein the connection line of the other ends of the first connection traces is collinear with the edge, distal form the second display region, of the first display region.

20. A display device, comprising a power supply component and a display panel; wherein the display panel comprises:
- a substrate with a first display region and a second display region which are adjoining;
- first light-emitting unit groups in the first display region;
- first pixel circuit groups in the first display region, wherein each of the first pixel circuit groups is connected to one of the first light-emitting unit groups;
- second light-emitting unit groups in the second display region, wherein the second light-emitting unit groups comprise a first-type second light-emitting unit group and a second-type second light-emitting unit group, the second-type second light-emitting unit group being closer to the first display region than the first-type second light-emitting unit group;
- second pixel circuit groups in the first display region, wherein the second pixel circuit groups comprise a first-type second pixel circuit group and a second-type second pixel circuit group, the second-type second pixel circuit group being closer to the second display region than the first-type second pixel circuit group;
- dummy electrode pattern groups in the first display region, wherein the dummy electrode pattern groups comprise a first pattern group and a second pattern group, the second pattern group being closer to the second display region than the first pattern group;
- first connection traces, wherein the first connection traces are in a different layer from the dummy electrode pattern groups, each of the first connection traces has one end connected to the first-type second light-emitting unit group, and another end connected to the first-type second pixel circuit group through the first pattern group; and second connection traces, wherein the second connection traces are in a different layer from the first connection traces, each of the second connection traces has one end connected to one of the second-type second light-emitting unit group, and another end connected to one of the second-type second pixel circuit group through the second pattern group;

wherein the first connection traces are in the first display region and the second display region, and another ends of the first connection traces are flush; and wherein the power supply component is configured to supply power to the display panel.

* * * * *